(12) United States Patent
Yamazaki et al.

(10) Patent No.: US 12,543,381 B2
(45) Date of Patent: Feb. 3, 2026

(54) METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Takashi Hirose, Kanagawa (JP); Atsushi Shibazaki, Kanagawa (JP); Yasuhiro Jinbo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 593 days.

(21) Appl. No.: 17/609,629

(22) PCT Filed: May 18, 2020

(86) PCT No.: PCT/IB2020/054666
§ 371 (c)(1),
(2) Date: Nov. 8, 2021

(87) PCT Pub. No.: WO2020/240332
PCT Pub. Date: Dec. 3, 2020

(65) Prior Publication Data
US 2022/0223721 A1    Jul. 14, 2022

(30) Foreign Application Priority Data
May 31, 2019  (JP) .................................. 2019-102344

(51) Int. Cl.
*H10D 99/00* (2025.01)
*C23C 14/08* (2006.01)
(Continued)

(52) U.S. Cl.
CPC .............. *H10D 99/00* (2025.01); *C23C 14/08* (2013.01); *C23C 14/34* (2013.01); *C23C 14/568* (2013.01);
(Continued)

(58) Field of Classification Search
CPC ......... H01L 29/66969; H01L 29/78648; H01L 29/7869; H01L 21/022; H01L 21/02266;
(Continued)

(56) References Cited

U.S. PATENT DOCUMENTS 9,773,919 B2 * 9/2017 Sasagawa .......... H10D 30/6734
9,911,756 B2    3/2018 Yamazaki et al.
(Continued)

FOREIGN PATENT DOCUMENTS

JP    2016-219761 A    12/2016
JP    2017-034051 A    2/2017
(Continued)

OTHER PUBLICATIONS

International Search Report (Application No. PCT/IB2020/054666), dated Sep. 1, 2020 (5 pages).
(Continued)

*Primary Examiner* — Dale E Page
*Assistant Examiner* — Quovaunda Jefferson
(74) *Attorney, Agent, or Firm* — NIXON PEABODY LLP; Jeffrey L. Costellia

(57) ABSTRACT

A method for manufacturing a semiconductor device with high productivity is provided. The method includes a step of forming a first insulator, a second insulator, and a third insulator in this order using a multi-chamber apparatus; a step of forming a fourth insulator, a fifth insulator, a first oxide film, a second oxide film, and a third oxide film in this order using a multi-chamber apparatus; a step of forming a conductive film; a step of processing the first oxide film, the
(Continued)

second oxide film, the third oxide film, and the conductive film, thereby forming a first oxide, a second oxide, an oxide layer, and a conductive layer each having an island shape; a step of forming a sixth insulator and an insulating film in this order using a multi-chamber apparatus; a step of planarizing the insulating film; a step of forming, in the insulating film and the sixth insulator, an opening where the second oxide is exposed; a step of forming a seventh insulator and a first conductor; and a step of forming an eighth insulator and a ninth insulator in this order using a multi-chamber apparatus.

12 Claims, 37 Drawing Sheets

(51) Int. Cl.
  C23C 14/34      (2006.01)
  C23C 14/56      (2006.01)
  H01L 21/02      (2006.01)
(52) U.S. Cl.
  CPC ...... H01L 21/022 (2013.01); H01L 21/02266 (2013.01); H01L 21/02631 (2013.01); *H01L 21/02164* (2013.01); *H01L 21/0217* (2013.01); *H01L 21/02178* (2013.01); *H01L 21/02565* (2013.01)
(58) Field of Classification Search
  CPC ......... H01L 21/02631; H01L 21/02164; H01L 21/0217; H01L 21/02178; H01L 21/02565; H01L 21/8221; H01L 21/02554; H01L 21/02595; H01L 27/0629; H01L 27/0688; H01L 27/1225; C23C 14/08; C23C 14/34; C23C 14/568; C23C 14/02554; C23C 14/02595; H10B 12/00; H10D 99/00; H10D 30/6734; H10D 30/6755; H10D 84/038; H10D 84/811; H10D 86/423; H10D 86/60; H10D 88/00; H10D 88/01
  See application file for complete search history.

(56) References Cited

U.S. PATENT DOCUMENTS

| | | | |
|---|---|---|---|
| 9,954,003 | B2 | 4/2018 | Matsuda et al. |
| 10,446,583 | B2 | 10/2019 | Yamazaki et al. |
| 2014/0014947 | A1* | 1/2014 | Yamazaki ........... H01L 29/7869 257/43 |
| 2017/0062482 | A1 | 3/2017 | Yamazaki et al. |
| 2017/0236842 | A1* | 8/2017 | Matsuda ............. H01L 27/1225 257/43 |
| 2018/0197889 | A1 | 7/2018 | Yamazaki et al. |
| 2020/0203533 | A1* | 6/2020 | Yamazaki .......... H10D 30/6729 |

FOREIGN PATENT DOCUMENTS

| | | |
|---|---|---|
| JP | 2017-085082 A | 5/2017 |
| JP | 2017-147445 A | 8/2017 |
| JP | 2020-004982 A | 1/2020 |
| KR | 2017-0096956 A | 8/2017 |

OTHER PUBLICATIONS

Written Opinion (Application No. PCT/IB2020/054666), dated Sep. 1, 2020 (6 pages).

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

\* cited by examiner

FIG. 3A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 3B
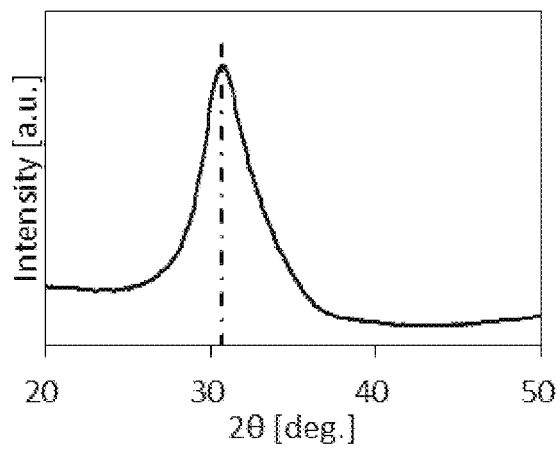
FIG. 3C
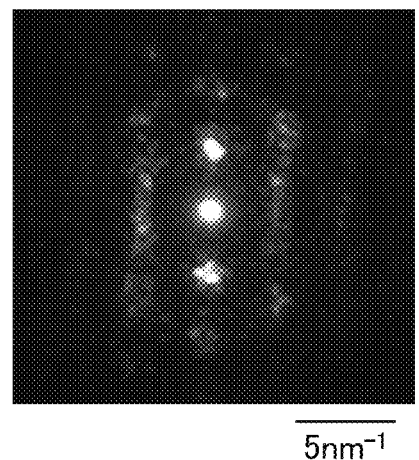

1471

1472

1473

1474

1475

1476

1477

1478

METHOD FOR MANUFACTURING SEMICONDUCTOR DEVICE

TECHNICAL FIELD

One embodiment of the present invention relates to a transistor, a semiconductor device, and an electronic device. One embodiment of the present invention relates to a method for manufacturing a semiconductor device. One embodiment of the present invention relates to a semiconductor wafer and a module. One embodiment of the present invention relates to an apparatus for manufacturing a semiconductor device.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be sometimes said that a display device (a liquid crystal display device, a light-emitting display device, and the like), a projection device, a lighting device, an electro-optical device, a power storage device, a storage device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate having an insulating surface has been attracting attention. The transistor is applied to a wide range of electronic devices, such as an integrated circuit (IC) and an image display device (also simply referred to as a display device). A silicon-based semiconductor material is widely known as a semiconductor thin film applicable to the transistor; in addition, an oxide semiconductor has been attracting attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

SUMMARY OF THE INVENTION

Problems to be Solved by the Invention

In recent years, increased multifunctionality, high integration, high-speed operation, and low power consumption of a semiconductor device typified by a semiconductor integrated circuit or the like have been highly required. To achieve these requirements, miniaturization or high integration of a transistor included in a semiconductor device is needed.

An example of a method for achieving high integration of semiconductor devices is stacking of semiconductor devices. To stack semiconductor devices, the productivity of the semiconductor devices needs to be increased. To increase the productivity of semiconductor devices, reduction in the number of manufacturing steps of the semiconductor devices, shortening of the time taken for each step, shortening of the flow line of a substrate in the manufacturing process of the semiconductor devices, and parallel processing of steps, for example, are important.

One object of one embodiment of the present invention is to provide a method for manufacturing a semiconductor device with high productivity. Another object of one embodiment of the present invention is to provide a semiconductor device with a small variation in transistor characteristics and a manufacturing method thereof. Another object of one embodiment of the present invention is to provide a highly reliable semiconductor device and a manufacturing method thereof. Another object of one embodiment of the present invention is to provide a semiconductor device with favorable electrical characteristics and a manufacturing method thereof. Another object of one embodiment of the present invention is to provide a semiconductor device with a high on-state current and a manufacturing method thereof. Another object of one embodiment of the present invention is to provide a semiconductor device that can be miniaturized or highly integrated, and a manufacturing method thereof. Another object of one embodiment of the present invention is to provide a semiconductor device with low power consumption and a manufacturing method thereof.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a method for manufacturing a semiconductor device, including a first step of forming a first insulator, a second insulator, and a third insulator in this order; a second step of forming a fourth insulator, a fifth insulator, a first oxide film, a second oxide film, and a third oxide film in this order; a third step of forming a conductive film; a fourth step of processing the first oxide film, the second oxide film, the third oxide film, and the conductive film, thereby forming a first oxide, a second oxide, an oxide layer, and a conductive layer each having an island shape; a fifth step of forming a sixth insulator and an insulating film in this order; a sixth step of planarizing the insulating film; a seventh step of forming, in the insulating film and the sixth insulator, an opening where the second oxide is exposed; an eighth step of forming a seventh insulator and a first conductor; and a ninth step of forming an eighth insulator and a ninth insulator in this order. The first step is performed using a first multi-chamber apparatus. The second step is performed using a second multi-chamber apparatus. The fifth step is performed using a third multi-chamber apparatus. The ninth step is performed using a fourth multi-chamber apparatus.

Another embodiment of the present invention is a method for manufacturing a semiconductor device, including a first step of forming a first insulator, a second insulator, and a third insulator in this order; a second step of forming a fourth insulator, a fifth insulator, a first oxide film, a second oxide film, and a third oxide film in this order; a third step of forming a conductive film; a fourth step of processing the first oxide film, the second oxide film, the third oxide film, and the conductive film, thereby forming a first oxide, a second oxide, an oxide layer, and a conductive layer each having an island shape; a fifth step of forming a sixth insulator and an insulating film in this order; a sixth step of planarizing the insulating film; a seventh step of forming, in the insulating film and the sixth insulator, an opening where the second oxide is exposed; an eighth step of forming a seventh insulator and a first conductor; a ninth step of forming an eighth insulator; a tenth step of processing the eighth insulator, the insulating film, the sixth insulator, the fifth insulator, the fourth insulator, the third insulator, and the second insulator; and an eleventh step of forming a ninth insulator and a tenth insulator in this order. The first step is performed using a first multi-chamber apparatus. The second step is performed using a second multi-chamber apparatus. The fifth step is performed using a third multi-chamber apparatus. The eleventh step is performed using a fourth multi-chamber apparatus.

In the above method for manufacturing a semiconductor device, it is preferred that the fourth insulator, the fifth insulator, the first oxide film, the second oxide film, and the third oxide film be formed by a sputtering method.

In the above method for manufacturing a semiconductor device, it is preferred that the first insulator, the second insulator, and the third insulator be formed by a sputtering method.

In the above method for manufacturing a semiconductor device, it is preferred that the sixth insulator and the insulating film be formed by a sputtering method.

In the above method for manufacturing a semiconductor device, it is preferred that the second oxide film be formed using an In-M-Zn oxide target (M is gallium, aluminum, yttrium, or tin).

In the above method for manufacturing a semiconductor device, it is preferred that the first multi-chamber apparatus, the third multi-chamber apparatus, and the fourth multi-chamber apparatus be the same apparatus.

Effect of the Invention

According to one embodiment of the present invention, a method for manufacturing a semiconductor device with high productivity can be provided. According to one embodiment of the present invention, a semiconductor device with a small variation in transistor characteristics and a manufacturing method thereof can be provided. According to one embodiment of the present invention, a highly reliable semiconductor device and a manufacturing method thereof can be provided. According to one embodiment of the present invention, a semiconductor device with favorable electrical characteristics and a manufacturing method thereof can be provided. According to one embodiment of the present invention, a semiconductor device with a high on-state current and a manufacturing method thereof can be provided. According to one embodiment of the present invention, a semiconductor device that can be miniaturized or highly integrated and a manufacturing method thereof can be provided. According to one embodiment of the present invention, a semiconductor device with low power consumption and a manufacturing method thereof can be provided.

Note that the description of these effects does not preclude the existence of other effects. One embodiment of the present invention does not have to have all these effects. Note that effects other than these will be apparent from and can be derived from the description of the specification, the drawings, the claims, and the like.

BRIEF DESCRIPTION OF THE DRAWINGS

FIG. 3A is a diagram showing the classification of crystal structures of IGZO. FIG. 3B is a diagram showing an XRD spectrum of a CAAC-IGZO film. FIG. 3C is a diagram showing a nanobeam electron diffraction pattern of a CAAC-IGZO film.

MODE FOR CARRYING OUT THE INVENTION

Figure 1A:
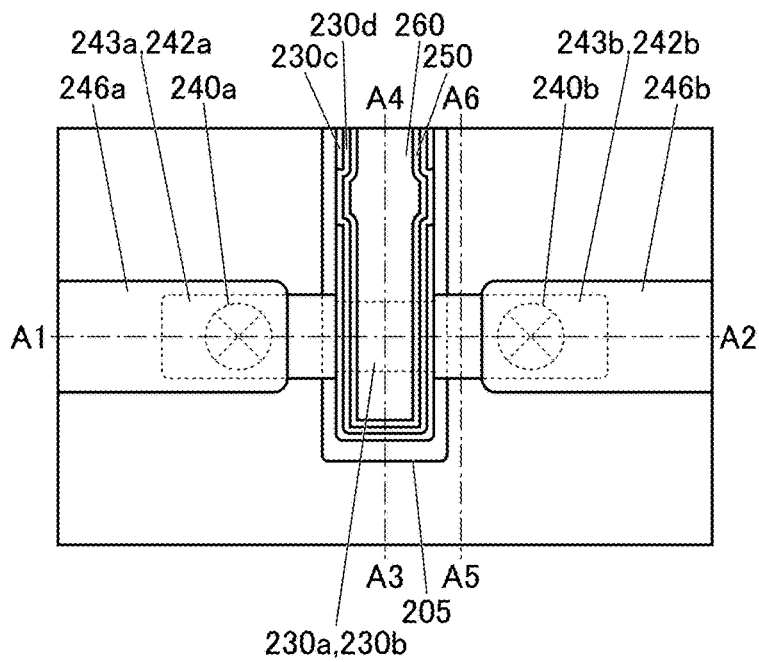
FIG. 1A is a top view of a semiconductor device.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. In addition, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "below", are used for convenience to describe the positional relation between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than one shown in drawings or text is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which a current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap each other, or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, a length of a channel formation region in a direction perpendicular to the channel length direction in a region where a semiconductor (or a portion where current flows in a semiconductor when a transistor is in an on state) and a gate electrode overlap each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % is regarded as an impurity. When an impurity is contained, for example, the density of defect states in a semiconductor increases and the crystallinity decreases in some cases. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, in the case of an oxide semiconductor, oxygen vacancies (referred to as $V_O$ in some cases) are formed by entry of impurities in some cases, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included.

Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, "normally off" means that a drain current per micrometer of channel width flowing through a transistor when no potential is applied to a gate or the gate is supplied with a ground potential is $1\times10^{-20}$ A or lower at room temperature, $1\times10^{-18}$ A or lower at 85° C., or $1\times10^{-16}$ A or lower at 125° C.

Embodiment 1

In this embodiment, an example of a semiconductor device including a transistor 200 of this embodiment and a manufacturing method thereof will be described with reference to FIG. 1 to FIG. 23.

Structure Example of Semiconductor Device

Figure 1B:
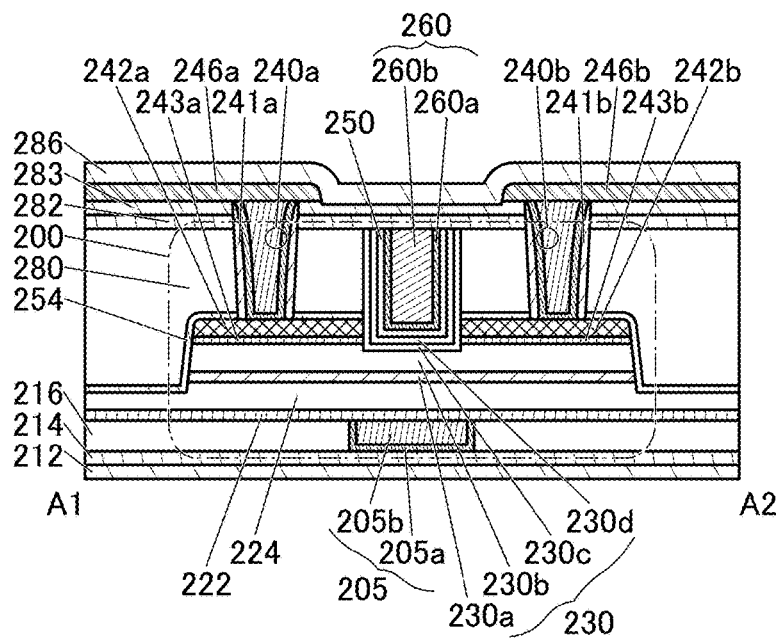
FIG. 1B to FIG. 1D are cross-sectional views of the semiconductor device.
Figure 1C:
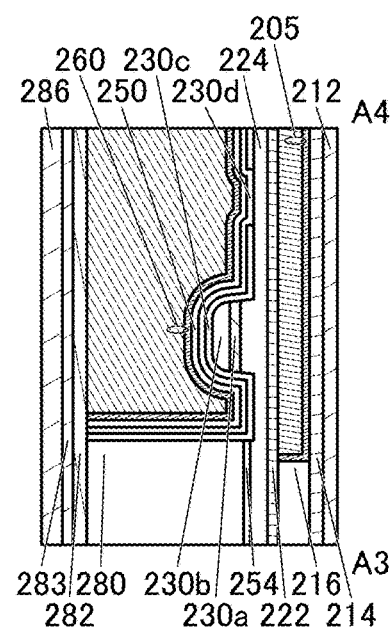
Figure 1D:
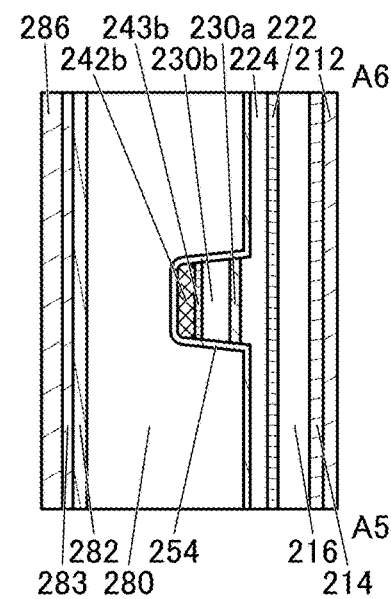

A structure of a semiconductor device including the transistor 200 is described using FIG. 1A to FIG. 1D. FIG. 1A to FIG. 1D are a top view and cross-sectional views of a semiconductor device including the transistor 200. FIG. 1A is a top view of the semiconductor device. FIG. 1B to FIG. 1D are cross-sectional views of the semiconductor device. Here, FIG. 1B is a cross-sectional view of a portion indicated by the dashed-dotted line A1-A2 in FIG. 1A, and is a cross-sectional view in the channel length direction of the transistor 200. FIG. 1C is a cross-sectional view of a portion indicated by the dashed-dotted line A3-A4 in FIG. 1A, and is a cross-sectional view in the channel width direction of the transistor 200. FIG. 1D is a cross-sectional view of a portion indicated by the dashed-dotted line A5-A6 in FIG. 1A. Note that for clarity of the drawing, some components are not illustrated in the top view of FIG. 1A.

The semiconductor device in this embodiment includes an insulator 212 over a substrate (not illustrated), an insulator 214 over the insulator 212, an insulator 216 over the insulator 214, the transistor 200 over the insulator 214 and the insulator 216, an insulator 254 over the transistor 200, an insulator 280 over the insulator 254, an insulator 282 over the insulator 280, and an insulator 283 over the insulator 282. The insulator 212, the insulator 214, the insulator 216, the insulator 254, the insulator 280, the insulator 282, and the insulator 283 function as interlayer films. The semiconductor device also includes a conductor 240a and a conductor 240b that are electrically connected to the transistor 200 and function as plugs. An insulator 241a is provided in contact with a side surface of the conductor 240a functioning as a plug, and an insulator 241b is provided in contact with a side surface of the conductor 240b functioning as a plug. A conductor 246a that is electrically connected to the conductor 240a and functions as a wiring and a conductor 246b that is electrically connected to the conductor 240b and functions as a wiring are provided over the insulator 283, the conductor 240a, and the conductor 240b. An insulator 286 is provided over the conductor 246a, the conductor 246b, and the insulator 283.

The insulator 241a is provided in contact with a side wall of an opening in the insulator 254, the insulator 280, the insulator 282, and the insulator 283; a first conductor of the conductor 240a is provided in contact with a side surface of the insulator 241a; and a second conductor of the conductor 240a is provided on the inner side thereof. The insulator 241b is provided in contact with a side wall of an opening in the insulator 254, the insulator 280, the insulator 282, and the insulator 283; a first conductor of the conductor 240b is provided in contact with a side surface of the insulator 241b; and a second conductor of the conductor 240b is provided on the inner side thereof. Here, the level of the top surface of the conductor 240a and the level of the top surface of the insulator 283 in a region overlapped by the conductor 246a can be substantially the same. Moreover, the level of the top surface of the conductor 240b and the level of the top surface of the insulator 283 in a region overlapped by the conductor 246b can be substantially the same. Note that in the semiconductor device illustrated in FIG. 1A to FIG. 1D, the conductor 240a and the conductor 240b each have a stacked-layer structure of the first conductor and the second conductor; however, this embodiment is not limited thereto. For example, each of the conductor 240a and the conductor 240b may be provided as a single layer or to have a stacked-layer structure of three or more layers. In the case where a component has a stacked-layer structure, layers may be distinguished by ordinal numbers corresponding to the formation order.

[Transistor 200]

As illustrated in FIG. 1A to FIG. 1D, the transistor 200 includes a conductor 205 (a conductor 205a and a conductor 205b) positioned to be embedded in the insulator 214 and/or the insulator 216; an insulator 222 over the insulator 216 and the conductor 205; an insulator 224 over the insulator 222; an oxide 230a over the insulator 224; an oxide 230b over the oxide 230a; an oxide 243a, an oxide 243b, and an oxide 230c over the oxide 230b; a conductor 242a over the oxide 243a; a conductor 242b over the oxide 243b; an oxide 230d over the oxide 230c; an insulator 250 over the oxide 230d; and a conductor 260 (a conductor 260a and a conductor 260b) positioned over the insulator 250 and overlapping part of the oxide 230c. The oxide 230c is in contact with a side surface of the oxide 243a, a side surface of the oxide 243b, a side surface of the conductor 242a, and a side surface of the conductor 242b. The insulator 282 is in contact with the top surfaces of the conductor 260, the insulator 250, the oxide 230d, the oxide 230c, and the insulator 280.

An opening reaching the oxide 230b is provided in the insulator 280 and the insulator 254. The oxide 230c, the oxide 230d, the insulator 250, and the conductor 260 are provided in the opening. In the channel length direction of the transistor 200, the conductor 260, the insulator 250, the oxide 230d, and the oxide 230c are provided between the conductor 242a and the oxide 243a and the conductor 242b and the oxide 243b. The insulator 250 includes a region in contact with a side surface of the conductor 260 and a region in contact with a bottom surface of the conductor 260. The oxide 230c includes a region in contact with the oxide 230b, a region overlapping the side surface of the conductor 260 with the oxide 230d and the insulator 250 therebetween, and a region overlapped by the bottom surface of the conductor 260 with the oxide 230d and the insulator 250 therebetween.

The oxide 230 preferably includes the oxide 230a positioned over the insulator 224, the oxide 230b positioned over the oxide 230a, the oxide 230c that is positioned over the oxide 230b and is at least partly in contact with the oxide 230b, and the oxide 230d positioned over the oxide 230c.

Although a structure in which the oxide 230 has a four-layer stacked structure of the oxide 230a, the oxide 230b, the oxide 230c, and the oxide 230d in the transistor 200 is described, this embodiment is not limited thereto. For example, the oxide 230 may be a single layer of the oxide 230b or have a two-layer structure of the oxide 230a and the oxide 230b; a two-layer structure of the oxide 230b and the oxide 230c; a three-layer structure of the oxide 230a, the oxide 230b, and the oxide 230c; a three-layer structure of the oxide 230a, the oxide 230b, and the oxide 230d; or a stacked-layer structure including five or more layers. Alternatively, each of the oxide 230a, the oxide 230b, the oxide 230c, and the oxide 230d may have a stacked-layer structure.

The conductor 260 functions as a first gate (also referred to as top gate) electrode, and the conductor 205 functions as a second gate (also referred to as back gate) electrode. The insulator 250, the insulator 224, and the insulator 222 function as gate insulators. The conductor 242a functions as one of a source electrode and a drain electrode, and the conductor 242b functions as the other of the source electrode and the drain electrode. The oxide 230 functions as a channel formation region.

In the transistor 200, as the oxide 230 (the oxide 230a, the oxide 230b, the oxide 230c, and the oxide 230d) including the channel formation region, a metal oxide functioning as a semiconductor (hereinafter also referred to as an oxide semiconductor) is preferably used.

The metal oxide functioning as a semiconductor has a band gap of preferably 2 eV or higher, further preferably 2.5 eV or higher. With the use of a metal oxide having such a wide band gap, the off-state current of the transistor can be reduced.

A transistor using an oxide semiconductor in a channel formation region has an extremely low leakage current (off-state current) in the off state; hence, a semiconductor device with low power consumption can be provided. An oxide semiconductor can be deposited by a sputtering method or the like, and thus can be used for a transistor included in a highly integrated semiconductor device.

For example, as the oxide 230, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, cobalt, and the like) is preferably used. An In—Ga oxide, an In—Zn oxide, or indium oxide may be used as the oxide 230.

A transistor using an oxide semiconductor is likely to change its electrical characteristics when impurities and oxygen vacancies ($V_O$) exist in a channel formation region of the oxide semiconductor, which might degrade the reliability. Examples of impurities contained in the oxide semiconductor include hydrogen, nitrogen, alkali metal, alkaline earth metal, iron, nickel, and silicon.

In particular, hydrogen contained in the oxide semiconductor may react with oxygen bonded to a metal atom to form $H_2O$ and oxygen vacancies. In some cases, hydrogen in the vicinity of an oxygen vacancy forms a defect that is an oxygen vacancy into which hydrogen enters (hereinafter sometimes referred to as $V_OH$), which generates an electron serving as a carrier. Furthermore, bonding of part of hydrogen to oxygen bonded to a metal atom causes generation of an electron serving as a carrier in some cases. Thus, a transistor using an oxide semiconductor containing hydrogen tends to have normally on characteristics (characteristics with which, even when no voltage is applied to the gate electrode, the channel exists and current flows through the transistor).

A defect in which hydrogen has entered an oxygen vacancy ($V_OH$) can function as a donor in the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases. In addition, "carrier concentration" in this specification and the like can be replaced with "carrier density".

In view of the above, hydrogen and oxygen vacancies are preferably reduced as much as possible in the channel formation region in the oxide semiconductor. Specifically, the hydrogen concentration of the channel formation region in the oxide 230, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. Moreover, the carrier concentration is preferably reduced in the channel formation region in the oxide semiconductor, and the channel formation region is preferably i-type (intrinsic) or substantially i-type.

In the process of manufacturing a semiconductor device, when a substrate where a film is formed is transferred from an apparatus that has formed the film to another apparatus, the substrate may be exposed to the atmospheric environment. At this time, impurities or moisture from the atmospheric environment might be attached onto the film. In such a case, there is a high probability that impurities or moisture attached onto the film enters an oxide semiconductor by a later step so that the hydrogen concentration in the oxide semiconductor increases. Moreover, a step for reducing or removing impurities or moisture attached onto the film, such as heat treatment, is additionally required before a different film is formed over the film, which might decrease the productivity of the semiconductor device.

In view of the above, in the case where films using different materials or having different chemical compositions are stacked in the process of manufacturing the semiconductor device in this embodiment, the films are preferably formed successively, and further preferably formed successively without being exposed to the atmospheric environment. In other words, at least some parts of a stacked-layer structure included in the semiconductor device are preferably formed successively in the same apparatus, and further preferably formed successively in the same apparatus without exposure to the air. It is particularly preferred that an oxide semiconductor and a stacked-layer structure in the vicinity of the oxide semiconductor included in a transistor be deposited successively without being exposed to the atmospheric environment. In this specification, the case where films are formed successively without being exposed to the atmospheric environment is simply referred to as "formed (deposited) successively" or "successive formation (deposition)" in some cases.

For example, in the case where a first film and a second film over the first film are formed successively, the first film and the second film are formed successively without being exposed to the atmospheric environment, whereby impurities or moisture from the atmospheric environment can be prevented from being attached onto the first film. Thus, entry of impurities or moisture into the oxide 230 serving as the channel formation region can be suppressed, and the transistor can have favorable electrical characteristics. Furthermore, a step for reducing or removing impurities or moisture attached to the film, such as heat treatment, can be omitted or the time taken for this step can be shortened; hence, the productivity of the semiconductor device can be increased. In addition, the successive formation allows the vicinity of the interface between the first film and the second film to be kept clean. Consequently, faulty characteristics of the transistor can be inhibited. Moreover, the successive formation can simplify the process of manufacturing the semiconductor device, and thus increase the productivity of the semiconductor device.

Note that successive formation can be applied not only to a stacked-layer structure of two layers but also to a stacked-layer structure of three or more layers. For successive formation, a multi-chamber apparatus is used, for example. A multi-chamber apparatus is preferable because different treatments can be performed in parallel in a plurality of treatment chambers included in the apparatus. An apparatus capable of successive formation will be described later.

Furthermore, in the semiconductor device including the transistor according to this embodiment, an oxide film to be the oxide 230 including the channel formation region is preferably formed by a sputtering method. A sputtering method is preferable because a film having a low hydrogen concentration can be formed. When the oxide film is formed by a sputtering method, a transistor whose channel formation region has a low hydrogen concentration can be manufactured. This makes the transistor be less likely to have normally on characteristics.

The hydrogen concentration in the components of the transistor other than the oxide 230 including the channel formation region is preferably as low as possible. For example, one or more of the components of the transistor other than the oxide 230 including the channel formation region are preferably formed by a sputtering method. In that case, hydrogen that would diffuse into the channel formation region from the component(s) can be reduced; hence, a transistor whose channel formation region has a low hydrogen concentration can be manufactured.

The hydrogen concentration in components provided around the transistor is preferably as low as possible. When the hydrogen concentration in the components provided around the transistor is low, entry of hydrogen into the transistor can be suppressed. Thus, a transistor with a low hydrogen concentration can be manufactured. For example, part of the components provided around the transistor is preferably formed by a sputtering method.

Specifically, in the semiconductor device illustrated in FIG. 1A to FIG. 1D, the insulator 212, the insulator 214, and the insulator 216 are preferably formed successively, and further preferably formed successively by a sputtering method. The successive formation can prevent impurities or moisture from the atmospheric environment from being attached onto the insulator 212 and the insulator 214 and keep cleanliness of the interface between the insulator 212 and the insulator 214 and its vicinity and the interface between the insulator 214 and the insulator 216 and its vicinity. The use of a sputtering method allows formation of films having a low hydrogen concentration.

The insulator 222, the insulator 224, an oxide film to be the oxide 230a, an oxide film to be the oxide 230b, and an oxide film to be the oxide 243a and the oxide 243b are preferably formed successively, and further preferably formed successively by a sputtering method. The successive formation can prevent impurities or moisture from the atmospheric environment from being attached onto the insulator 222, the insulator 224, the oxide film to be the oxide 230a, and the oxide film to be the oxide 230b and keep cleanliness of the interface between the insulator 222 and the insulator 224 and its vicinity, the interface between the insulator 224 and the oxide film to be the oxide 230a and its vicinity, the interface between the oxide film to be the oxide 230a and the oxide film to be the oxide 230b and its vicinity, and the interface between the oxide film to be the oxide 230b and the oxide film to be the oxide 243a and the oxide 243b and its vicinity. The use of a sputtering method allows formation of films having a low hydrogen concentration. In particular, since the insulator 224 is in contact with the oxide 230a and the oxide film to be the oxide 243a and the oxide 243b is in contact with the oxide 230b, the insulator 224 and the oxide film to be the oxide 243a and the oxide 243b preferably have a low hydrogen concentration.

Note that a conductive film to be the conductor 242a and the conductor 242b may be successively formed after the formation of the oxide film to be the oxide 243a and the oxide 243b. The successive formation can prevent impurities or moisture from the atmospheric environment from being attached onto the oxide film and allows the interface between the oxide film and the conductive film and its vicinity to be kept clean. The use of a sputtering method enables formation of a film having a low hydrogen concentration.

The insulator 254 and an insulating film to be the insulator 280 are preferably formed successively. The successive formation can prevent impurities or moisture from the atmospheric environment from being attached onto the insulator 254 and allows the interface between the insulator 254 and the insulating film to be the insulator 280 and its vicinity to be kept clean. The use of a sputtering method enables formation of a film having a low hydrogen concentration. In particular, the hydrogen concentration of the insulator 254 is preferably reduced in this manner because the insulator 254 is in contact with the oxide 230a and the oxide 230b.

The insulator 282 and the insulator 283 are preferably formed successively. The successive formation can prevent impurities or moisture from the atmospheric environment from being attached onto the insulator 282 and allows the interface between the insulator 282 and the insulator 283 and its vicinity to be kept clean. The use of a sputtering method enables formation of a film having a low hydrogen concentration.

A conductive film to be the conductor 205 (the conductor 205a and the conductor 205b), an insulating film to be the insulator 250, the conductive film to be the conductor 242a and the conductor 242b, a conductive film to be the conductor 260 (the conductor 260a and the conductor 260b), and the like may also be formed by a sputtering method.

With the above structure, a transistor having a low hydrogen concentration can be manufactured. For example, the transistor 200 includes a region where the hydrogen concentration measured by SIMS is lower than $1 \times 10^{20}$ atoms/cm$^3$, preferably lower than $1 \times 10^{19}$ atoms/cm$^3$. Specifically, the region is included in the insulator 224, the oxide 230a, the oxide 230b, the oxide 230c, and the like. That is, at least one of the insulator 224, the oxide 230a, the oxide 230b, and the oxide 230c includes the region where the hydrogen concentration measured by SIMS is lower than $1 \times 10^{20}$ atoms/cm$^3$, preferably lower than $1 \times 10^{19}$ atoms/cm$^3$. Note that in addition to the transistor 200, a component provided around the transistor 200 may include the region. An example of the component is the insulator 280.

In the above manner, a semiconductor device with high productivity can be provided. A semiconductor device with a small variation in transistor characteristics can be provided. A highly reliable semiconductor device can be provided. A semiconductor device having favorable electrical characteristics can be provided.

The oxide 230 preferably has a stacked-layer structure of a plurality of oxide layers with different chemical compositions. Moreover, the oxide 230 preferably has a stacked-layer structure of a plurality of oxide layers containing a common element (as a main component) besides oxygen.

Specifically, the atomic ratio of the element M to In in the metal oxide used as the oxide 230a or the oxide 230d is preferably greater than the atomic ratio of the element M to In in the metal oxide used as the oxide 230b or the oxide 230c. The greater the atomic ratio of the element M to In is, the more likely the diffusion of impurities or oxygen is to be inhibited. Thus, including the oxide 230a below the oxide 230b makes it possible to inhibit diffusion of impurities into the oxide 230b from the components formed below the oxide 230a. Moreover, including the oxide 230d over the oxide 230c makes it possible to inhibit diffusion of impurities into the oxide 230c from the components formed above the oxide 230d.

In other words, the atomic ratio of In to the element M in the metal oxide used as the oxide 230b or the oxide 230c is preferably greater than the atomic ratio of In to the element M in the metal oxide used as the oxide 230a or the oxide 230d. In that case, a main carrier path is the oxide 230b, the oxide 230c, or the vicinity thereof, for example, the interface between the oxide 230b and the oxide 230c. The density of defect states at the interface between the oxide 230b and the oxide 230c can be made low when the oxide 230b and the oxide 230c contain a common element (as a main component) besides oxygen, whereby the influence of interface scattering on carrier conduction is small and a high on-state current can be obtained.

In order to make the oxide 230c serve as a main carrier path, the atomic ratio of indium to a metal element that is a main component in the oxide 230c is preferably greater than that in the oxide 230b. When a metal oxide having a high content of indium is used for a channel formation region, the on-state current of the transistor can be increased.

In order to make the oxide 230c serve as a main carrier path, the conduction band minimum of the oxide 230c is preferably more apart from the vacuum level than the conduction band minimum of each of the oxide 230a, the oxide 230b, and the oxide 230d is. In other words, the electron affinity of the oxide 230c is preferably larger than the electron affinity of each of the oxide 230a, the oxide 230b, and the oxide 230d.

The oxide 230b and the oxide 230c preferably have crystallinity. It is particularly preferable to use a CAAC-OS (c-axis aligned crystalline oxide semiconductor) described later as the oxide 230b and the oxide 230c. The oxide 230d may also have crystallinity.

The use of the CAAC-OS as the oxide 230b and the oxide 230c can reduce impurities and oxygen vacancies in the region where the channel is formed in the oxide semiconductor. Accordingly, a transistor that has stable electrical characteristics with a small variation in electrical characteristics and improved reliability can be provided.

Furthermore, extraction of oxygen from the oxide 230b by the source electrode or the drain electrode can be inhibited. This can reduce oxygen extraction from the oxide 230b even when heat treatment is performed; thus, the transistor 200 is stable with respect to high temperatures in a manufacturing process (what is called thermal budget).

The CAAC-OS has a property of making oxygen move easily in the direction perpendicular to the c-axis in the CAAC structure. Thus, oxygen contained in the oxide 230c can be efficiently supplied to the oxide 230b.

The CAAC-OS is a metal oxide having a dense structure with high crystallinity and a small amount of impurities or defects (e.g., oxygen vacancies). In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. As the density of the CAAC-OS is increased in such a manner, diffusion of impurities or oxygen in the CAAC-OS can be further reduced.

Figure 2:
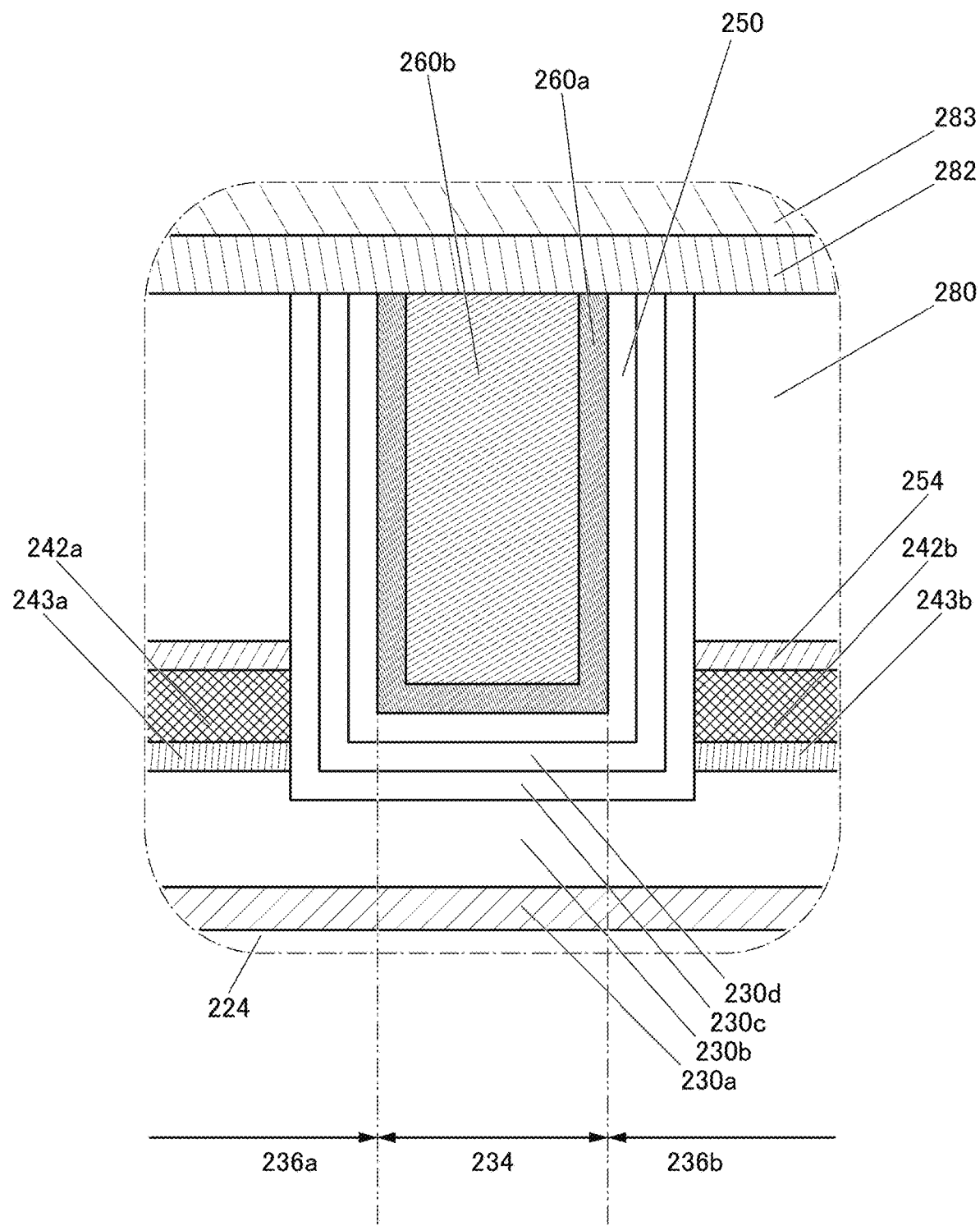
FIG. 2 is a cross-sectional view of a semiconductor device.

FIG. 2 is an enlarged view of the vicinity of the channel formation region in FIG. 1B. As illustrated in FIG. 2, the oxide 230 includes a region 234 functioning as the channel formation region of the transistor 200 and a region 236a and a region 236b that function as a source region and a drain region and are provided such that the region 234 is sandwiched therebetween. At least part of the region 234 overlaps the conductor 260. The conductor 242a and the conductor 242b are provided over the oxide 230b, and lower-resistance regions are formed in the vicinity of the conductor 242a of the region 236a and in the vicinity of the conductor 242b of the region 236b.

The region 236a and the region 236b functioning as the source region and the drain region are each a region that has a low oxygen concentration or contains impurities such as hydrogen, nitrogen, and a metal element, for example, and thus has an increased carrier concentration and a reduced resistance. In other words, the region 236a and the region 236b are each a region having a higher carrier concentration and a lower resistance than the region 234. The region 234 functioning as the channel formation region is a higher-resistance region with a lower carrier concentration because it has a higher oxygen concentration or a lower impurity concentration than the region 236a and the region 236b, for example. A region where the oxygen concentration is higher than or equal to that of the region 236a (the region 236b) and lower than or equal to that of the region 234 may be formed between the region 234 and the region 236a (the region 236b).

Although the width of the region 234 in the channel length direction is equal to the width of the conductor 260 in FIG. 2, this embodiment is not limited thereto. The width of the region 234 is smaller than the width of the conductor 260 in some cases, and the width of the region 234 is larger than the width of the conductor 260 in other cases.

In the oxide 230, the boundaries between the regions are difficult to detect clearly in some cases. The concentration of impurities such as hydrogen, nitrogen, and a metal element detected in each region might not only gradually change between the regions, but also continuously change within each region. That is, the region closer to the channel formation region preferably has a lower concentration of impurities such as hydrogen, nitrogen, and a metal element.

To increase the oxygen concentration in the region 234, an insulator containing oxygen that is released by heating (hereinafter referred to as excess oxygen in some cases) is provided in the vicinity of the oxide semiconductor so that oxygen can be supplied from the insulator to the oxide semiconductor when heat treatment is performed. As a result, oxygen vacancies in the channel formation region in the oxide semiconductor can be filled with supplied oxygen. Furthermore, supplied oxygen reacts with hydrogen remaining in the oxide semiconductor, so that the hydrogen can be removed as $H_2O$ (dehydration can be caused). This can inhibit formation of $V_OH$ in the oxide semiconductor.

However, when an excess amount of oxygen is supplied to the source region or the drain region, the carrier concentration in the source region or the drain region is reduced, so that the on-state current or field-effect mobility of the transistor 200 might be decreased, for example. Furthermore, uneven in-plane distribution of oxygen supplied to source regions or drain regions would cause variations in characteristics of semiconductor devices including the transistors.

Hence, the region 234 functioning as the channel formation region in the oxide semiconductor is preferably i-type or substantially i-type with a low carrier concentration, whereas the region 236a and the region 236b functioning as the source region and the drain region are preferably n-type with a high carrier concentration. That is, it is preferable that oxygen be supplied to the region 234 in the oxide semiconductor and the region 236a and the region 236b not be supplied with an excess amount of oxygen.

For example, when the insulator 254 is formed by a sputtering method, oxygen can be implanted into the insulator 224. Then, the oxygen implanted into the insulator 224 is supplied to the oxide 230b through the oxide 230c. Accordingly, oxygen can be selectively supplied to the oxide 230c and a region of the oxide 230b that is in contact with the oxide 230c, which account for a large portion of the region 234.

When the CAAC-OS that has a dense structure as described above is used as the oxide 230b, diffusion of impurities and oxygen in the oxide 230b can be reduced. Accordingly, oxygen supplied to the region 234 of the oxide 230b can be inhibited from diffusing to the region 236a and the region 236b of the oxide 230b.

As described above, oxygen is selectively supplied to the region 234 functioning as the channel formation region to make the region 234 i-type or substantially i-type, and diffusion of oxygen to the region 236a and the region 236b functioning as the source region and the drain region is inhibited to maintain the n-type of the region 236a and the region 236b. As a result, changes in the electrical characteristics of the transistor 200 can be inhibited, and thus in-plane variations in electrical characteristics of the transistors 200 can be inhibited.

An example of a parameter to evaluate the reliability of a transistor is a shift voltage (Vsh) measured with +GBT (Gate Bias Temperature) stress test. Vsh is defined as gate voltage (Vg) at which, in a drain current (Id)-Vg curve of a transistor, the tangent at a point where the slope of the curve is the steepest intersects the straight line of Id=1 pA. The amount of change in Vsh is represented as ΔVsh.

In the +GBT stress test for a transistor, ΔVsh sometimes shifts in the negative direction with time. In addition, ΔVsh sometimes shows the behavior of shifting to not the −direction (e.g., the negative direction) but both the negative direction and the positive direction. Note that this behavior is sometimes referred to as jagged behavior of ΔVsh in +GBT stress tests in this specification and the like.

When a metal oxide not containing the element M as its main component or a metal oxide with a small proportion of the element M is used as the oxide 230c, ΔVsh can be reduced and jagged behavior of ΔVsh can be inhibited, for example, whereby the reliability of the transistor can be improved.

The oxide 230d preferably contains at least one of the metal elements contained in the metal oxide used as the oxide 230c, and further preferably contains all of these metal elements. For example, it is preferable that an In-M-Zn oxide, an In—Zn oxide, or indium oxide be used as the oxide 230c, and an In-M-Zn oxide, an M-Zn oxide, or an oxide of the element M be used as the oxide 230d. Accordingly, the density of defect states at the interface between the oxide 230c and the oxide 230d can be decreased.

The oxide 230d is preferably a metal oxide that inhibits diffusion or passage of oxygen more readily than the oxide 230c. Providing the oxide 230d between the insulator 250 and the oxide 230c can inhibit diffusion of oxygen contained in the oxide 230c or the insulator 280 into the insulator 250. Thus, the oxygen can be efficiently supplied to the oxide 230b through the oxide 230c. Furthermore, oxidation of the conductor 260 due to supply of the oxygen to the conductor 260 through the insulator 250 can be inhibited.

When the atomic ratio of In to the metal element as the main component in the metal oxide used as the oxide 230d is smaller than the atomic ratio of In to the metal element as the main component in the metal oxide used as the oxide 230c, diffusion of In to the insulator 250 side can be inhibited. Since the insulator 250 functions as a gate insulator, the transistor exhibits poor characteristics when In enters the insulator 250 and the like. Thus, the oxide 230d provided between the oxide 230c and the insulator 250 enables a semiconductor device to have high reliability.

Here, the conduction band minimum gradually changes at junction portions of the oxide 230a, the oxide 230b, the oxide 230c, and the oxide 230d. In other words, the conduction band minimum at the junction portions of the oxide 230a, the oxide 230b, the oxide 230c, and the oxide 230d continuously changes or is continuously connected. To obtain this, the density of defect states in a mixed layer formed at the interface between the oxide 230a and the oxide 230b, the interface between the oxide 230b and the oxide 230c, and the interface between the oxide 230c and the oxide 230d is preferably decreased.

For example, when the oxide 230a and the oxide 230b, the oxide 230b and the oxide 230c, and the oxide 230c and the oxide 230d contain the same element as a main component in addition to oxygen, a mixed layer with a low density of defect states can be formed. For example, in the case where the oxide 230b is an In-M-Zn oxide, an In-M-Zn oxide, an M-Zn oxide, an oxide of the element M, an In—Zn oxide, indium oxide, or the like is preferably used as the oxide 230a, the oxide 230c, and the oxide 230d.

Specifically, as the oxide 230a, a metal oxide with a composition In:M:Zn=1:3:4 [atomic ratio] or in the neighborhood thereof, or In:M:Zn=1:1:0.5 [atomic ratio] or in the neighborhood thereof is used. As the oxide 230b, a metal oxide with a composition In:M:Zn=1:1:1 [atomic ratio] or in the neighborhood thereof, or In:M:Zn=4:2:3 [atomic ratio] or in the neighborhood thereof is used. As the oxide 230c, a metal oxide with a composition In:M:Zn=4:2:3 [atomic ratio] or in the neighborhood thereof, In:M:Zn=5:1:3 [atomic ratio] or in the neighborhood thereof, In:M:Zn=10:1:3 [atomic ratio] or in the neighborhood thereof, or indium oxide is used. As the oxide 230d, a metal oxide with a composition In:M:Zn=1:3:4 [atomic ratio] or in the neighborhood thereof, M:Zn=2:1 [atomic ratio] or in the neighborhood thereof, M:Zn=2:5 [atomic ratio] or in the neighborhood thereof, or an oxide of the element M is used. Note that a composition in the neighborhood includes the range of ±30% of an intended atomic ratio. Gallium is preferably used as the element M.

When the oxide 230a, the oxide 230b, the oxide 230c, and the oxide 230d have the above compositions, the density of defect states at the interface between the oxide 230a and the oxide 230b, the interface between the oxide 230b and the oxide 230c, and the interface between the oxide 230c and the oxide 230d can be made low. Thus, the influence of interface scattering on carrier conduction is small, and the transistor 200 can have a high on-state current and excellent frequency characteristics.

In a cross-sectional view of the transistor in the channel length direction, it is preferable that a groove portion be provided in the oxide 230b and the oxide 230c including the CAAC-OS be embedded in the groove. At this time, the oxide 230c is provided to cover the inner wall (the side wall and the bottom surface) of the groove portion.

It is preferable that the depth of the groove portion of the oxide 230b be substantially the same as the thickness of the oxide 230c. In other words, the top surface of the oxide 230c in a region overlapping the oxide 230b is preferably substantially level with the interface between the oxide 230b and the oxide 243a or the oxide 243b. For example, with the bottom surface of the insulator 222 as a reference, the difference between the level of the interface between the oxide 230b and the oxide 243a or the oxide 243b and the level of the interface between the oxide 230c and the oxide 230d is preferably smaller than or equal to the thickness of the oxide 230c, further preferably smaller than or equal to half of the thickness of the oxide 230c.

Such a structure reduces the effect of impurities and defects such as $V_OH$ in the transistor and enables a channel to be formed in the oxide 230c. As a result, the transistor can have favorable electrical characteristics. Furthermore, a semiconductor device with a small variation in transistor characteristics and high reliability can be provided.

Moreover, impurities at the interface between the oxide 230b and the oxide 230c and in the vicinity thereof are preferably reduced or removed. In the case where the element M is not aluminum, it is particularly preferable that impurities such as aluminum and silicon be reduced or removed because such impurities hinder an improvement in the crystallinity or c-axis alignment of the oxide 230c and the oxide 230b. For example, the concentration of aluminum atoms at the interface between the oxide 230b and the oxide 230c and in the vicinity thereof is preferably lower than or equal to 2.0 atomic %, further preferably lower than or equal to 1.5 atomic %, still further preferably lower than or equal to 1.0 atomic %.

Note that in a metal oxide, a region having become an amorphous-like oxide semiconductor (a-like OS) where an improvement in crystallinity or c-axis alignment is hindered by impurities such as aluminum and silicon is referred to as a non-CAAC region in some cases. In the non-CAAC region, a large amount of $V_OH$ is generated; thus, it is highly probable that the transistor easily becomes normally on. Accordingly, the non-CAAC region is preferably reduced in size or removed.

By contrast, since a dense crystal structure is formed in the oxide 230b and the oxide 230c each having a CAAC structure, it is difficult for $V_OH$ to exist stably. Furthermore, in oxygen adding treatment described later, excess oxygen is supplied to the oxide 230b and the oxide 230c, whereby $V_OH$ and $V_O$ in the oxide 230b and the oxide 230c can be reduced. When the oxide 230b and the oxide 230c each have a CAAC structure as described above, the transistor can be inhibited from becoming normally on.

FIG. 2 illustrates the structure in which the side surface of the opening in which the conductor 260 and the like are embedded is substantially perpendicular to the formation surface of the oxide 230b including the groove portion of the oxide 230b; this embodiment is not limited thereto. The opening may have a U-shape with a bottom portion having a gentle curve.

Note that an oxide including the non-CAAC region is not necessarily formed to be surrounded by the oxide 230b, the oxide 243a, the oxide 230c, and the oxide 230d, and is sometimes formed to be sandwiched between the oxide 230b and the oxide 230c.

As illustrated in FIG. 1C, a curved surface may be provided between a side surface of the oxide 230b and a top surface of the oxide 230b in the cross-sectional view in the channel width direction of the transistor 200. That is, an end portion of the side surface and an end portion of the top surface may be curved (such a shape is hereinafter also referred to as a rounded shape).

The radius of curvature of the curved surface is preferably greater than 0 nm and less than the thickness of the oxide 230b in the region overlapped by the conductor 242a or the conductor 242b or less than half of the length of a region of the top surface of the oxide 230b that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the groove portion with the insulator 250 and the conductor 260, which are formed in a later step. Furthermore, reduction in the length of the region of the top surface of the oxide 230b that does not have the curved surface can be prevented, and decrease in the on-state current and mobility of the transistor 200 can be inhibited. Thus, a semiconductor device with favorable electrical characteristics can be provided.

Note that the oxide 230c may be provided for each of the transistors 200. That is, the oxide 230c of the transistor 200 is not necessarily in contact with the oxide 230c of the adjacent transistor 200. The oxide 230c of the transistor 200 may be apart from the oxide 230c of the adjacent transistor 200. In other words, a structure in which the oxide 230c is not located between the transistor 200 and the adjacent transistor 200 may be employed.

When the above structure is employed for the semiconductor device where a plurality of transistors 200 are located in the channel width direction, the oxide 230c is independently provided in each transistor 200. Accordingly, generation of a parasitic transistor between the transistor 200 and the adjacent transistor 200 can be inhibited, and generation of a leakage path along the conductor 260 can be inhibited. Thus, a semiconductor device that has favorable electrical characteristics and can be miniaturized or highly integrated can be provided.

For example, when a distance between a side end portion of the oxide 230c of the transistor 200 and a side end portion of the oxide 230c of the adjacent transistor 200, which face each other in the channel width direction of the transistor 200, is denoted by $L_1$, $L_1$ is made greater than 0 nm. When a distance between a side end portion of the oxide 230a of the transistor 200 and a side end portion of the oxide 230a of the adjacent transistor 200, which face each other in the channel width direction of the transistor 200, is denoted by $L_2$, a value of a ratio of $L_1$ to $L_2$ ($L_1/L_2$) is preferably greater than 0 and less than 1, further preferably greater than or equal to 0.1 and less than or equal to 0.9, still further preferably greater than or equal to 0.2 and less than or equal to 0.8. Note that $L_2$ may be a distance between a side end portion of the oxide 230b of the transistor 200 and a side end portion of the oxide 230b of the adjacent transistor 200, which face each other.

By a reduction in the ratio of $L_1$ to $L_2$ ($L_1/L_2$), even when misalignment of a region where the oxide 230c is not located between the transistor 200 and the adjacent transistor 200 occurs, the oxide 230c of the transistor 200 can be apart from the oxide 230c of the adjacent transistor 200.

By an increase in the ratio of $L_1$ to $L_2$ ($L_1/L_2$), even when the interval between the transistor 200 and the adjacent transistor 200 is decreased, the width of the minimum feature size can be secured, and further miniaturization or higher integration of the semiconductor device can be achieved.

Note that each of the conductor 260 and the insulator 250 may be shared by the adjacent transistors 200. In other words, the conductor 260 of the transistor 200 includes a region continuous with the conductor 260 of the adjacent transistor 200. In addition, the insulator 250 of the transistor 200 includes a region continuous with the insulator 250 of the adjacent transistor 200.

In the above structure, the oxide 230d includes a region in contact with the insulator 224 between the transistor 200 and the adjacent transistor 200. Note that the oxide 230d of the transistor 200 may be apart from the oxide 230d of the adjacent transistor 200. In that case, the insulator 250 includes a region in contact with the insulator 224 between the transistor 200 and the adjacent transistor 200.

The insulator 212, the insulator 214, the insulator 254, the insulator 282, the insulator 283, and the insulator 286 preferably function as barrier insulating films that inhibit diffusion of impurities such as water and hydrogen from the substrate side or above the transistor 200 into the transistor 200. Thus, for the insulator 212, the insulator 214, the insulator 254, the insulator 282, the insulator 283, and the insulator 286, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms (an insulating material through which the impurities are less likely to pass). Alternatively, it is preferable to use an insulating material having a function of inhibiting diffusion of oxygen (e.g., at least one of an oxygen atom, an oxygen molecule, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). Alternatively, a barrier property in this specification means a function of trapping or fixing (also referred to as gettering) a targeted substance.

For example, silicon nitride or the like is preferably used for the insulator 212 and the insulator 283, and aluminum oxide or the like is preferably used for the insulator 214, the insulator 254, and the insulator 282. Accordingly, impurities such as water and hydrogen can be inhibited from being diffused to the transistor 200 side from the substrate side through the insulator 212 and the insulator 214. Moreover, oxygen contained in the insulator 224 or the like can be inhibited from being diffused to the substrate side through the insulator 212 and the insulator 214. In this manner, the transistor 200 is preferably surrounded by the insulator 212, the insulator 214, the insulator 254, the insulator 282, and the insulator 283 having a function of inhibiting diffusion of oxygen and impurities such as water and hydrogen.

The resistivities of the insulator 212, the insulator 283, and the insulator 286 are preferably low in some cases. For example, by setting the resistivities of the insulator 212, the insulator 283, and the insulator 286 to approximately $1 \times 10^{13}$ Ωkm, the insulator 212, the insulator 283, and the insulator 286 can sometimes reduce charge up of the conductor 205, the conductor 242a, the conductor 242b, the conductor 260, the conductor 246a, or the conductor 246b in treatment using plasma or the like in the manufacturing process of a semiconductor device. The resistivities of the insulator 212, the insulator 283, and the insulator 286 are preferably higher than or equal to $1 \times 10^{10}$ Ωcm and lower than or equal to $1 \times 10^{15}$ Ωcm.

The insulator 216 and the insulator 280 preferably have a lower permittivity than the insulator 214. When a material with a low permittivity is used for an interlayer film, parasitic capacitance generated between wirings can be reduced. For example, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide is used as appropriate for the insulator 216 and the insulator 280. In particular, silicon oxide and silicon oxynitride, which have thermal stability, are preferable. Materials such as silicon oxide, silicon oxynitride, and porous silicon oxide are particularly preferable because a region containing oxygen released by heating can be easily formed.

The conductor 205 (the conductor 205a and the conductor 205b) functions as a second gate electrode in some cases. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is positioned to be overlapped by the oxide 230 and the conductor 260.

As illustrated in FIG. 1A, the conductor 205 is preferably provided to be larger than a region of the oxide 230 that does not overlap the conductor 242a or the conductor 242b. As illustrated in FIG. 1C, it is particularly preferable that the conductor 205 extend to a region beyond end portions of the oxide 230a and the oxide 230b that intersect with the channel width direction. That is, the conductor 205 and the conductor 260 preferably overlap each other with the insulators therebetween beyond a side surface of the oxide 230 in the channel width direction. With this structure, the channel formation region of the oxide 230 can be electrically surrounded by the electric field of the conductor 260 functioning as the first gate electrode and the electric field of the conductor 205 functioning as the second gate electrode. In this specification, a transistor structure in which a channel formation region is electrically surrounded by electric fields of a first gate and a second gate is referred to as a surrounded channel (S-channel) structure.

In this specification and the like, the S-channel transistor refers to a transistor structure in which a channel formation region is electrically surrounded by electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

As illustrated in FIG. 1C, the conductor 205 is extended to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Here, for the conductor 205a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom, an oxygen molecule, and the like).

When a conductive material having a function of inhibiting diffusion of oxygen is used for the conductor 205a, the conductivity of the conductor 205b can be inhibited from being lowered because of oxidation. As a conductive material having a function of inhibiting diffusion of oxygen, for example, tantalum, tantalum nitride, ruthenium, or ruthenium oxide is preferably used. Thus, the conductor 205a is a single layer or stacked layers of the above conductive materials. For example, the conductor 205a may be a stack of tantalum, tantalum nitride, ruthenium, or ruthenium oxide and titanium or titanium nitride.

The conductor 205b is preferably formed using a conductive material containing tungsten, copper, or aluminum as its main component. Note that the conductor 205b is shown as a single layer but may have a stacked-layer structure, for example, a stack of any of the above conductive materials and titanium or titanium nitride.

Although the transistor 200 having a structure in which the conductor 205a and the conductor 205b are stacked as the conductor 205 is shown, this embodiment is not limited thereto. For example, the conductor 205 may have a single-layer structure or a stacked-layer structure of three or more layers. In the case where a component has a stacked-layer structure, layers may be distinguished by ordinal numbers corresponding to the formation order.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

As the insulator 222, an insulator containing an oxide of one or both of aluminum and hafnium, which is an insulating material, is preferably used. The insulator containing an oxide of one or both of aluminum and hafnium has a barrier property against oxygen, hydrogen, and water. It is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

For example, a single layer or stacked layers of an insulator containing what is called a high-k material, such as aluminum oxide, hafnium oxide, tantalum oxide, zirconium oxide, lead zirconate titanate (PZT), strontium titanate (Sr-$TiO_3$), or $(Ba,Sr)TiO_3$ (BST), may be used for the insulator 222. With miniaturization and high integration of transistors, a problem such as leakage current may arise because of a thinner gate insulator. When a high-k material is used for the insulator functioning as a gate insulator, a gate potential during operation of the transistor can be reduced while the physical thickness of the gate insulator is maintained.

It is preferable that the insulator 224 in contact with the oxide 230 release oxygen by heating. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

Specifically, for the insulator 224, it is preferable to use an insulating material including a region containing oxygen in excess of that in the stoichiometric composition (hereinafter also referred to as an excess-oxygen region) or an insulating material containing excess oxygen. An oxide film that includes an excess-oxygen region or excess oxygen is an oxide film in which the amount of released oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis preferably ranges from 100° C. to 700° C. or from 100° C. to 400° C.

One or more of heat treatment, microwave treatment, and RF treatment may be performed in a state in which the insulator including an excess-oxygen region and the oxide 230 are in contact with each other. By the treatment, water or hydrogen in the oxide 230 can be removed. Note that part of hydrogen is diffused into or gettered by the conductor 242a or the conductor 242b in some cases.

For the microwave treatment, for example, an apparatus including a power supply that generates high-density plasma or an apparatus including a power supply that applies RF to the substrate side is suitably used. For example, the use of a gas containing oxygen and high-density plasma enables high-density oxygen radicals to be generated, and RF application to the substrate side allows the oxygen radicals generated by the high-density plasma to be efficiently introduced into the oxide 230 or an insulator in the vicinity of the oxide 230. The pressure in the microwave treatment is higher than or equal to 133 Pa, preferably higher than or equal to 200 Pa, further preferably higher than or equal to 400 Pa. As a gas introduced into an apparatus for performing the microwave treatment, oxygen and argon are used, for example, and the microwave treatment is performed with an oxygen flow rate ratio ($O_2/(O_2+Ar)$) lower than or equal to 50%, preferably higher than or equal to 10% and lower than or equal to 30%.

Note that oxygen adding treatment performed on the oxide 230 can promote a reaction in which oxygen vacancies in the oxide 230 are repaired with supplied oxygen. Furthermore, hydrogen remaining in the oxide 230 reacts with supplied oxygen, so that the hydrogen can be removed as $H_2O$ (dehydration can be caused). This can inhibit recombination of hydrogen remaining in the oxide 230 with oxygen vacancies and formation of $V_OH$.

Note that the insulator 222 and the insulator 224 may each have a stacked-layer structure of two or more layers. In such cases, without limitation to a stacked-layer structure formed of the same material, a stacked-layer structure formed of different materials may be employed.

The oxide 243a and the oxide 243b preferably have a function of inhibiting the passage of oxygen. The oxide 243a (the oxide 243b) having a function of inhibiting the passage of oxygen is preferably provided between the oxide 230b and the conductor 242a (the conductor 242b) functioning as the source electrode or the drain electrode, in which case the electric resistance between the conductor 242a (the conductor 242b) and the oxide 230b can be reduced. Such a structure improves the electrical characteristics of the transistor 200 and reliability of the transistor 200. In the case where the electric resistance between the oxide 230b and the conductor 242a (the conductor 242b) can be sufficiently reduced, the oxide 243a (the oxide 243b) is not necessarily provided.

A metal oxide containing the element M may be used as the oxide 243a and the oxide 243b. In particular, aluminum, gallium, yttrium, or tin is preferably used as the element M. The concentration of the element M in the oxide 243a and the oxide 243b is preferably higher than that in the oxide 230b. Gallium oxide may be used as the oxide 243a and the oxide 243b. A metal oxide such as an In-M-Zn oxide may be used as the oxide 243a and the oxide 243b. Specifically, the atomic ratio of the element M to In in the metal oxide used as the oxide 243a and the oxide 243b is preferably greater than the atomic ratio of the element M to In in the metal oxide used as the oxide 230b. The thicknesses of the oxide 243a and the oxide 243b are preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm. The oxide 243a and the oxide 243b preferably have crystallinity. With the oxide 243a and the oxide 243b having crystallinity, release of oxygen in the oxide 230 can be suitably inhibited. When the oxide 243a and the oxide 243b have a hexagonal crystal structure, for example, release of oxygen in the oxide 230 can sometimes be inhibited.

The conductor 242a is provided over the oxide 243a, and the conductor 242b is provided over the oxide 243b.

For the conductor 242a and the conductor 242b, for example, a nitride containing tantalum, a nitride containing titanium, a nitride containing molybdenum, a nitride containing tungsten, a nitride containing tantalum and aluminum, a nitride containing titanium and aluminum, or the like is preferably used. In this embodiment, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

There is sometimes a curved surface between the side surface of the conductor 242a and the top surface of the conductor 242a and between the side surface of the conductor 242b and the top surface of the conductor 242b. That is, an end portion of the side surface and an end portion of the top surface may be curved. The radius of curvature of the curved surface at end portions of the conductor 242a and the conductor 242b is greater than or equal to 3 nm and less than or equal to 10 nm, preferably greater than or equal to 5 nm and less than or equal to 6 nm, for example. When the end portions are not angular, coverage with films in later deposition steps is improved.

When the oxide 243a (the oxide 243b) is not provided, the contact between the conductor 242a (the conductor 242b) and the oxide 230b or the oxide 230c may make oxygen in the oxide 230b or the oxide 230c diffuse into the conductor 242a (the conductor 242b), resulting in oxidation of the conductor 242a (the conductor 242b). It is highly probable that oxidation of the conductor 242a and the conductor 242b lowers the conductivity of the conductor 242a and the conductor 242b. Note that diffusion of oxygen in the oxide 230b or the oxide 230c into the conductor 242a and the conductor 242b can be rephrased as absorption of oxygen in the oxide 230b or the oxide 230c by the conductor 242a and the conductor 242b.

When oxygen in the oxide 230b or the oxide 230c is diffused into the conductor 242a and the conductor 242b, a layer is sometimes formed between the conductor 242a and the oxide 230b and between the conductor 242b and the oxide 230b or between the conductor 242a and the oxide 230c and between the conductor 242b and the oxide 230c. The layer contains more oxygen than the conductor 242a or the conductor 242b does, and thus the layer is assumed to have an insulating property. In this case, a three-layer structure of the conductor 242a or the conductor 242b, the layer, and the oxide 230b or the oxide 230c can be regarded as a three-layer structure of a metal, an insulator, and a semiconductor and is referred to as a MIS (Metal-Insulator-Semiconductor) structure or a diode-connected structure mainly formed of the MIS structure.

Note that hydrogen contained in the oxide 230b, the oxide 230c, or the like is diffused into the conductor 242a or the conductor 242b in some cases. In particular, when a nitride containing tantalum is used for the conductor 242a and the conductor 242b, hydrogen contained in the oxide 230b, the oxide 230c, or the like is likely to be diffused into the conductor 242a or the conductor 242b, and the diffused hydrogen is bonded to nitrogen contained in the conductor 242a or the conductor 242b in some cases. That is, hydrogen contained in the oxide 230b, the oxide 230c, or the like is sometimes absorbed by the conductor 242a or the conductor 242b.

The insulator 254 is provided to cover the side surface of the oxide 230a, the side surface of the oxide 230b, the side surface of the oxide 243a, the side surface of the oxide 243b, the side surface of the conductor 242a, the top surface of the conductor 242a, the side surface of the conductor 242b, and the top surface of the conductor 242b.

The insulator 254 preferably has a function of inhibiting diffusion of oxygen. For example, the insulator 254 preferably has a function of inhibiting oxygen diffusion more than the insulator 280. An insulator containing an oxide of one or both of aluminum and hafnium is preferably deposited as the insulator 254, for example.

Moreover, as the insulator 254, aluminum oxide or hafnium oxide is preferably deposited in an oxygen-containing atmosphere by a bias sputtering method. The bias sputtering method is a method in which sputtering is performed while RF power is applied to a substrate. The potential of the substrate supplied with the RF power becomes a negative potential (referred to as a bias potential) with respect to a plasma potential, and cations in plasma are accelerated by the bias potential and implanted into the substrate. The bias potential can be controlled by the amount of RF power applied to the substrate. Therefore, aluminum oxide or hafnium oxide is deposited by the bias sputtering method in an oxygen-containing atmosphere, whereby oxygen can be implanted into the insulator 224.

Note that in the bias sputtering method, the amount of oxygen implanted into the insulator 224 serving as a base of the insulator 254 can be controlled with the amount of RF power applied to the substrate. For example, as the RF power, a bias with a power density of 0.31 $W/cm^2$ or more, preferably 0.62 $W/cm^2$ or more, further preferably 1.86 $W/cm^2$ or more is applied to the substrate. In other words, the implantation amount of oxygen can be changed to be appropriate for the characteristics of the transistor, with the RF power used in depositing the insulator 254. Moreover, an appropriate amount of oxygen for improving the reliability of the transistor can be implanted. The RF frequency is preferably 10 MHz or higher. The typical frequency is 13.56 MHz. The higher the RF frequency is, the less damage the substrate gets. Thus, the amount of oxygen to be implanted into the insulator 224 can be controlled by adjusting the RF power applied to the substrate, so that the optimal amount of oxygen can be implanted into the insulator 224.

Note that a bias applied to the substrate in the bias sputtering method is not limited to the RF power and may be a DC voltage.

As described above, the insulator 254 has a function of implanting oxygen into the film serving as a base, but the insulator 254 itself has a function of suppressing the penetration of oxygen. Accordingly, when the insulator 280 is formed over the insulator 254 and oxygen is diffused from the insulator 280 in a later step, the oxygen can be prevented from directly diffusing from the insulator 280 to the oxide 230a, the oxide 230b, an oxide layer 243B, and a conductive layer 242B.

Providing the above-described insulator 254 can separate the oxide 230a, the oxide 230b, the oxide 243a, the oxide 243b, the conductor 242a, and the conductor 242b from the insulator 280. Thus, oxygen can be inhibited from directly diffusing from the insulator 280 to the oxide 230a, the oxide 230b, the oxide 243a, the oxide 243b, the conductor 242a, and the conductor 242b. Accordingly, a reduction in the carrier concentration in the source region and the drain region of the oxide 230 due to supply of excess oxygen to the source region and the drain region can be prevented. Furthermore, the conductor 242a and the conductor 242b can be inhibited from being excessively oxidized to have increased resistivity, and thus a reduction in on-state current can be inhibited.

The insulator 250 is preferably positioned in contact with at least part of the oxide 230d. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride are preferable because they are thermally stable.

Like the insulator 224, the insulator 250 is preferably formed using an insulator that releases oxygen by heating. When an insulator that releases oxygen by heating is provided as the insulator 250 in contact with at least part of the oxide 230d, oxygen can be effectively supplied to the channel formation region of the oxide 230 and oxygen vacancies in the channel formation region of the oxide 230 can be reduced. Thus, a transistor that has stable electrical characteristics with a small variation in electrical characteristics and improved reliability can be provided. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Although the insulator 250 is illustrated as a single layer in FIG. 1B and FIG. 1C, a stacked-layer structure of two or more layers may be employed. In the case where the insulator 250 has a stacked-layer structure of two layers, it is preferable that the lower layer of the insulator 250 be formed using an insulator from which oxygen is released by heating and the upper layer of the insulator 250 be formed using an insulator having a function of inhibiting diffusion of oxygen. With such a structure, oxygen contained in the lower layer of the insulator 250 can be inhibited from being diffused into the conductor 260. That is, the reduction in the amount of oxygen supplied to the oxide 230 can be inhibited. In addition, oxidation of the conductor 260 due to oxygen included in the lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where silicon oxide, silicon oxynitride, or the like is used for the lower layer of the insulator 250, the upper layer of the insulator 250 may be formed using an insulating material that is a high-k material having a high relative permittivity. The gate insulator having a stacked-layer structure of the lower layer of the insulator 250 and the upper layer of the insulator 250 can be thermally stable and can have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, for the upper layer of the insulator 250, a metal oxide containing one kind or two or more kinds selected from hafnium, aluminum, gallium, yttrium, zirconium, tungsten, titanium, tantalum, nickel, germanium, magnesium, and the like or a metal oxide that can be used as the oxide 230 can be used. In particular, an insulator containing an oxide of one or both of aluminum and hafnium is preferably used.

When the insulator 250 has a stacked-layer structure of the two layers, the distance between the conductor 260 and the oxide 230 is kept by the physical thickness of the insulator 250; hence, a leakage current between the conductor 260 and the oxide 230 can be reduced. Moreover, the physical distance between the conductor 260 and the oxide 230 and the intensity of electric field applied to the oxide 230 from the conductor 260 can be easily adjusted as appropriate.

A metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, the reduction in the amount of oxygen supplied to the oxide 230 can be inhibited. Moreover, oxidation of the conductor 260 due to oxygen in the insulator 250 can be inhibited.

Note that the metal oxide preferably has a function of part of the first gate electrode. With the metal oxide, the on-state current of the transistor 200 can be increased without a reduction in the influence of the electric field from the conductor 260. For example, a metal oxide that can be used as the oxide 230 can be used as the metal oxide. In that case, when the conductor 260a is deposited by a sputtering method, the metal oxide can have a reduced electric resistance to be a conductor. Such a conductor can be referred to as an OC (Oxide Conductor) electrode.

The conductor 260 preferably includes the conductor 260a and the conductor 260b positioned over the conductor 260a. For example, the conductor 260a is preferably positioned to cover a bottom surface and a side surface of the conductor 260b. As illustrated in FIG. 1B and FIG. 1C, the top surface of the conductor 260 is positioned to be substantially level with the top surface of the insulator 250, the top surface of the oxide 230d, and the top surface of the oxide 230c. Although the conductor 260 has a two-layer structure of the conductor 260a and the conductor 260b in FIG. 1B and FIG. 1C, the conductor 260 may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule, and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of titanium or titanium nitride and the above conductive material.

In the transistor 200, the conductor 260 is formed in a self-aligned manner to fill the opening formed in the insulator 280 and the like. The formation of the conductor 260 in this manner allows the conductor 260 to be positioned certainly in a region between the conductor 242a and the conductor 242b without alignment.

As illustrated in FIG. 1C, in the channel width direction of the transistor 200, the level of the bottom surface of the conductor 260 in a region where the conductor 260 and the oxide 230b do not overlap each other is preferably lower than the level of the bottom surface of the oxide 230b. When the conductor 260 functioning as the gate electrode covers a side surface and a top surface of the channel formation region of the oxide 230b with the insulator 250 and the like therebetween, the electric field of the conductor 260 is likely to act on the entire channel formation region of the oxide 230b. Thus, the on-state current of the transistor 200 can be increased and the frequency characteristics of the transistor 200 can be improved. When the bottom surface of the insulator 222 is a reference, the difference between the level of the bottom surface of the conductor 260 in a region where the oxide 230a and the oxide 230b are not overlapped by the conductor 260 and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 254. The top surface of the insulator 280 may be planarized.

The concentration of impurities such as water and hydrogen in the insulator 280 is preferably reduced. Moreover, the insulator 280 preferably has a low hydrogen concentration and includes an excess-oxygen region or excess oxygen, and may be provided using a material similar to that for the insulator 216, for example. The insulator 280 may have a stacked-layer structure of the above materials; for example, a stacked-layer structure of silicon oxide formed by a sputtering method and silicon oxynitride deposited thereover by a chemical vapor deposition (CVD) method can be employed. Furthermore, silicon nitride may be stacked thereover.

For the conductor 240a and the conductor 240b, a conductive material containing tungsten, copper, or aluminum as its main component is preferably used.

The conductor 240a and the conductor 240b may each have a stacked-layer structure. In the case where the conductor 240a and the conductor 240b each have a stacked-layer structure, a conductive material having a function of inhibiting transmission of impurities such as water and hydrogen is preferably used for a conductor in contact with the insulator 283, the insulator 282, the insulator 280, and the insulator 254. For example, tantalum, tantalum nitride, titanium, titanium nitride, ruthenium, ruthenium oxide, or the like is preferably used. The conductive material having a function of inhibiting transmission of impurities such as water and hydrogen may be used as a single layer or stacked layers. Moreover, impurities such as water and hydrogen contained in a layer above the insulator 283 can be inhibited from entering the oxide 230 through the conductor 240a and the conductor 240b.

For the insulator 241a and the insulator 241b, for example, an insulator such as silicon nitride, aluminum oxide, or silicon nitride oxide may be used. Since the insulator 241a and the insulator 241b are provided in contact with the insulator 254, impurities such as water and hydrogen contained in the insulator 280 or the like can be inhibited from entering the oxide 230 through the conductor 240a and the conductor 240b. In particular, silicon nitride is suitable because of having a high blocking property against hydrogen. Furthermore, oxygen contained in the insulator 280 can be prevented from being absorbed by the conductor 240a and the conductor 240b.

The conductor 246a functioning as a wiring may be provided in contact with the top surface of the conductor 240a, and the conductor 246b functioning as a wiring may be provided in contact with the top surface of the conductor

240b. For the conductor 246a and the conductor 246b, a conductive material containing tungsten, copper, or aluminum as its main component is preferably used. Furthermore, the conductor may have a stacked-layer structure and may be a stack of titanium or a titanium nitride and any of the above conductive materials, for example. Note that the conductor may be formed to be embedded in an opening provided in an insulator.

The insulator 286 is provided over the conductor 246a, the conductor 246b, and the insulator 283. Thus, the top surface of the conductor 246a, the side surface of the conductor 246a, the top surface of the conductor 246b, and the side surface of the conductor 246b are in contact with the insulator 286, and the bottom surface of the conductor 246a and the bottom surface of the conductor 246b are in contact with the insulator 283. In other words, the conductor 246a and the conductor 246b can be surrounded by the insulator 283 and the insulator 286. With such a structure, the passage of oxygen from the outside can be inhibited and the oxidation of the conductor 246 can be prevented. Furthermore, the above structure is preferably employed, in which case impurities such as water and hydrogen can be prevented from diffusing from the conductor 246a and the conductor 246b to the outside.

<Constituent Materials for Semiconductor Device>

Constituent materials that can be used for the semiconductor device will be described below.

[Substrate]

As the substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low relative permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by an insulator having a function of inhibiting passage of oxygen and impurities such as hydrogen, the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is particularly preferable to use a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

[Metal Oxide]

The oxide 230 is preferably formed using a metal oxide functioning as a semiconductor (an oxide semiconductor). A metal oxide that can be used as the oxide 230 of the present invention will be described below.

The metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

Note that in this specification and the like, a metal oxide containing nitrogen is also collectively referred to as a metal oxide in some cases. A metal oxide containing nitrogen may be referred to as a metal oxynitride.

<<Classification of Crystal Structures>>

First, the classification of crystal structures of an oxide semiconductor will be described with reference to FIG. 3A. FIG. 3A is a diagram showing the classification of crystal structures of an oxide semiconductor, typically IGZO (a metal oxide containing In, Ga, and Zn).

As shown in FIG. 3A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 3A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 3B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 3B and obtained by GIXD measurement is hereinafter simply referred to as an XRD spectrum. The CAAC-IGZO film in FIG. 3B has a composition in the vicinity of In:Ga:Zn=4:2:3 [atomic ratio]. The CAAC-IGZO film in FIG. 3B has a thickness of 500 nm.

In FIG. 3B, the horizontal axis represents 2θ [deg.], and the vertical axis represents intensity [a.u.]. As shown in FIG. 3B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 3B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 3C shows a diffraction pattern of a CAAC-IGZO film. FIG. 3C shows a diffraction pattern obtained with the NBED method in which an electron beam is incident in the direction parallel to the substrate. The CAAC-IGZO film in FIG. 3C has a composition in the vicinity of In:Ga:Zn=4:2:3 [atomic ratio]. In the nanobeam electron diffraction method, electron diffraction is performed with a probe diameter of 1 nm.

As shown in FIG. 3C, a plurality of spots indicating c-axis alignment are observed in the diffraction pattern of the CAAC-IGZO film.

<<Structure of Oxide Semiconductor>>

Oxide semiconductors may be classified in a manner different from that in FIG. 3A when classified in terms of the crystal structure. For example, oxide semiconductors are classified into a single crystal oxide semiconductor and a non-single-crystal oxide semiconductor. Examples of the non-single-crystal oxide semiconductor include the above-described CAAC-OS and nc-OS. Other examples of the non-single-crystal oxide semiconductor include a polycrystalline oxide semiconductor, an a-like OS, and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Hence, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Hence, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of this embodiment.

<<Transistor Including Oxide Semiconductor>>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Moreover, an oxide semiconductor having a low carrier concentration may be referred to as a highly purified intrinsic or substantially highly purified intrinsic oxide semiconductor. Note that in this specification and the like, the case where the carrier concentration of the metal oxide in the channel formation region is lower than or equal to $1\times10^{16}$ cm$^{-3}$ is defined as a substantially highly purified intrinsic state.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

In a transistor using an oxide semiconductor, when impurities and oxygen vacancies exist in a channel formation region of the oxide semiconductor, the resistance of the oxide semiconductor is reduced in some cases. In addition, the electrical characteristics easily vary, and the reliability is degraded in some cases.

In a transistor using an oxide semiconductor in the channel formation region, when a low-resistance region is formed in the channel formation region, leakage current (parasitic channel) between the source electrode and the drain electrode of the transistor is likely to be generated in the low-resistance region. Furthermore, the parasitic channel facilitates generation of defects of transistor characteristics, such as normally on of transistors, an increase in leakage current, and a change (shift) of threshold voltage caused by stress application. When the processing accuracy of the transistor is low, the parasitic channel varies between transistors, whereby variation in transistor characteristics occurs.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced.

<<Impurities>>

Here, the influence of each impurity in the oxide semiconductor is described.

Entry of impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. When the channel formation region includes oxygen vacancies, the transistor tends to have normally on characteristics (characteristics with which, even when no voltage is applied to the gate electrode, the channel exists and current flows through the transistor).

In a transistor using a metal oxide, the electrical characteristics vary due to impurities and oxygen vacancies in the metal oxide, whereby the transistor tends to have normally on characteristics. In the case where the transistor is driven in a state where excess oxygen exceeding the proper amount is included in the metal oxide, the valence of the excess oxygen atoms is changed and the electrical characteristics of the transistor vary, so that reliability is decreased in some cases.

If impurities exist in the channel formation region of the oxide semiconductor, the crystallinity of the channel formation region might decrease, and the crystallinity of an oxide provided in contact with the channel formation region might decrease. Low crystallinity of the channel formation region tends to result in deterioration in stability or reliability of the transistor. Moreover, if the crystallinity of the oxide provided in contact with the channel formation region is low, an interface state might be formed and the stability or reliability of the transistor might deteriorate.

Examples of impurities in a metal oxide include hydrogen, nitrogen, alkali metal, alkaline earth metal, iron, nickel, and silicon.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by SIMS) are lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally on characteristics. Thus, the concentration of an alkali metal or an alkaline earth metal in the oxide semiconductor, which is obtained using SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

When an oxide semiconductor with sufficiently reduced impurities is used for the channel formation region of the transistor, stable electrical characteristics can be given.

Variation Example 1 of Semiconductor Device

An example of a semiconductor device will be described below with reference to FIG. 4A to FIG. 4D.

Figure 4A:
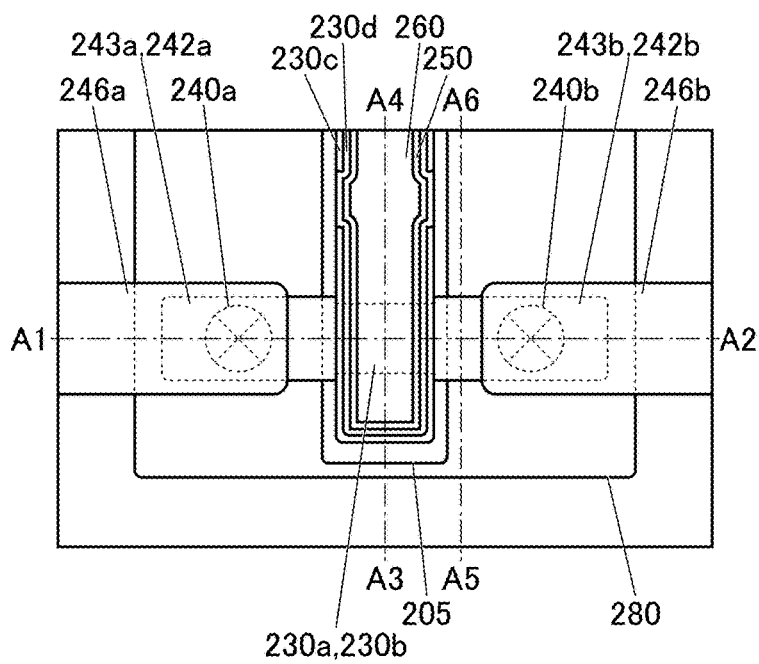
FIG. 4A is a top view of a semiconductor device.
Figure 4C:
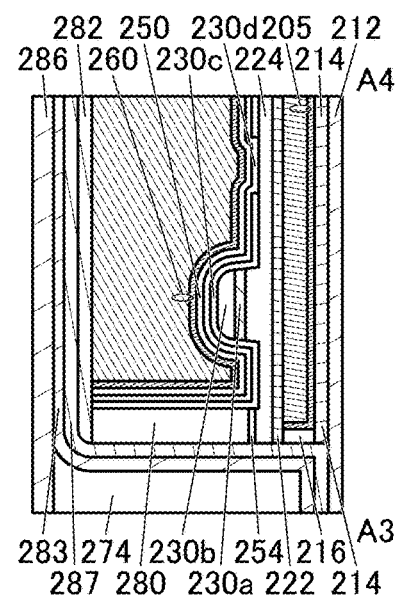
FIG. 4B to FIG. 4D are cross-sectional views of the semiconductor device.
Figure 4B:
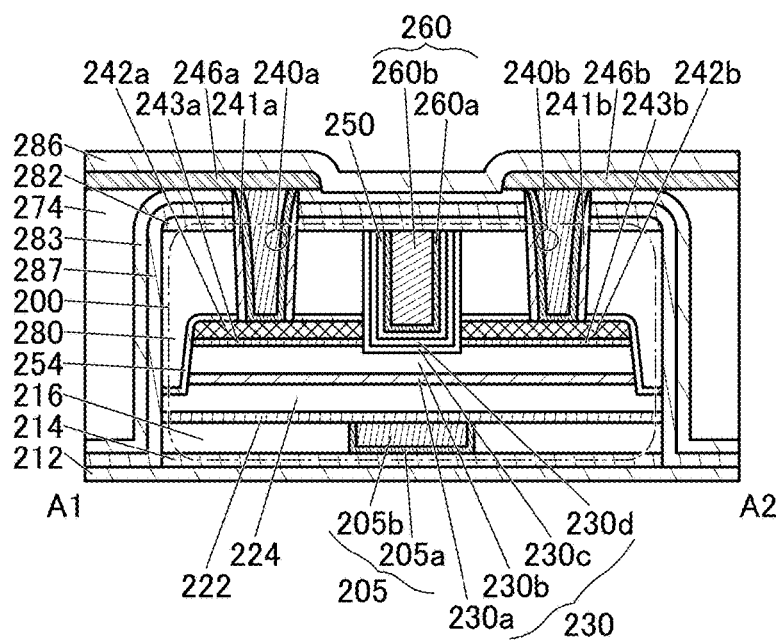
Figure 4D:
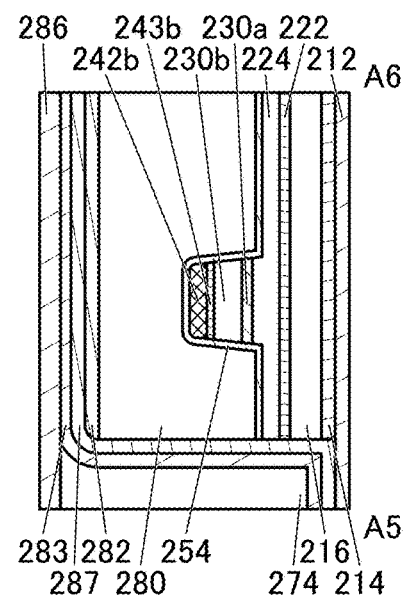
Figure 5A:
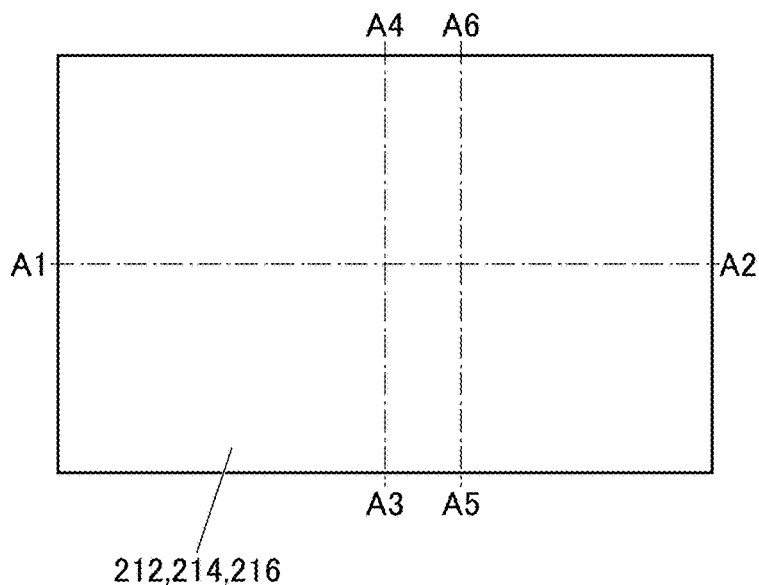
FIG. 5A is a top view illustrating a method for manufacturing a semiconductor device of one embodiment of the present invention.
Figure 5C:
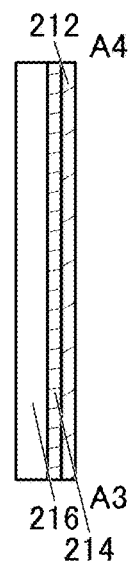
FIG. 5B to FIG. 5D are cross-sectional views illustrating the method for manufacturing the semiconductor device of one embodiment of the present invention.
Figure 5B:
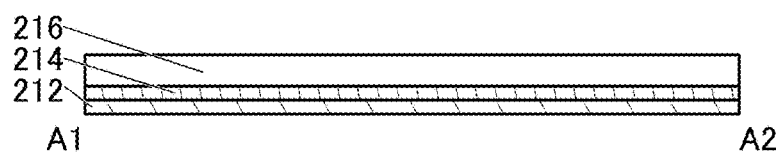
Figure 5D:
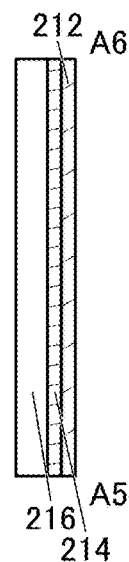
Figure 6A:
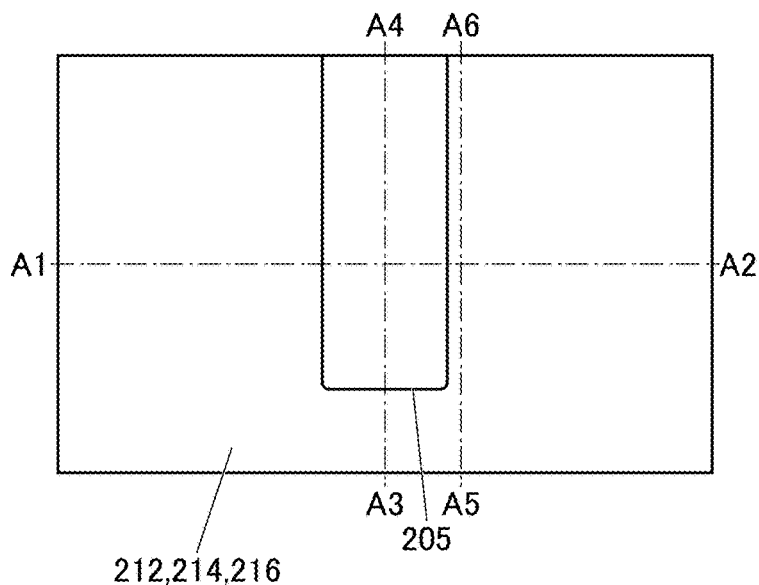
FIG. 6A is a top view illustrating the method for manufacturing the semiconductor device of one embodiment of the present invention.
Figure 6C:
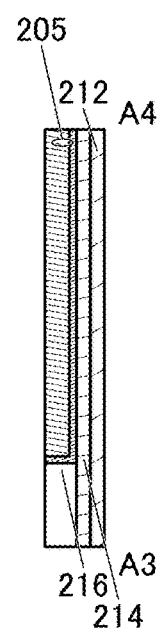
FIG. 6B to FIG. 6D are cross-sectional views illustrating the method for manufacturing the semiconductor device of one embodiment of the present invention.
Figure 6B:
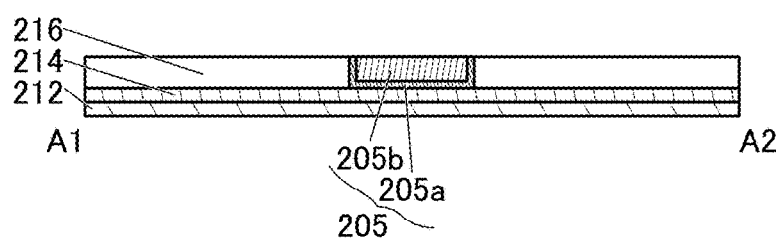
Figure 6D:
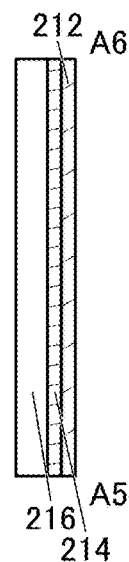
Figure 7A:
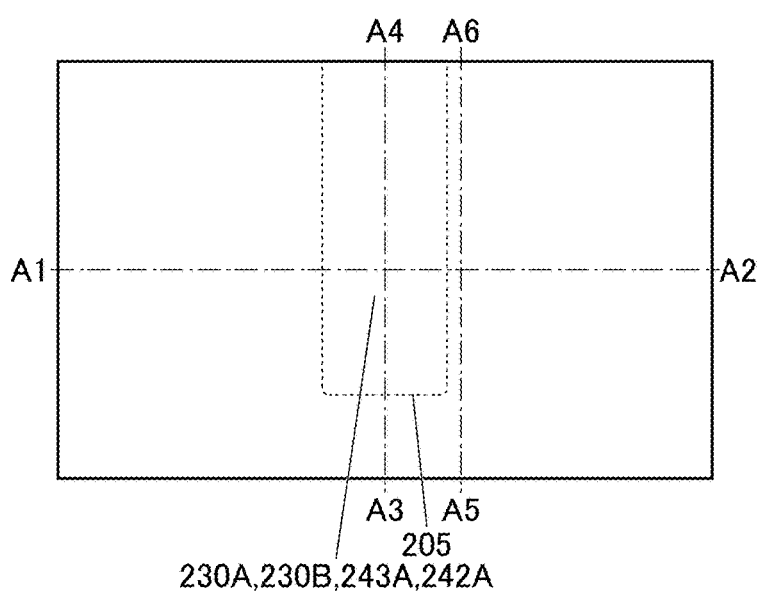
FIG. 7A is a top view illustrating the method for manufacturing the semiconductor device of one embodiment of the present invention.
Figure 7B:
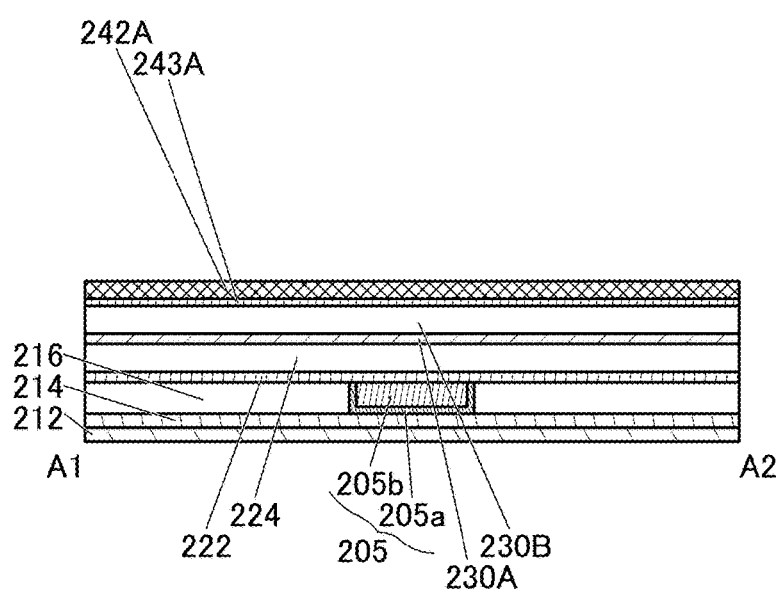
FIG. 7B to FIG. 7D are cross-sectional views illustrating the method for manufacturing the semiconductor device of one embodiment of the present invention.
Figure 7C:
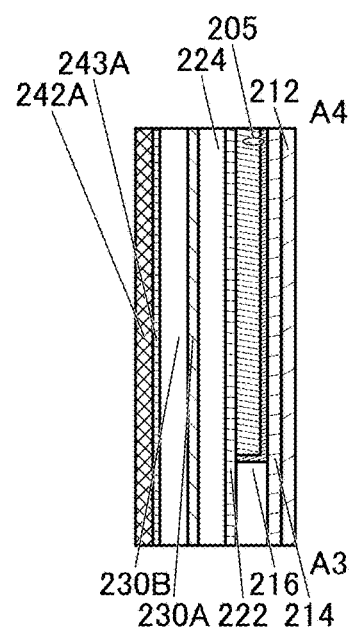
Figure 7D:
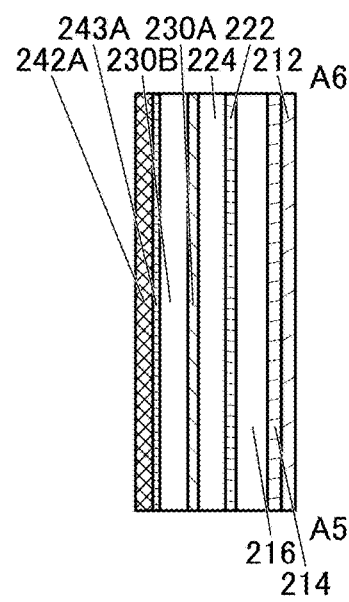
Figure 8A:
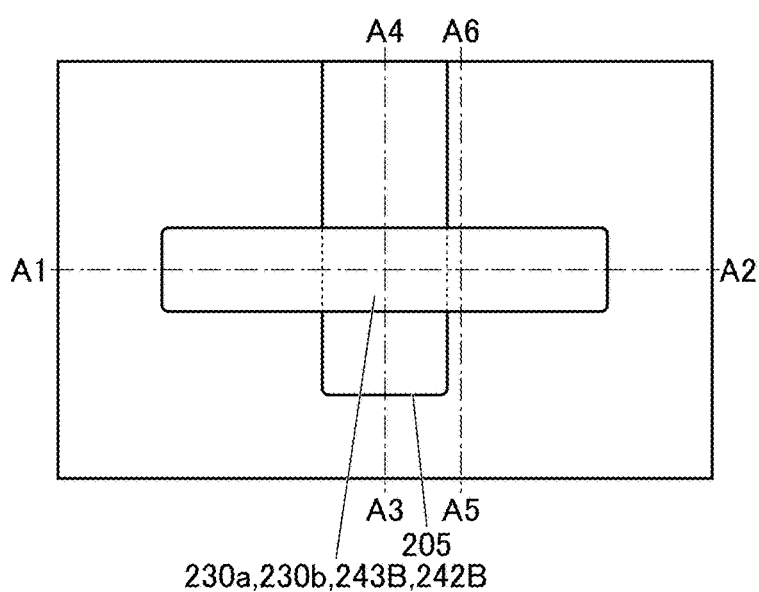
FIG. 8A is a top view illustrating the method for manufacturing the semiconductor device of one embodiment of the present invention.
Figure 8C:
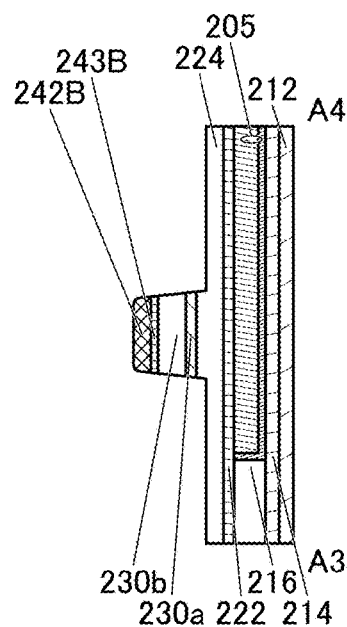
FIG. 8B to FIG. 8D are cross-sectional views illustrating the method for manufacturing the semiconductor device of one embodiment of the present invention.
Figure 8B:
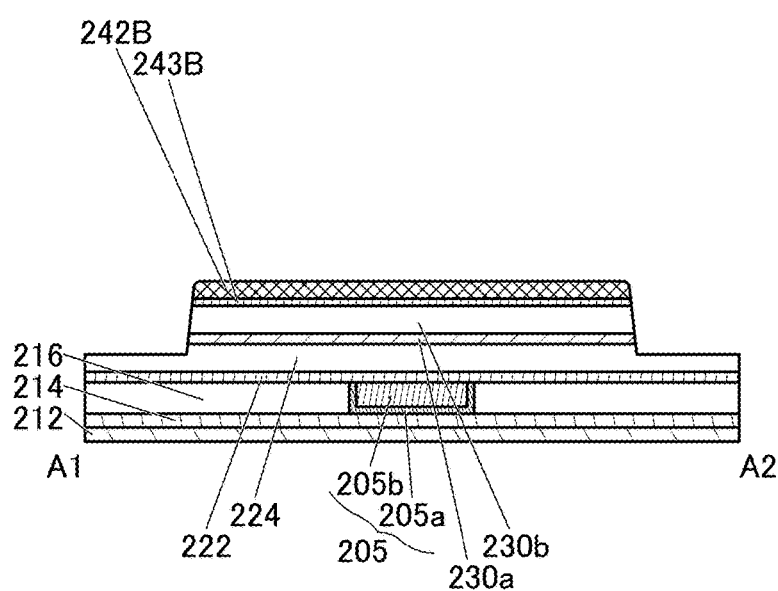
Figure 8D:
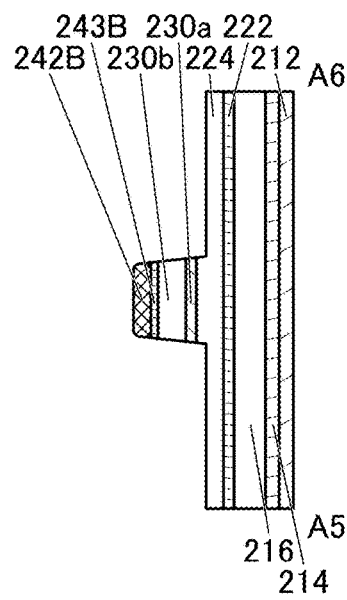

FIG. 4A is a top view of the semiconductor device. FIG. 4B is a cross-sectional view corresponding to a portion indicated by the dashed-dotted line A1-A2 in FIG. 4A. FIG. 4C is a cross-sectional view corresponding to a portion indicated by the dashed-dotted line A3-A4 in FIG. 4A. FIG. 4D is a cross-sectional view corresponding to a portion indicated by the dashed-dotted line A5-A6 in FIG. 4A. For clarity of the drawing, some components are not illustrated in the top view of FIG. 4A.

Note that in the semiconductor device illustrated in FIG. 4A to FIG. 4D, components having the same functions as the components included in the semiconductor device described in <Structure example of semiconductor device> are denoted by the same reference numerals. In addition, the materials described in detail in <Structure example of semiconductor device> can also be used as constituent materials of the semiconductor devices in this section.

The semiconductor device illustrated in FIG. 4A to FIG. 4D is a variation example of the semiconductor device illustrated in FIG. 1A to FIG. 1D. The semiconductor device in FIG. 4A to FIG. 4D is different from the semiconductor device in FIG. 1A to FIG. 1D in the shape of the insulator 283. It is also different in that an insulator 287 and an insulator 274 are included.

In the semiconductor device illustrated in FIG. 4A to FIG. 4D, the insulator 214, the insulator 216, the insulator 222, the insulator 224, the insulator 254, the insulator 280, and the insulator 282 are patterned. The insulator 287 and the insulator 283 cover the insulator 214, the insulator 216, the insulator 222, the insulator 224, the insulator 254, the insulator 280, and the insulator 282. That is, the insulator 287 is in contact with the top surface of the insulator 212, a side surface of the insulator 214, a side surface of the insulator 216, a side surface of the insulator 222, a side surface of the insulator 224, a side surface of the insulator 254, a side surface of the insulator 280, a side surface of the insulator 282, and the top surface of the insulator 282, and the insulator 283 is in contact with the top surface and a side surface of the insulator 287. Accordingly, the oxide 230, the insulator 214, the insulator 216, the insulator 222, the insulator 224, the insulator 254, the insulator 280, the insulator 282, and the like are isolated from the outside by the insulator 287, the insulator 283, and the insulator 212. In other words, the transistor 200 is provided in a region sealed by the insulator 287, the insulator 283, and the insulator 212.

For example, it is preferable that the insulator 214, the insulator 282, and the insulator 287 be formed using a material having a function of trapping or fixing hydrogen, and the insulator 212 and the insulator 283 be formed using a material having a function of inhibiting diffusion of hydrogen and oxygen. Typically, aluminum oxide can be used for the insulator 214, the insulator 282, and the insulator 287. Moreover, typically, silicon nitride can be used for the insulator 212 and the insulator 283.

With the above structure, entry of hydrogen contained in a region outside the sealed region into the sealed region can be inhibited. Thus, the hydrogen concentration in the transistor can kept low.

Although the transistor 200 in which the insulator 212, the insulator 287, and the insulator 283 each have a single-layer structure is illustrated in FIG. 4A to FIG. 4D, this embodiment is not limited thereto. For example, each of the insulator 212, the insulator 287, and the insulator 283 may have a stacked-layer structure of two or more layers.

The insulator 287 is not necessarily provided. With such a structure, the transistor 200 is located in a region sealed by the insulator 212 and the insulator 283. With this structure, entry of hydrogen contained in a region outside the sealed region into the sealed region can be further inhibited. Thus, the hydrogen concentration in the transistor can be kept low.

The insulator 274 functions as an interlayer film. The permittivity of the insulator 274 is preferably lower than that of the insulator 214. When a material with a low permittivity is used for an interlayer film, parasitic capacitance generated between wirings can be reduced. The insulator 274 can be provided using a material similar to that for the insulator 280, for example.

An insulating film to be the insulator 274 is preferably formed by a sputtering method. A film formed by a sputtering method is preferable because of its low hydrogen concentration. Therefore, an increase in the hydrogen concentration in the transistor in the step of forming the insulating film can be inhibited.

The insulator 287, the insulator 283, and the insulating film are preferably formed successively without being exposed to the atmospheric environment. The successive formation without exposure to the atmospheric environment can prevent attachment of impurities or moisture from the atmospheric environment onto the insulator 287 and the insulator 283; hence, the interface between the insulator 287 and the insulator 283 and its vicinity and the interface between the insulator 283 and the insulating film and its vicinity can be kept clean. Moreover, the manufacturing process for the semiconductor device can be simplified.

<Method for Manufacturing Semiconductor Device>

Next, a method for manufacturing the semiconductor device that is one embodiment of the present invention and is illustrated in FIG. 4A to FIG. 4D will be described with reference to FIG. 5 to FIG. 21.

FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, and FIG. 21A are top views. FIG. 5B, FIG. 6B, FIG. 7B, FIG. 8B, FIG. 9B, FIG. 10B, FIG. 11B, FIG. 12B, FIG. 13B, FIG. 14B, FIG. 15B, FIG. 16B, FIG. 17B, FIG. 18B, FIG. 19B, FIG. 20B, and FIG. 21B are cross-sectional views corresponding to portions indicated by the dashed-dotted lines A1-A2 in FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, and FIG. 21A, respectively, and are also cross-sectional views of the transistor 200 in the channel length direction. FIG. 5C, FIG. 6C, FIG. 7C, FIG. 8C, FIG. 9C, FIG. 10C, FIG. 11C, FIG. 12C, FIG. 13C, FIG. 14C, FIG. 15C, FIG. 16C, FIG. 17C, FIG. 18C, FIG. 19C, FIG. 20C, and FIG. 21C are cross-sectional views corresponding to portions indicated by the dashed-dotted lines A3-A4 in FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, and FIG. 21A, respectively, and are also cross-sectional views of the transistor 200 in the channel width direction. FIG. 5D, FIG. 6D, FIG. 7D, FIG. 8D, FIG. 9D, FIG. 10D, FIG. 11D, FIG. 12D, FIG. 13D, FIG. 14D, FIG. 15D, FIG. 16D, FIG. 17D, FIG. 18D, FIG. 19D, FIG. 20D, and FIG. 21D are cross-sectional views corresponding to portions indicated by the dashed-dotted lines A5-A6 in FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, and FIG. 21A, respectively. Note that for simplification of the drawings, some components are not illustrated in the top views of FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, and FIG. 21A.

First, a substrate (not illustrated) is prepared, and the insulator 212, the insulator 214, and the insulator 216 are formed in this order over the substrate (see FIG. 5A to FIG. 5D). The insulator 212, the insulator 214, and the insulator 216 are preferably formed successively without being exposed to the atmospheric environment. The successive formation can prevent impurities or moisture from the atmospheric environment from attaching onto the insulator 212 and the insulator 214 and can keep cleanliness of the interface between the insulator 212 and the insulator 214 and its vicinity and the interface between the insulator 214 and the insulator 216 and its vicinity.

The insulator 212, the insulator 214, and the insulator 216 can each be formed using a sputtering method, a CVD method, a molecular beam epitaxy (MBE) method, a pulsed laser deposition (PLD) method, an atomic layer deposition (ALD) method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

Using a plasma CVD method, a high-quality film can be obtained at a relatively low temperature. A thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD (Plasma Enhanced ALD) method, in which a reactant excited by plasma is used, and the like can be used.

An ALD method, which enables one atomic layer to be formed at a time using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. The use of plasma in a PEALD (Plasma Enhanced ALD) method is sometimes preferable because deposition at a lower temperature is possible. Note that a precursor used in the ALD method sometimes contains impurities such as carbon. Thus, in some cases, a film provided using the ALD method contains impurities such as carbon in a larger amount than a film provided by another deposition method. Note that impurities can be quantified by X-ray photoelectron spectroscopy (XPS).

Unlike a deposition method in which particles ejected from a target or the like are formed, a CVD method and an ALD method are deposition methods in which a film is formed by reaction at a surface of an object to be processed.

Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, using a CVD method and an ALD method, a film with a certain composition can be formed depending on the flow rate ratio of the source gases. Moreover, for example, by a CVD method and an ALD method, a film whose composition is continuously changed can be formed by changing the flow rate ratio of the source gases during the deposition. In the case where the film is formed while changing the flow rate ratio of the source gases, as compared to the case where the film is formed using a plurality of deposition chambers, the time taken for the deposition can be shortened because the time taken for transfer and pressure adjustment is omitted. Thus, the productivity of the semiconductor device can be increased in some cases.

In this embodiment, for the insulator 212, silicon nitride is deposited by a sputtering method. Thus, silicon nitride having a low hydrogen concentration can be formed. When an insulator through which copper is less likely to pass, such as silicon nitride, is used for the insulator 212, even in the case where a metal that is likely to diffuse, such as copper, is used for a conductor in a layer (not illustrated) below the insulator 212, diffusion of the metal into an upper portion through the insulator 212 can be inhibited. The use of an insulator through which impurities such as water and hydrogen are less likely to pass, such as silicon nitride, can inhibit diffusion of impurities such as water and hydrogen contained in a layer below the insulator 212.

In this embodiment, for the insulator 214, aluminum oxide is deposited by a sputtering method. Thus, aluminum oxide having a lower hydrogen concentration than the insulator 212 can be formed.

In this embodiment, for the insulator 216, silicon oxide is deposited by a sputtering method. Thus, silicon oxide having a low hydrogen concentration can be formed.

Then, an opening reaching the insulator 214 is formed in the insulator 216. A groove and a slit, for example, are included in the category of the opening. A region where an opening is formed is referred to as an opening portion in some cases. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where silicon oxide or silicon oxynitride is used as the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205a is formed. The conductive film preferably includes a conductor that has a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be formed by a sputtering method, a CVD method, an MBE method, a PLD method, an ALD method, or the like.

In this embodiment, the conductive film to be the conductor 205a has a multilayer structure. First, a tantalum nitride film is formed by a sputtering method, and a titanium nitride film is stacked over the tantalum nitride film. When such a metal nitride film is used as the lower layer of the conductor 205b, even in the case where a metal that is likely to diffuse, such as copper, is used for a conductive film to be the conductor 205b described later, outward diffusion of the metal from the conductor 205a can be inhibited.

Next, the conductive film to be the conductor 205b is formed. The conductive film can be formed by a plating method, a sputtering method, a CVD method, an MBE method, a PLD method, an ALD method, or the like. In this embodiment, for the conductive film, a low-resistance conductive material such as copper is deposited.

Then, CMP treatment is performed, thereby removing part of the conductive film to be the conductor 205a and part of the conductive film to be the conductor 205b to expose the insulator 216. As a result, the conductor 205a and the conductor 205b remain only in the opening portion. Thus, the conductor 205 whose top surface is flat can be formed (see FIG. 6A to FIG. 6D). Note that the insulator 216 is partly removed by the CMP treatment in some cases.

Although the conductor 205 is embedded in the opening of the insulator 216 in the above description, one embodiment of the present invention is not limited thereto. For example, the surface of the conductor 205 may be exposed in the following manner: the conductor 205 is formed over the insulator 214, the insulator 216 is formed over the conductor 205, and the insulator 216 is subjected to CMP treatment so that the insulator 216 is partly removed. In this case, the insulator 212 and the insulator 214 are preferably formed successively without being exposed to the atmospheric environment.

Next, the insulator 222, the insulator 224, an oxide film 230A, an oxide film 230B, and an oxide film 243A are formed in this order over the insulator 216 and the conductor 205 (see FIG. 7A to FIG. 7D). The insulator 222, the insulator 224, the oxide film 230A, the oxide film 230B, and the oxide film 243A are preferably formed successively without being exposed to the atmospheric environment. The successive formation without exposure to the atmospheric environment can prevent impurities or moisture from the atmospheric environment from being attached onto the insulator 222, the insulator 224, the oxide film 230A, and the oxide film 230B and keep cleanliness of the interface between the insulator 222 and the insulator 224 and its vicinity, the interface between the insulator 224 and the oxide film 230A and its vicinity, the interface between the oxide film 230A and the oxide film 230B and its vicinity, and the interface between the oxide film 230B and the oxide film 243A and its vicinity The insulator 222, the insulator 224, the oxide film 230A, the oxide film 230B, and the oxide film 243A can each be formed by a sputtering method, a CVD method, an MBE method, a PLD method, an ALD method, or the like.

Heat treatment may be performed after the insulator 222 is formed. The heat treatment is performed at higher than or equal to 250° C. and lower than or equal to 650° C., preferably higher than or equal to 300° C. and lower than or equal to 500° C., further preferably higher than or equal to 320° C. and lower than or equal to 450° C. For the heat treatment, heat treatment conditions described later may be employed, or RTA (Rapid Thermal Annealing) described later may be performed. The heat treatment can improve the crystallinity of the insulator 222.

In this embodiment, as the insulator 222, an insulator containing an oxide of one or both of aluminum and hafnium is formed by a sputtering method.

In this embodiment, as the insulator 224, silicon oxide is formed by a sputtering method. Thus, the concentration of hydrogen in the insulator 224 can be reduced.

In the case where the oxide film 230A and the oxide film 230B are formed by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are formed by a sputtering method, a target of the above In-M-Zn oxide or the like can be used.

In particular, when the oxide film 230A is formed, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is heated, the crystallinity of the oxide film can be improved.

In this embodiment, the oxide film 230A is formed by a sputtering method using an oxide target with In:Ga:Zn=1:3:4 [atomic ratio]. The oxide film 230B is formed by a sputtering method using an oxide target with In:Ga:Zn=4:2:4.1 [atomic ratio]. The oxide film 243A is formed by a sputtering method using an oxide target with In:Ga:Zn=1:3:4 [atomic ratio]. Note that each of the oxide films is preferably formed to have characteristics required for the oxide 230a, the oxide 230b, the oxide 243a, and the oxide 243b by selecting the deposition conditions and the atomic ratios as appropriate.

Next, heat treatment is preferably performed. The heat treatment is performed in a temperature range where the oxide film 230A, the oxide film 230B, and the oxide film 243A do not become polycrystalline, i.e., at a temperature higher than or equal to 250° C. and lower than or equal to 650° C., preferably higher than or equal to 400° C. and lower than or equal to 600° C.

Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas is approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere. By performing the heat treatment in an oxygen atmosphere, oxygen can be supplied to the oxide 230 to reduce oxygen vacancies.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the oxide film 230A, the oxide film 230B, the oxide film 243A, and the like as much as possible.

A gas baking furnace, an electric furnace, an RTA apparatus, or the like can be used for the heat treatment. With the use of an RTA apparatus, the heat treatment can be performed at a temperature higher than or equal to the strain point of the substrate only for a short time. Therefore, the heat treatment time can be shortened. Furthermore, when an apparatus capable of successive deposition is configured such that one of treatment chambers of the apparatus enables RTA, heat treatment can be performed during successive deposition. Thus, the process can be simplified, whereby the productivity of the semiconductor device can be increased.

Heat treatment by RTA is performed at a temperature higher than or equal to 400° C. and lower than or equal to 750° C., preferably higher than or equal to 500° C. and lower than or equal to 650° C., for example. The heat treatment is performed in an oxygen atmosphere. The treatment time is 600 seconds or less, preferably 180 seconds or less.

In this embodiment, the heat treatment is performed in such a manner that treatment is performed at 550° C. in a nitrogen atmosphere for one hour and then another treatment is successively performed at 550° C. in an oxygen atmosphere for one hour. By the heat treatment, impurities such as water and hydrogen in the oxide film 230A, the oxide film 230B, and the oxide film 243A can be removed, for example. Furthermore, the heat treatment improves the crystallinity of the oxide film 230B, thereby offering a dense structure with a higher density. Thus, diffusion of oxygen or impurities in the oxide film 230B can be inhibited.

Then, a conductive film 242A is formed over the oxide film 243A (see FIG. 7A to FIG. 7D). The conductive film 242A can be formed by a sputtering method, a CVD method, an MBE method, a PLD method, an ALD method, or the like. Note that heat treatment may be performed before the formation of the conductive film 242A. This heat treatment may be performed under reduced pressure, and the conductive film 242A may be successively formed without exposure to the air. Such processing can remove moisture and hydrogen adsorbed onto the surface of the oxide film 243A and the like, and can also reduce the moisture concentration and the hydrogen concentration in the oxide film 230A, the oxide film 230B, and the oxide film 243A. The heat treatment is preferably performed at a temperature higher than or equal to 100° C. and lower than or equal to 400° C. In this embodiment, the heat treatment is performed at 200° C.

In the case where the conductive film 242A is formed by a sputtering method, it is preferred that the insulator 222, the insulator 224, the oxide film 230A, the oxide film 230B, the oxide film 243A, and the conductive film 242A be formed successively without being exposed to the atmospheric environment. The successive formation can inhibit adsorption of moisture and hydrogen onto the surface of the oxide film 243A and the like. Thus, the above heat treatment is not necessarily performed; without the heat treatment, the process of manufacturing the semiconductor device can be simplified, so that the productivity of the semiconductor device can be increased.

Next, the oxide film 230A, the oxide film 230B, the oxide film 243A, and the conductive film 242A are processed into island shapes by a lithography method.

First, a resist is formed over the conductive film 242A, and the resist is exposed to light through a mask. Next, a region exposed to light is removed or left using a developer, so that a resist mask is formed.

The resist mask is formed through, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam.

Here, heat resistance and dry etching resistance of the resist mask may be improved. In this specification, improving heat resistance and dry etching resistance of the resist mask may be referred to as curing the resist mask.

For example, when the resist mask is irradiated with ultraviolet light, resist molecules are cross-linked, whereby the heat resistance and dry etching resistance of the resist mask can be improved. As the ultraviolet light, it is preferable to use near-ultraviolet light (ultraviolet light with a wavelength greater than or equal to 200 nm and less than or equal to 380 nm) or far-ultraviolet light (ultraviolet light with a wavelength greater than or equal to 10 nm and less than or equal to 200 nm, which is also referred to as vacuum ultraviolet light), and it is further preferable to use ultraviolet light with a wavelength greater than or equal to 250 nm and less than or equal to 300 nm. In addition, high-temperature heat treatment may be performed after the irradiation with the ultraviolet light.

As another example, when the resist mask is exposed to plasma to modify the film quality on the resist surface side, the heat resistance and dry etching resistance of the resist mask can be improved. For the plasma, an $H_2$ gas, a mixed gas of $H_2$ and Ar, a mixed gas of $CF_4$ and $O_2$, a mixed gas of $C_2HCl_3$ and $O_2$, or the like is used.

Next, the oxide film 230A, the oxide film 230B, the oxide film 243A, and the conductive film 242A are processed into island shapes by etching treatment through the resist mask, whereby the oxide 230a, the oxide 230b, the oxide layer 243B, and the conductive layer 242B are formed (see FIG. 8A to FIG. 8D). For the processing, a dry etching method or a wet etching method can be employed. Processing using a dry etching method is suitable for microfabrication. The oxide film 230A, the oxide film 230B, the oxide film 243A, and the conductive film 242A may be processed under different conditions. Note that in this step, the thickness of the insulator 224 in a region not overlapped by the oxide 230a is reduced in some cases.

Here, the oxide 230a, the oxide 230b, the oxide layer 243B, and the conductive layer 242B are formed to at least partly overlap the conductor 205. It is preferable that the side surfaces of the oxide 230a, the oxide 230b, the oxide layer 243B, and the conductive layer 242B be substantially perpendicular to the top surface of the insulator 222. When the side surfaces of the oxide 230a, the oxide 230b, the oxide layer 243B, and the conductive layer 242B are substantially perpendicular to the top surface of the insulator 222, a plurality of transistors 200 can be provided in a smaller area and at a higher density. Alternatively, a structure may be employed in which an angle formed by the side surfaces of the oxide 230a, the oxide 230b, the oxide layer 243B, and the conductive layer 242B and the top surface of the insulator 222 is an acute angle. With such a shape, coverage with the insulator 254 and the like can be improved in a later step, so that defects such as voids can be reduced.

There is a curved surface between the side surface of the conductive layer 242B and the top surface of the conductive layer 242B. That is, an end portion of the side surface and an end portion of the top surface are preferably curved. The radius of curvature of the curved surface at the end portion of the conductive layer 242B is greater than or equal to 3 nm and less than or equal to 10 nm, preferably greater than or equal to 5 nm and less than or equal to 6 nm, for example. When the end portions are not angular, coverage with films in later deposition steps is improved.

By the above processing, a layer (not illustrated) is sometimes formed over the insulator 224, the oxide 230a, the oxide 230b, the oxide layer 243B, and the conductive layer 242B. The layer is a layer formed in such a manner that part of the conductive layer 242B is etched, rises in the chamber, and then is deposited again. Accordingly, the layer is an oxide containing the main component of the conductive layer 242B. For example, in the case where tantalum nitride is used for the conductive layer 242B, the layer is an oxide containing tantalum.

In the case where the layer has a function of inhibiting diffusion of oxygen, the formation of the layer over the insulator 224 would reduce the amount of oxygen implanted into the insulator 224 by deposition of the insulator 254 by a sputtering method.

In view of this, the layer over the insulator 224 and the conductive layer 242B is removed by performing anisotropic etching after the processing. At this time, part of the layer may remain on the side surface of the oxide 230a, the side surface of the oxide 230b, the side surface of the oxide 243a, the side surface of the oxide 243b, the side surface of the conductor 242a, and the side surface of the conductor 242b. In the case where the layer has a function of inhibiting diffusion of oxygen, when part of the layer remains on the side surface of the oxide 230a and the side surface of the oxide 230b, entry of oxygen into the region 236a and the region 236b can be inhibited. Thus, the low-resistance regions can be maintained.

When the side surface of the oxide 230a and the side surface of the oxide 230b overlapped by the conductor 242a and the conductor 242b functioning as the source electrode and the drain electrode are made n-type in this manner, the on-state current of the transistor 200 can be increased.

Note that the layer can be detected using EDX in some cases. For example, on the side surface of the oxide 230b in a region overlapped by the conductor 242a or the conductor 242b, a region is detected in which the concentration of the main component (except oxygen) of the layer obtained by element analysis using EDX is higher than or equal to the lower detection limit and lower than or equal to 1.0 atomic %. Moreover, the concentration of the main component (except oxygen) of the layer is lower on the side surface of the oxide 230b in the region overlapped by the conductor 242a or the conductor 242b than on the top surface of the insulator 224 in a region not overlapped by the oxide 230b.

After the anisotropic etching, the resist mask remains in some cases. The remaining resist mask can be removed by dry etching treatment such as ashing, wet etching treatment, wet etching treatment after dry etching treatment, or dry etching treatment after wet etching treatment.

Note that the curing of the resist mask, the processing of the oxide film 230A, the oxide film 230B, the oxide film 243A, and the conductive film 242A into island shapes, and the anisotropic etching of the layer are preferably performed successively using one dry etching apparatus. In the case where the resist mask remains after the anisotropic etching, the curing of the resist mask, the processing of the oxide film 230A, the oxide film 230B, the oxide film 243A, and the conductive film 242A into island shapes, the anisotropic etching of the layer, and removal of the resist mask (also referred to as resist stripping) are preferably performed successively using one dry etching apparatus. By performing these steps successively, the process can be simplified. Note that a step of removing a material attached to the inner wall of the chamber of the dry etching apparatus (what is called a chamber cleaning step) may be performed between the anisotropic etching and the resist stripping.

Figure 9A:
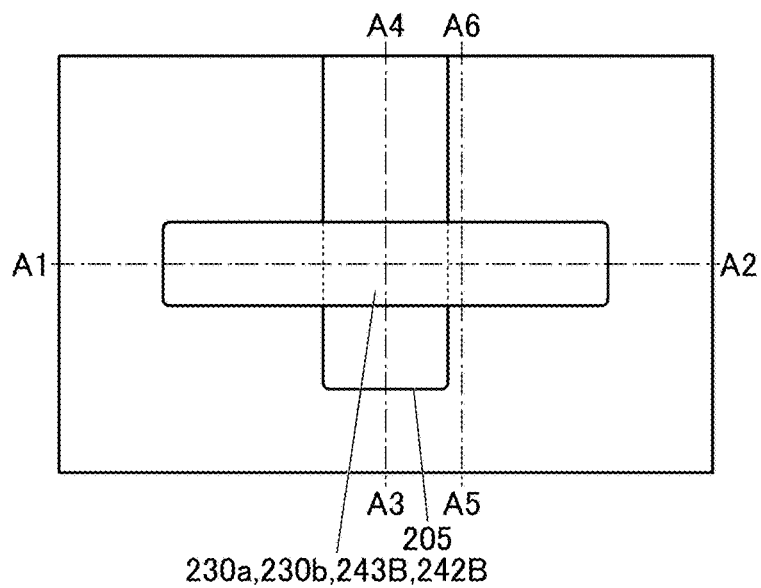
FIG. 9A is a top view illustrating the method for manufacturing the semiconductor device of one embodiment of the present invention.
Figure 9C:
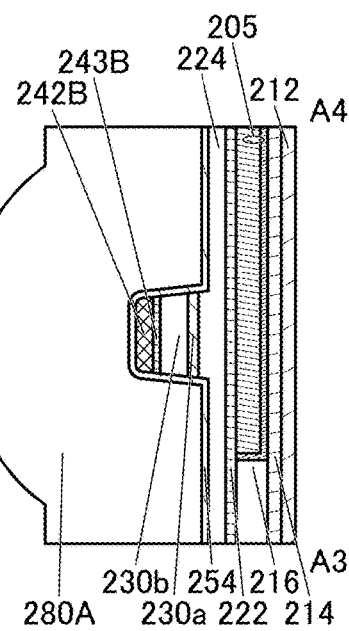
FIG. 9B to FIG. 9D are cross-sectional views illustrating the method for manufacturing the semiconductor device of one embodiment of the present invention.
Figure 9B:
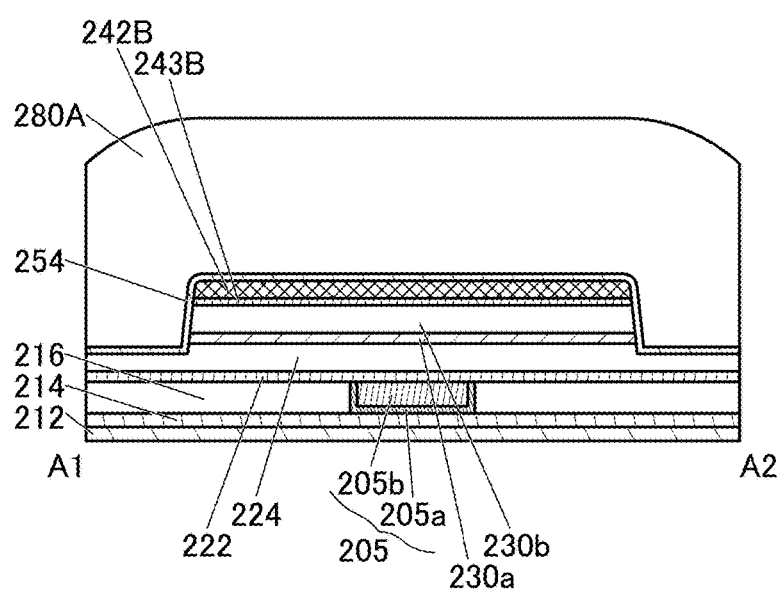
Figure 9D:
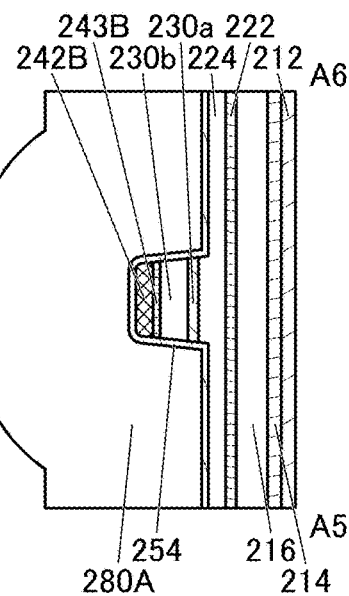
Figure 10A:
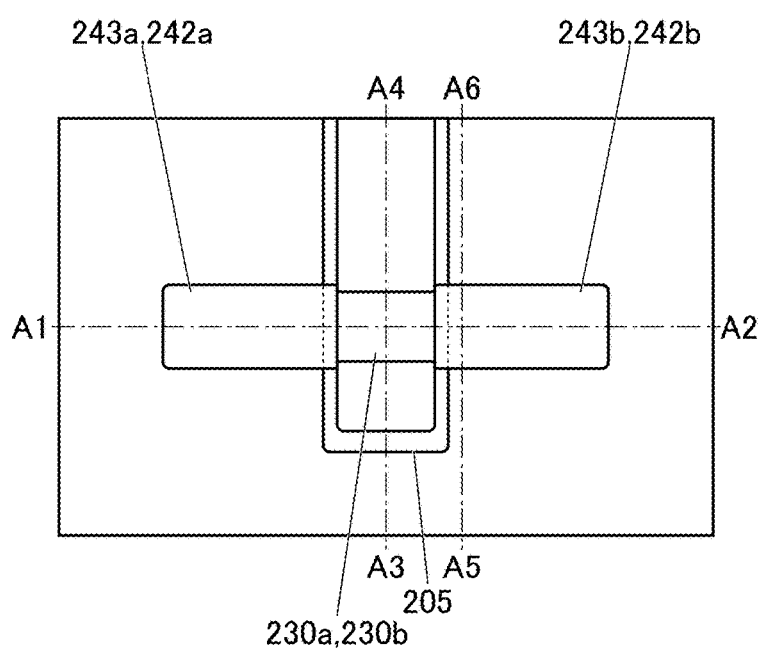
FIG. 10A is a top view illustrating the method for manufacturing the semiconductor device of one embodiment of the present invention.
Figure 10C:
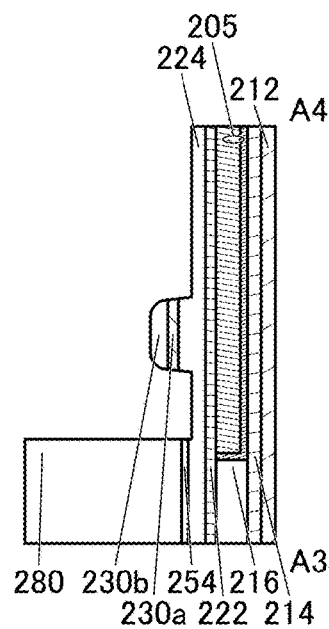
FIG. 10B to FIG. 10D are cross-sectional views illustrating the method for manufacturing the semiconductor device of one embodiment of the present invention.
Figure 10B:
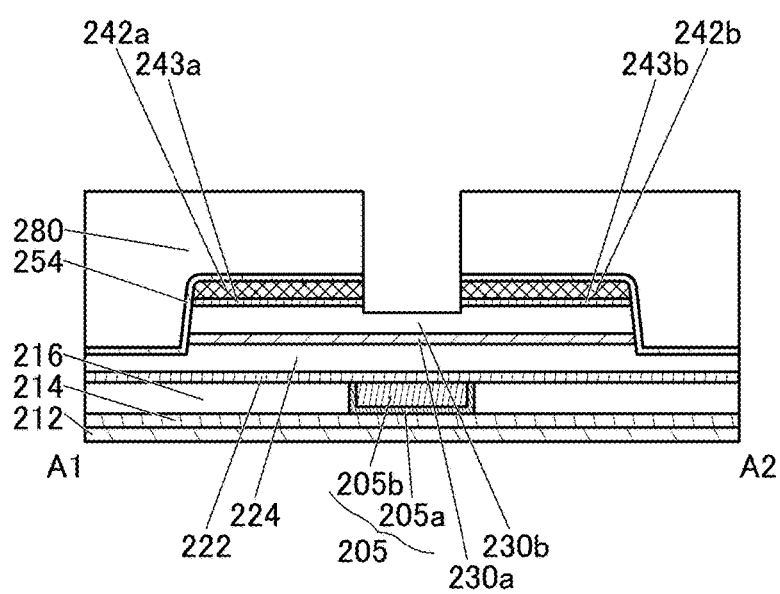
Figure 10D:
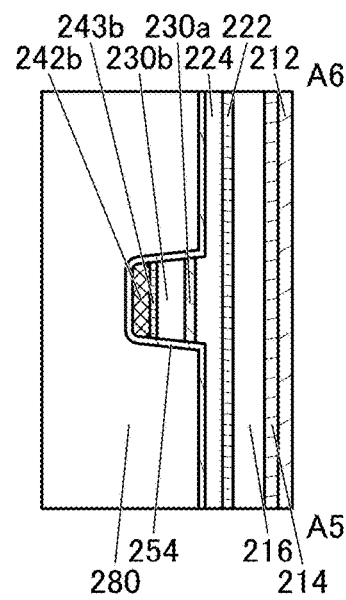
Figure 11A:
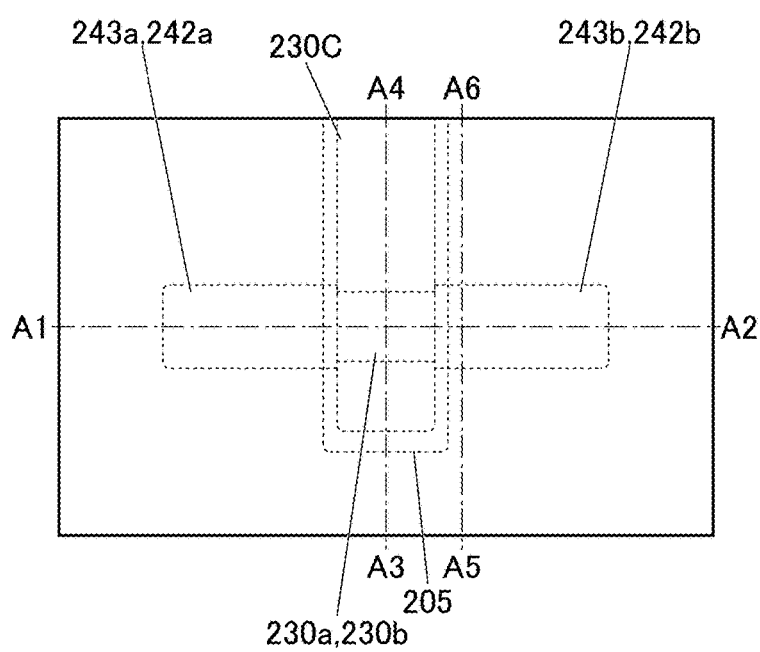
FIG. 11A is a top view illustrating the method for manufacturing the semiconductor device of one embodiment of the present invention.
Figure 11C:
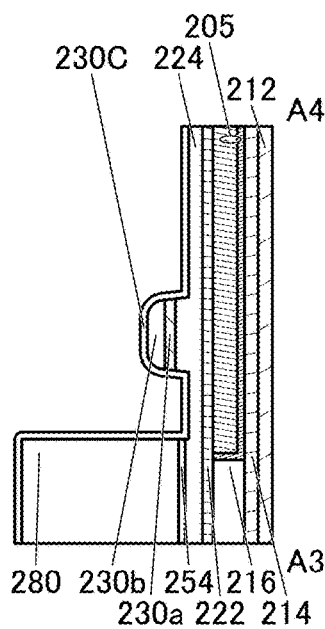
FIG. 11B to FIG. 11D are cross-sectional views illustrating the method for manufacturing the semiconductor device of one embodiment of the present invention.
Figure 11B:
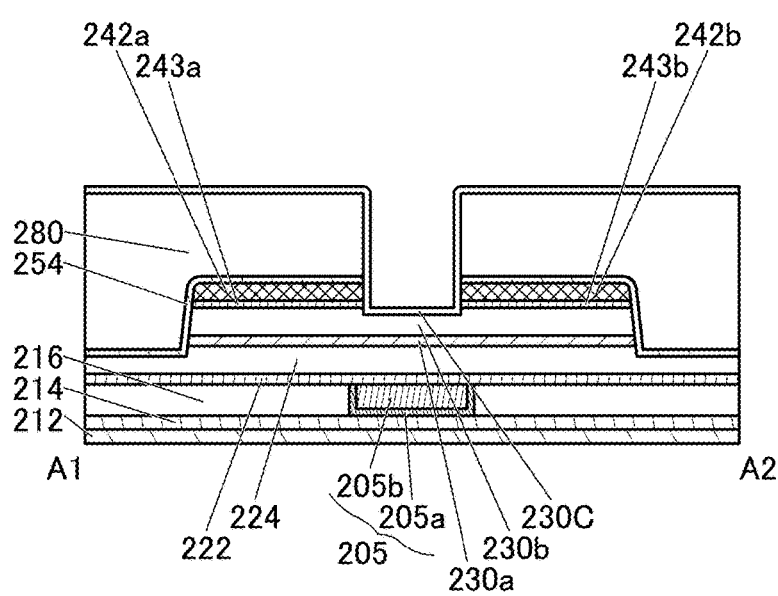
Figure 11D:
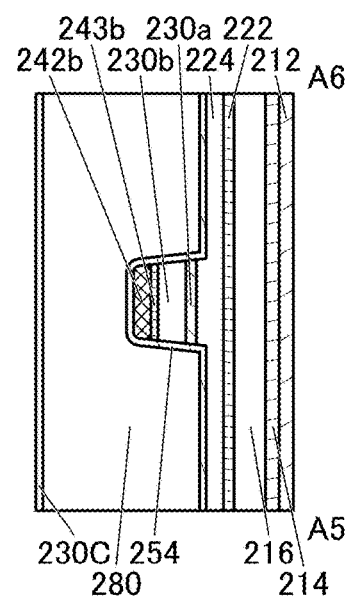

Next, the insulator 254 and an insulating film 280A are formed in this order over the insulator 224 and the conductive layer 242B (see FIG. 9B to FIG. 9D). Note that it is preferable that the insulator 254 and the insulating film 280A be formed successively without being exposed to the atmospheric environment. The successive formation can prevent impurities or moisture from the atmospheric environment from being attached onto the insulator 254 and allows the interface between the insulator 254 and the insulating film 280A and its vicinity to be kept clean. Moreover, the process can be simplified.

The insulator 254 and insulating film 280A can each be formed by a sputtering method, a CVD method, an MBE method, a PLD method, an ALD method, or the like.

In this embodiment, for the insulator 254, aluminum oxide is deposited by a sputtering method. The insulator 254 is formed by a sputtering method in an oxygen-containing atmosphere, whereby oxygen can be added to the insulator 224 during the deposition.

In this embodiment, a silicon oxide film is formed as the insulating film 280A by a sputtering method. This reduces the hydrogen concentration of the insulating film 280A.

Next, the insulating film 280A is subjected to CMP treatment, so that the insulator 280 having a flat top surface is formed. Alternatively, aluminum oxide may be deposited over the insulating film 280A by a sputtering method, for example, and CMP treatment may be performed until the insulator 280 having a flat top surface is formed. In that case, the insulator 254, the insulating film 280A, and the aluminum oxide are preferably deposited successively without being exposed to the atmospheric environment. Accordingly, impurities or moisture from the atmospheric environment can be prevented from being attached onto the insulating film 280A, and a reduction in the amount of oxygen added to the insulating film 280A during the deposition of the aluminum oxide can be suppressed.

Here, microwave treatment may be performed. The microwave treatment is preferably performed in an atmosphere containing oxygen under reduced pressure. By performing the microwave treatment, an electric field by a microwave can be supplied to the insulator 280, the oxide 230b, the oxide 230a, and the like to divide $V_OH$ in the oxide 230b and the oxide 230a into oxygen vacancies and hydrogen. Part of hydrogen divided at this time is bonded to oxygen contained in the insulator 280 and is removed as water molecules in some cases. Some hydrogen is gettered by the conductor 242a and the conductor 242b through the insulator 254 in some cases.

After the microwave treatment, heat treatment may be performed with the reduced pressure being maintained. Such treatment enables hydrogen in the insulator 280, the oxide 230b, and the oxide 230a to be removed efficiently. Note that the temperature of the heat treatment is preferably higher than or equal to 300° C. and lower than or equal to 500° C.

Performing the microwave treatment improves the film quality of the insulator 280, thereby inhibiting diffusion of hydrogen, water, impurities, and the like. Accordingly, hydrogen, water, impurities, and the like can be inhibited from diffusing into the oxide 230 through the insulator 280 by a later step after the formation of the insulator 280, heat treatment, or the like.

Then, part of the insulator 280, part of the insulator 254, part of the conductive layer 242B, and part of the oxide layer 243B are processed to form an opening reaching the oxide 230b. The opening is preferably formed to overlap the conductor 205. The conductor 242a, the conductor 242b, the oxide 243a, and the oxide 243b are formed by the formation of the opening (see FIG. 10A to FIG. 10D).

An upper portion of the oxide 230b is removed when the opening is formed. When part of the oxide 230b is removed, a groove portion is formed in the oxide 230b. The groove portion may be formed in the step of forming the opening or in a step different from the step of forming the opening in accordance with the depth of the groove portion.

The part of the insulator 280, the part of the insulator 254, the part of the conductive layer 242B, the part of the oxide layer 243B, and the part of the oxide 230b can be processed with a dry etching method or a wet etching method. The processing may be performed under different conditions. For example, part of the insulator 280 may be processed by a dry etching method, part of the insulator 254 may be processed by a wet etching method, and part of the oxide layer 243B, part of the conductive layer 242B, and part of the oxide 230b may be processed by a dry etching method. Processing of part of the oxide layer 243B and part of the conductive layer 242B and processing of part of the oxide 230b may be performed under different conditions.

When the oxide 230b is partly removed to form a groove portion with a dry etching method, a strong bias power is preferably applied. A bias power density is, for example, preferably more than or equal to 0.03 W/cm², further preferably more than or equal to 0.06 W/cm². The dry etching treatment time is set as appropriate depending on the depth of the groove portion.

When the opening is formed, the surface of the oxide 230b at the bottom portion of the opening is sometimes damaged. In the damaged region of the oxide 230b, crystal defects such as oxygen vacancies may be formed and impurities (hydrogen, nitrogen, silicon, and a metal element such as aluminum) may exist. In the damaged region, oxygen vacancies and impurities such as hydrogen are likely to exist; thus, the reaction, $V_O+H \rightarrow V_OH$, is likely to occur. Accordingly, a large amount of $V_OH$ is formed in the damaged region. Thus, when the damaged region of the oxide 230b is left and the oxide 230c is formed thereover, the transistor is likely to have normally on characteristics. Furthermore, in-plane variations in damaged regions lead to variations in characteristics of semiconductor devices including the transistors.

Here, it is preferable to remove impurities that are attached onto the surfaces of the oxide 230a, the oxide 230b, and the like or diffused into the oxide 230a, the oxide 230b, and the like. It is also preferable to remove the damaged region that is formed on the surface of the oxide 230b by the dry etching. The impurities result from components contained in the insulator 280, the insulator 254, and the conductive layer 242B; components contained in a member of an apparatus used to form the opening; and components contained in a gas or a liquid used for etching, for instance. Examples of the impurities include aluminum, silicon, tantalum, fluorine, and chlorine.

In order to remove the damaged region, the impurities, and the like, cleaning treatment is performed. Examples of the cleaning method include wet cleaning using a cleaning solution and the like, plasma treatment using plasma, and cleaning by heat treatment, and any of these cleaning methods may be performed in appropriate combination. The cleaning treatment sometimes makes the groove portion deeper.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which commercial hydrofluoric acid is diluted with pure water is referred to as diluted hydrofluoric acid, and an aqueous solution in which commercial ammonia water is diluted with pure water is referred to as diluted ammonia water. The concentration, temperature, and the like of the aqueous solution are adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid is higher than or equal to 0.01 ppm and lower than or equal to 100 ppm, preferably higher than or equal to 0.1 ppm and lower than or equal to 10 ppm.

A frequency greater than or equal to 200 kHz, preferably greater than or equal to 900 kHz is used for the ultrasonic cleaning. Damage to the oxide 230b and the like can be reduced with this frequency.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning using diluted hydrofluoric acid is performed and then, wet cleaning using pure water or carbonated water is performed. The cleaning treatment can remove impurities that are attached onto the surfaces of the oxide 230a, the oxide 230b, and the like or diffused into the oxide 230a, the oxide 230b, and the like. Furthermore, the crystallinity of the oxide 230c formed over the oxide 230b can be increased.

By the processing such as dry etching or the cleaning treatment, the thickness of the insulator 224 in a region that is overlapped by the opening and is not overlapped by the oxide 230b may become smaller than the thickness of the insulator 224 in a region that is overlapped by the oxide 230b.

After the etching or the cleaning treatment, heat treatment may be performed. The heat treatment is performed at a temperature higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230a and the oxide 230b to reduce oxygen vacancies. Moreover, such heat treatment can improve the crystallinity of the oxide 230b and also improve the crystallinity of the oxide 230c that is formed in the groove portion of the oxide 230b. The heat treatment may be performed under reduced pressure. Alternatively, the heat treatment may be performed in an oxygen atmosphere, and then another heat treatment may be successively performed in a nitrogen atmosphere without exposure to the air.

When the damaged region is removed, the oxide 230c including a CAAC-OS can be formed in the groove portion of the oxide 230b from which the damaged region is removed. The damaged region may be removed by formation of a groove portion in the upper portion of the oxide 230b in the cross-sectional view of the transistor in the channel length direction.

Next, an oxide film 230C is formed (see FIG. 11A to FIG. 11D). Heat treatment may be performed before the oxide film 230C is formed. It is preferable that the heat treatment be performed under a reduced pressure and the oxide film 230C be formed successively without exposure to the air. Preferably, the heat treatment is performed in an atmosphere containing oxygen. Such treatment can remove moisture and hydrogen adsorbed on the surface of the oxide 230b or the like and can reduce the moisture concentration and the hydrogen concentration of the oxide 230a and the oxide 230b. The temperature of the heat treatment is preferably higher than or equal to 100° C. and lower than or equal to 400° C. In this embodiment, the heat treatment is performed at 200° C.

Here, the oxide film 230C is preferably provided in contact with at least the inner wall of the groove portion formed in the oxide 230b, part of the side surface of the oxide 243a, part of the side surface of the oxide 243b, part of the side surface of the conductor 242a, part of the side surface of the conductor 242b, part of the side surface of the insulator 254, and part of the side surface of the insulator 280. The conductor 242a (the conductor 242b) is surrounded by the oxide 243a (the oxide 243b), the insulator 254, and the oxide film 230C; thus, a reduction in the conductivity of the conductor 242a (the conductor 242b) due to the oxidation thereof in the following steps can be inhibited.

In this embodiment, the oxide film 230C is formed by a sputtering method using an oxide target with In:Ga:Zn=4:2:3 [atomic ratio].

Part of oxygen contained in the sputtering gas is sometimes supplied to the oxide 230a and the oxide 230b during the deposition of the oxide film 230C. Moreover, part of oxygen contained in the sputtering gas is sometimes supplied to the insulator 280 during the deposition of the oxide film 230C. Therefore, the proportion of oxygen in the sputtering gas for the oxide film 230C is preferably 70% or higher, further preferably 80% or higher, still further preferably 100%. By forming the oxide film 230C in an atmosphere containing much oxygen, the oxide film 230C is likely to be CAAC-OS.

The oxide film 230C is preferably formed while the substrate is heated. In that case, the substrate temperature is set to higher than or equal to 200° C., so that oxygen vacancies in the oxide film 230C and the oxide 230b can be reduced. The deposition is performed while the substrate is heated, whereby the crystallinity of the oxide film 230C and the oxide 230b can be improved.

Next, a mask is formed over the oxide film 230C with a lithography method. Note that a hard mask or a resist mask may be used as the mask.

Then, part of the oxide film 230C is selectively removed using the mask. Note that part of the oxide film 230C is preferably removed by a wet etching method or the like. In this step, part of the oxide film 230C located between the adjacent transistors 200 in the channel width direction can be removed.

Note that in the region where the part of the oxide film 230C is removed in the above step, a surface of the insulator 224 and a surface of the insulator 280 are exposed. At this time, the thickness of the insulator 224 and the thickness of the insulator 280 in the region are reduced in some cases. In addition, the insulator 224 in the region is removed and a surface of the insulator 222 is exposed in some cases. The step of forming the mask may also serve as the step of removing the part of the oxide film 230C.

Figure 12A:
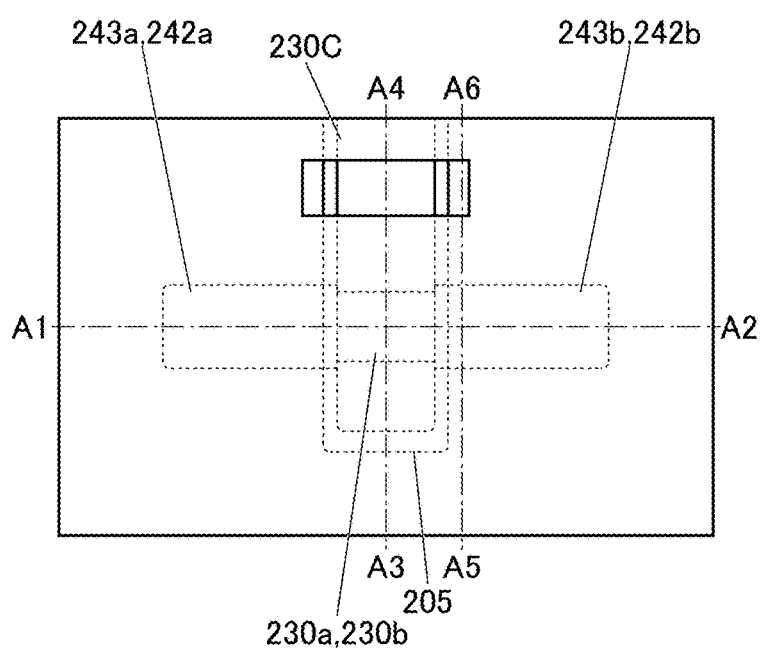
FIG. 12A is a top view illustrating the method for manufacturing the semiconductor device of one embodiment of the present invention.
Figure 12C:
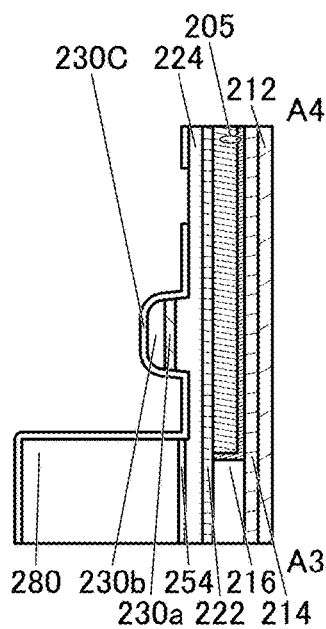
FIG. 12B to FIG. 12D are cross-sectional views illustrating the method for manufacturing the semiconductor device of one embodiment of the present invention.
Figure 12B:
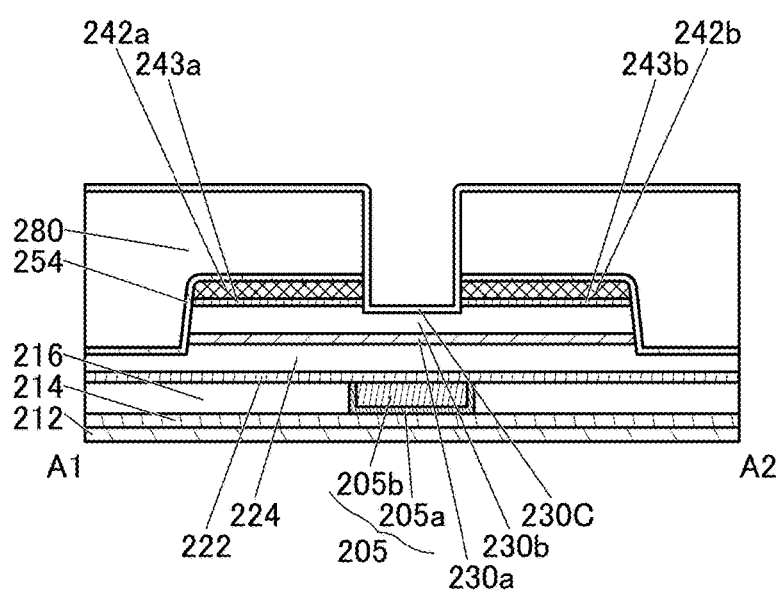
Figure 12D:
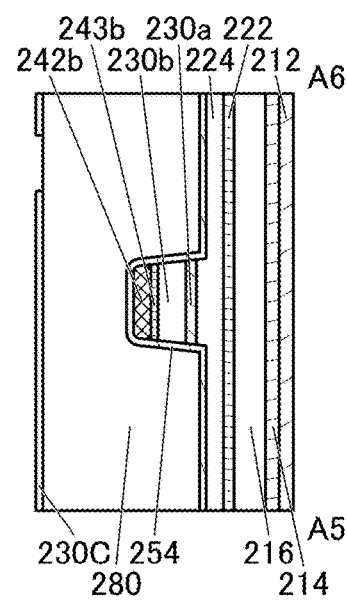
Figure 13A:
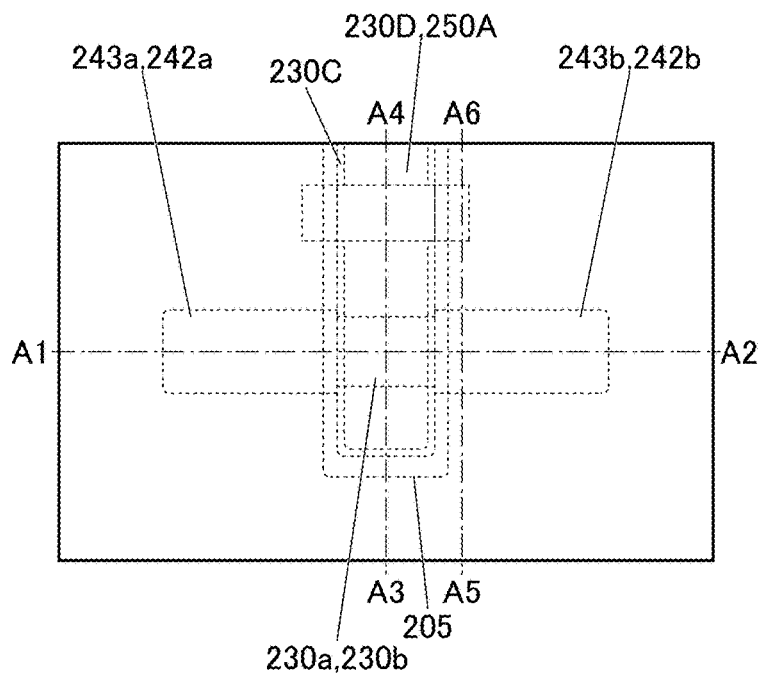
FIG. 13A is a top view illustrating the method for manufacturing the semiconductor device of one embodiment of the present invention.
Figure 13C:
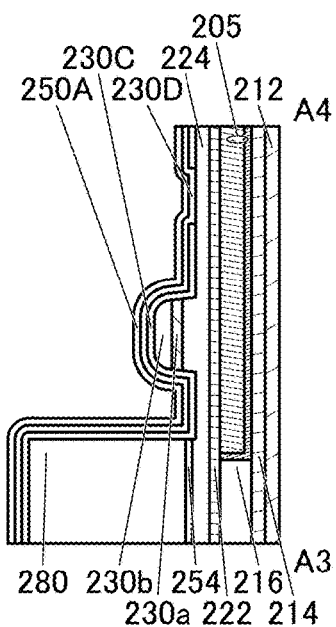
FIG. 13B to FIG. 13D are cross-sectional views illustrating the method for manufacturing the semiconductor device of one embodiment of the present invention.
Figure 13B:
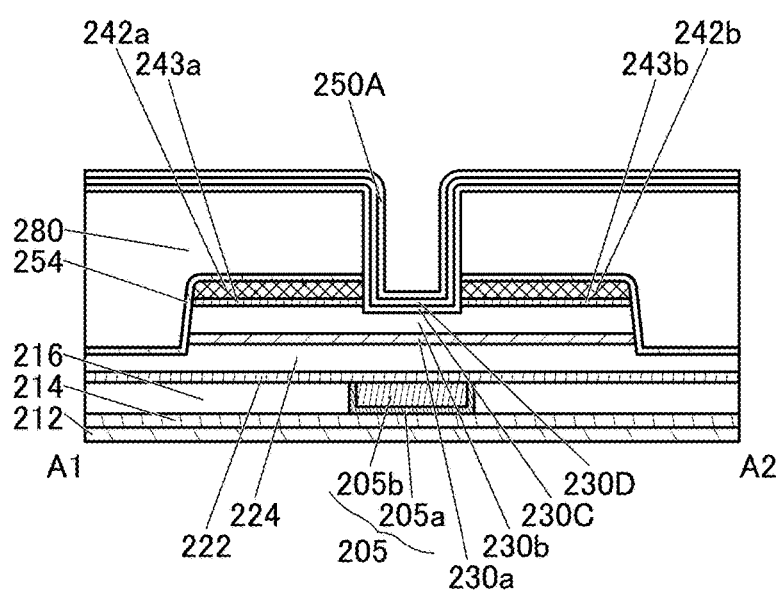
Figure 13D:
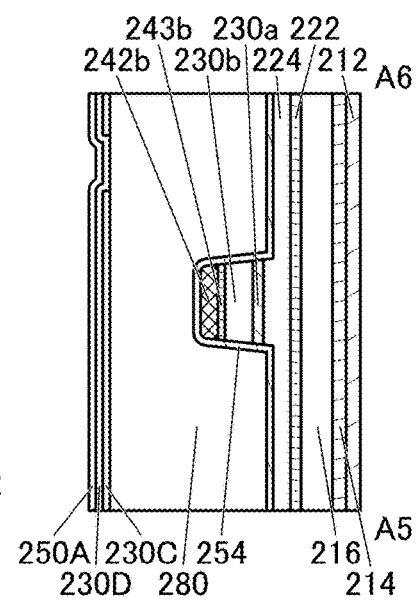
Figure 14A:
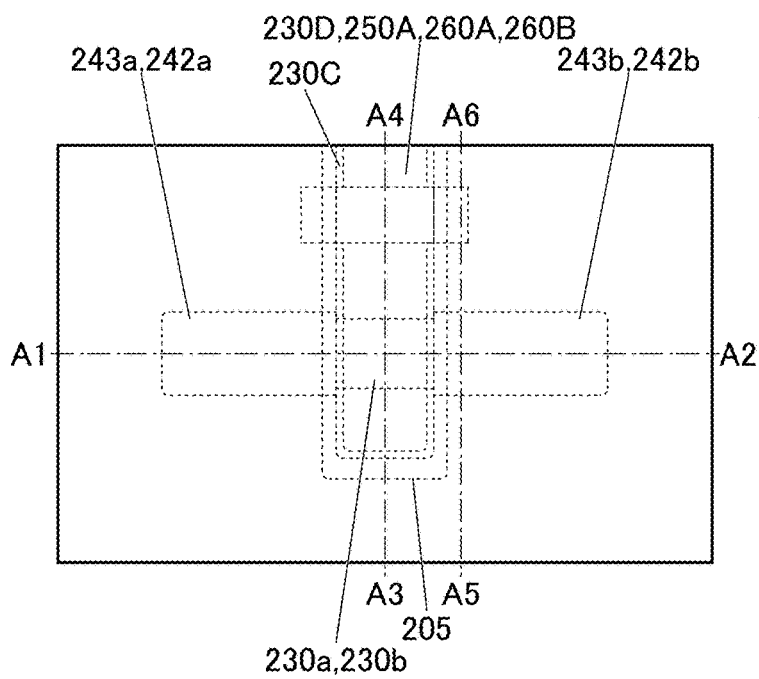
FIG. 14A is a top view illustrating the method for manufacturing the semiconductor device of one embodiment of the present invention.
Figure 14C:
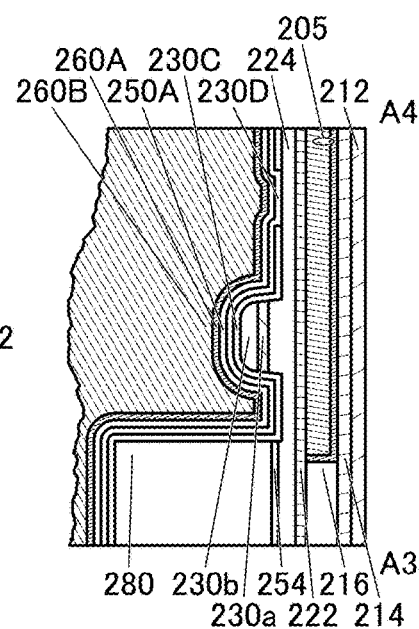
FIG. 14B to FIG. 14D are cross-sectional views illustrating the method for manufacturing the semiconductor device of one embodiment of the present invention.
Figure 14B:
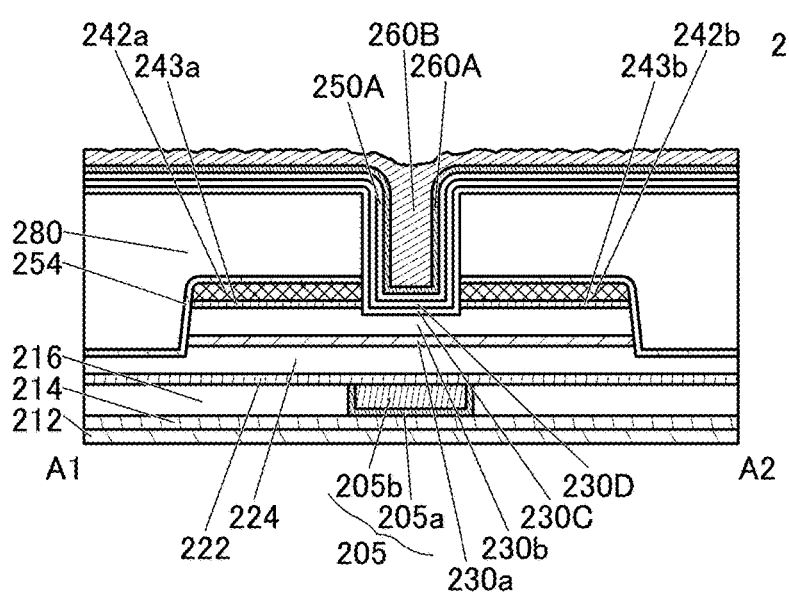
Figure 14D:
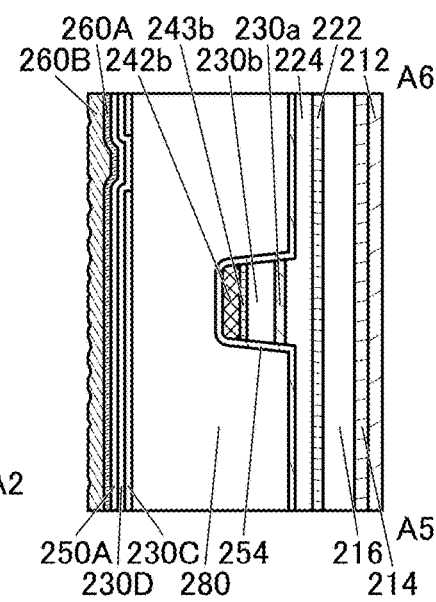
Figure 15A:
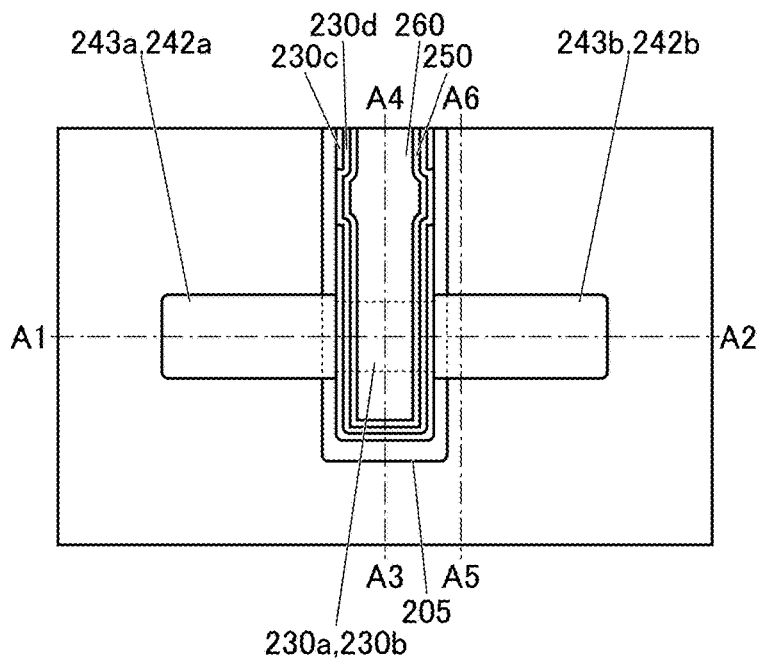
FIG. 15A is a top view illustrating the method for manufacturing the semiconductor device of one embodiment of the present invention.
Figure 15C:
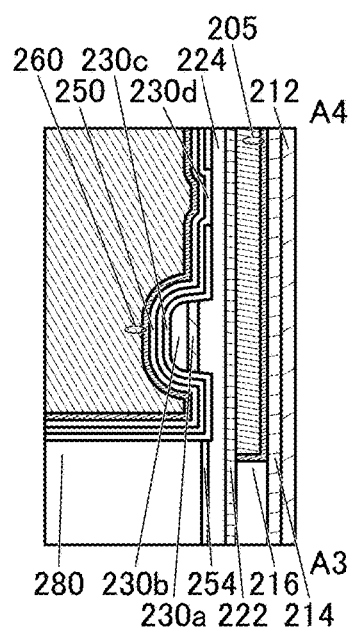
FIG. 15B to FIG. 15D are cross-sectional views illustrating the method for manufacturing the semiconductor device of one embodiment of the present invention.
Figure 15B:
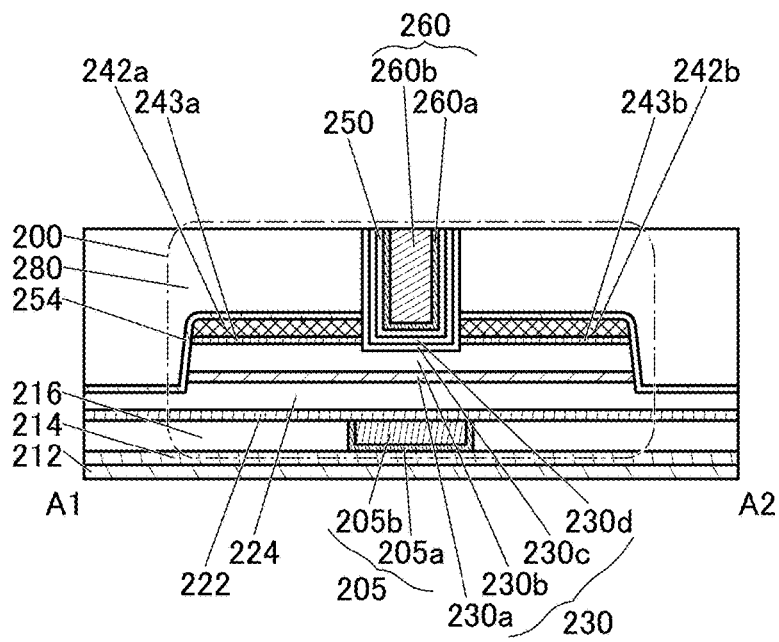
Figure 15D:
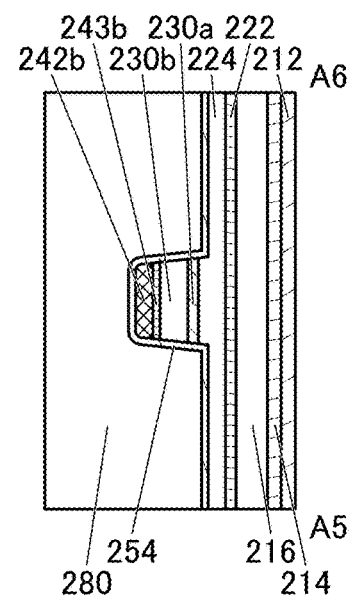

Subsequently, the mask is removed (see FIG. 12A, FIG. 12C, and FIG. 12D). The mask is preferably removed by an etching method or the like.

Next, an oxide film 230D is formed (see FIG. 13A to FIG. 13D). In this embodiment, the oxide film 230D is formed by a sputtering method using an oxide target with In:Ga:Zn=1:3:4 [atomic ratio].

Part of oxygen contained in the sputtering gas is sometimes supplied to the oxide film 230C during the formation of the oxide film 230D. Moreover, part of oxygen contained in the sputtering gas is sometimes supplied to the insulator 280 during the formation of the oxide film 230D. Therefore, the proportion of oxygen contained in the sputtering gas for the oxide film 230D is preferably higher than or equal to 70%, further preferably higher than or equal to 80%, still further preferably 100%.

Next, an insulating film 250A is formed (see FIG. 13A to FIG. 13D). Heat treatment may be performed before the formation of the insulating film 250A; the heat treatment may be performed under reduced pressure, and the insulating film 250A may be successively formed without exposure to the air. Preferably, the heat treatment is performed in an atmosphere containing oxygen. Such processing can remove moisture and hydrogen adsorbed onto the surface of the oxide film 230D and the like, and can also reduce the moisture concentration and the hydrogen concentration in the oxide 230a, the oxide 230b, the oxide film 230C, and the oxide film 230D. The temperature of the heat treatment is preferably higher than or equal to 100° C. and lower than or equal to 400° C.

The insulating film 250A can be formed with a sputtering method, a CVD method, an MBE method, a PLD method, an ALD method, or the like. The insulating film 250A is preferably formed with a deposition method using a gas in which hydrogen atoms are reduced or removed. This reduces the hydrogen concentration of the insulating film 250A. The hydrogen concentration is preferably reduced because the insulating film 250A becomes the insulator 250 that is in contact with the oxide 230d in a later step.

Note that in the case where the insulator 250 has a stacked-layer structure of two layers, the insulating film to be the lower layer of the insulator 250 and the insulating film to be the upper layer of the insulator 250 are preferably formed successively without being exposed to the atmospheric environment. When formation without exposure to the atmosphere is performed, attachment of impurities or moisture from the atmospheric environment onto the insulating film to be the lower layer of the insulator 250 can be prevented, whereby the vicinity of the interface between the insulating film to be the lower layer of the insulator 250 and the insulating film to be the upper layer of the insulator 250 can be kept clean.

Here, after the insulating film 250A is formed, microwave treatment may be performed in an atmosphere containing oxygen under reduced pressure. By performing the microwave treatment, an electric field from microwaves is supplied to the insulating film 250A, the oxide film 230D, the oxide film 230C, the oxide 230b, the oxide 230a, and the like; hence, $V_OH$ in the oxide film 230D, the oxide film 230C, the oxide 230b, and the oxide 230a can be divided into $V_O$ and hydrogen. Part of hydrogen divided at this time is bonded to oxygen and is removed as $H_2O$ from the insulating film 250A, the oxide film 230D, the oxide film 230C, the oxide 230b, and the oxide 230a in some cases. Part of hydrogen is sometimes gettered by the conductor 242a and the conductor 242b. Performing the microwave treatment in such a manner can reduce the hydrogen concentration in the insulating film 250A, the oxide film 230D, the oxide film 230C, the oxide 230b, and the oxide 230a. Furthermore, oxygen is supplied to $V_O$ that can exist after $V_OH$ in the oxide 230a, the oxide 230b, the oxide film 230C, and the oxide film 230D is divided into $V_O$ and hydrogen, so that $V_O$ can be repaired or filled.

After the microwave treatment, heat treatment may be performed with the reduced pressure being maintained. Such treatment can remove hydrogen in the insulating film 250A, the oxide film 230D, the oxide film 230C, the oxide 230b, and the oxide 230a efficiently. Part of hydrogen is sometimes gettered by the conductor 242a and the conductor 242b. Alternatively, it is possible to repeat the step of performing microwave treatment and the step of performing heat treatment with the reduced pressure being maintained after the microwave treatment. Repetitions of the heat treatment can remove hydrogen in the insulating film 250A, the oxide film 230D, the oxide film 230C, the oxide 230b, and the oxide 230a more efficiently. Note that the temperature of the heat treatment is preferably higher than or equal to 300° C. and lower than or equal to 500° C.

Furthermore, the microwave treatment improves the film quality of the insulating film 250A, thereby inhibiting diffusion of hydrogen, water, impurities, and the like. Accordingly, hydrogen, water, impurities, and the like can be inhibited from being diffused into the oxide 230b, the oxide 230a, and the like through the insulator 250 by a later step such as formation of a conductive film to be the conductor 260 or later treatment such as heat treatment.

Next, a conductive film 260A and a conductive film 260B are formed in this order (see FIG. 14A to FIG. 14D). The conductive film 260A and the conductive film 260B can be formed by a sputtering method, a CVD method, an MBE method, a PLD method, an ALD method, or the like. In this embodiment, the conductive film 260A is formed by an ALD method, and the conductive film 260B is formed by a CVD method.

Then, the oxide film 230C, the oxide film 230D, the insulating film 250A, the conductive film 260A, and the conductive film 260B are polished by CMP treatment until the insulator 280 is exposed, whereby the oxide 230c, the oxide 230d, the insulator 250, and the conductor 260 (the conductor 260a and the conductor 260b) are formed (see FIG. 15A to FIG. 15D). Accordingly, the oxide 230c is positioned to partly cover the inner walls (the side walls and the bottom surfaces) of the opening reaching the oxide 230b and the groove portion of the oxide 230b. The oxide 230d is positioned to cover the inner walls of the opening and the groove portion with the oxide 230c therebetween. The insulator 250 is positioned to cover the inner walls of the opening and the groove portion with the oxide 230c and the oxide 230d therebetween. The conductor 260 is positioned to fill the opening and the groove portion with the oxide 230c, the oxide 230d, and the insulator 250 therebetween.

Subsequently, heat treatment may be performed. In this embodiment, treatment is performed at 400° C. in a nitrogen atmosphere for one hour. The heat treatment can reduce the moisture concentration and the hydrogen concentration in the insulator 250 and the insulator 280. After the heat treatment, the insulator 282 may be successively deposited without exposure to the air.

Figure 16A:
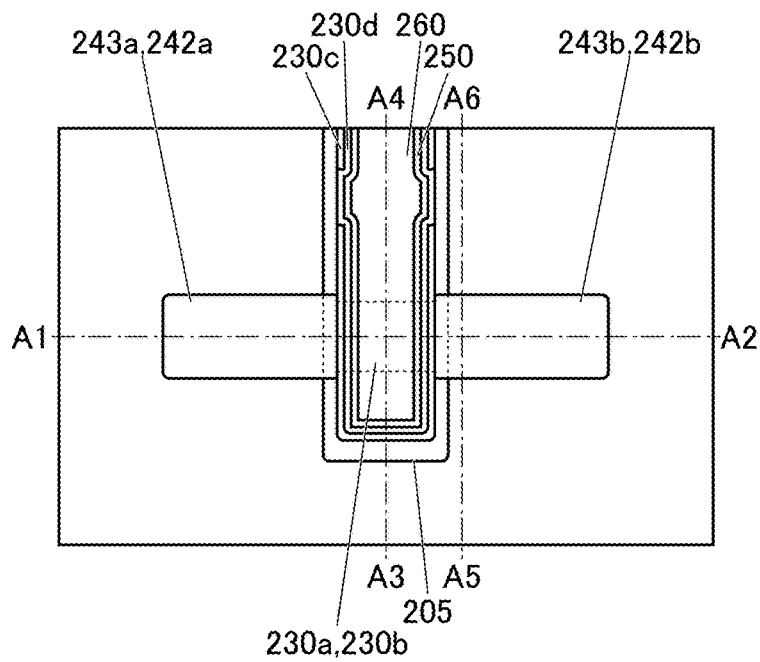
FIG. 16A is a top view illustrating the method for manufacturing the semiconductor device of one embodiment of the present invention.
Figure 16C:
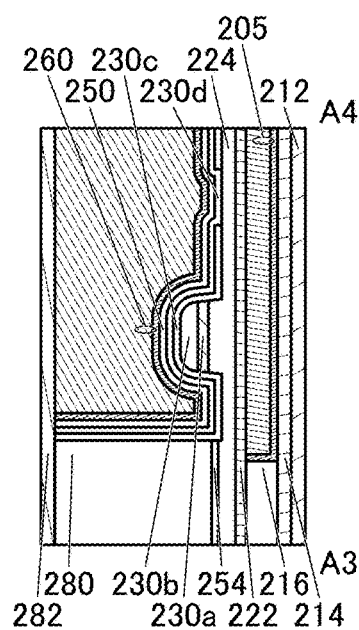
FIG. 16B to FIG. 16D are cross-sectional views illustrating the method for manufacturing the semiconductor device of one embodiment of the present invention.
Figure 16B:
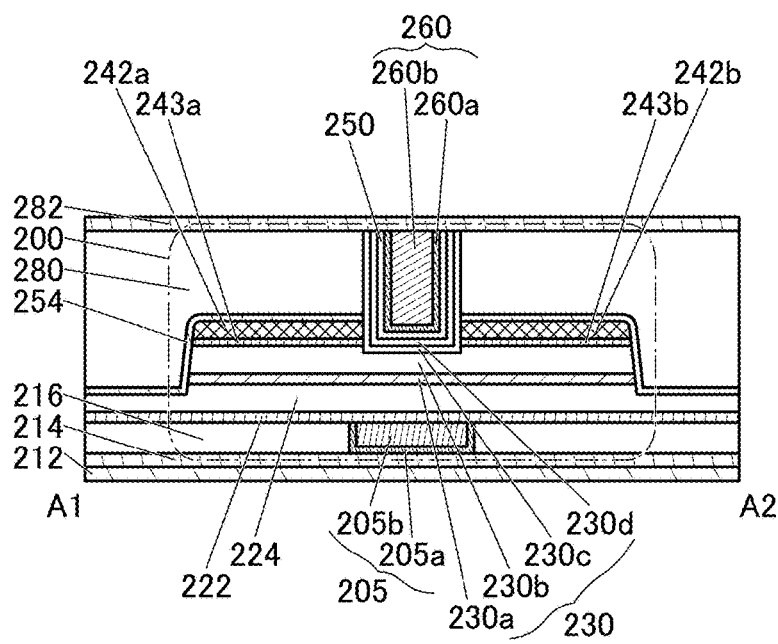
Figure 16D:
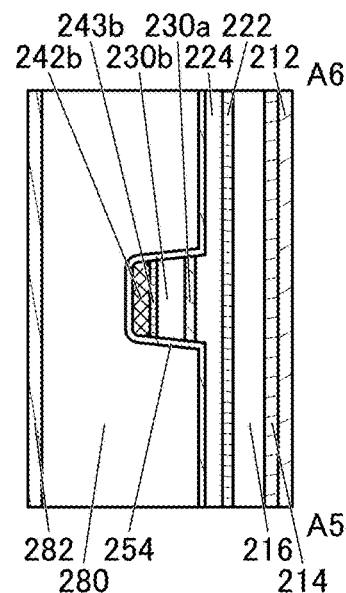
Figure 17A:
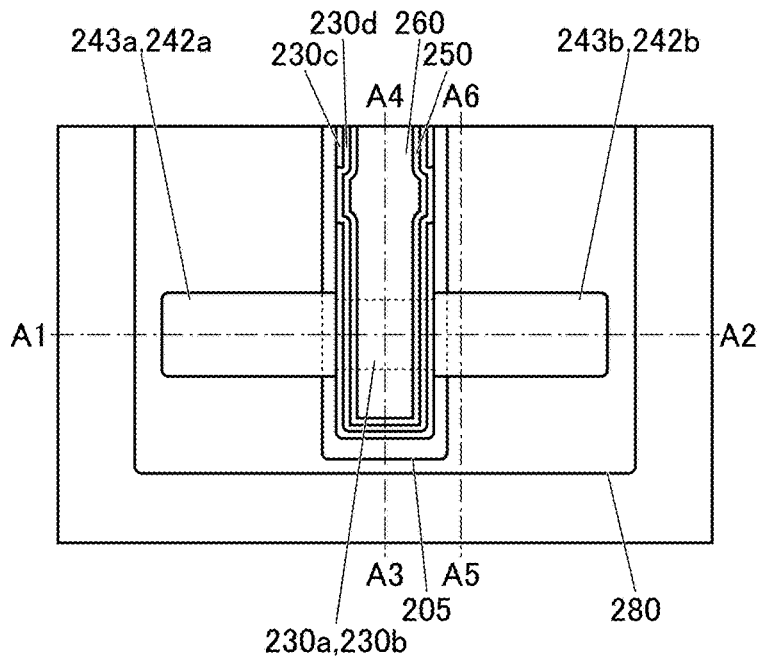
FIG. 17A is a top view illustrating the method for manufacturing the semiconductor device of one embodiment of the present invention.
Figure 17C:
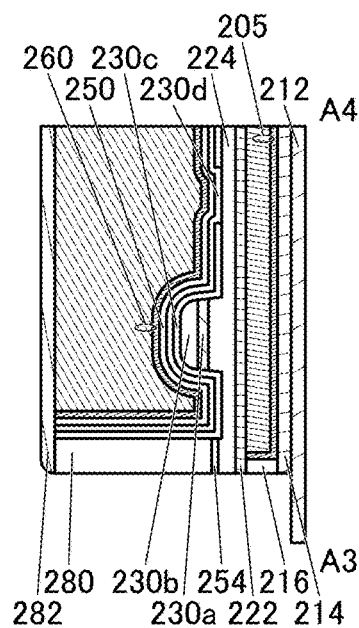
FIG. 17B to FIG. 17D are cross-sectional views illustrating the method for manufacturing the semiconductor device of one embodiment of the present invention.
Figure 17B:
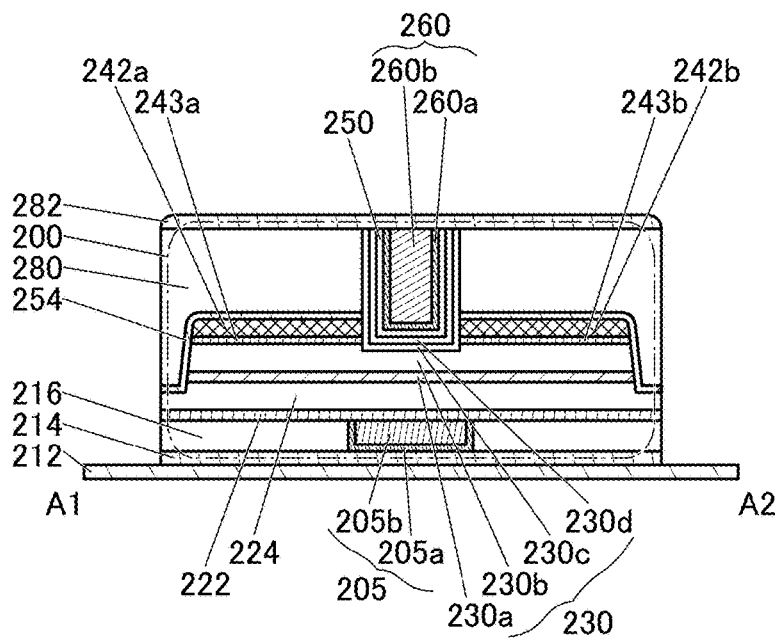
Figure 17D:
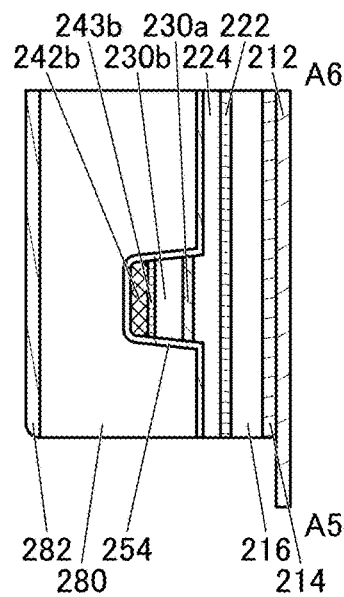

Next, the insulator 282 is formed over the oxide 230c, the oxide 230d, the insulator 250, the conductor 260, and the insulator 280 (see FIG. 16B to FIG. 16D). The insulator 282 can be formed with a sputtering method, a CVD method, an MBE method, a PLD method, an ALD method, or the like. As the insulator 282, aluminum oxide is preferably deposited by a sputtering method, for example. The insulator 282 is formed with a sputtering method in an oxygen-containing atmosphere, whereby oxygen can be added to the insulator 280 during the deposition. At this time, the insulator 282 is preferably formed while the substrate is being heated. When the insulator 282 is formed in contact with the top surface of the conductor 260, oxygen contained in the insulator 280 can be inhibited from being absorbed by the conductor 260 in later heat treatment.

Subsequently, part of the insulator 282, part of the insulator 280, part of the insulator 254, part of the insulator 224, part of the insulator 222, part of the insulator 216, and part of the insulator 214 are processed to form an opening reaching the insulator 212 (see FIG. 17A to FIG. 17D). The opening is formed to surround the transistor 200 in some cases. Alternatively, the opening is sometimes formed to surround a plurality of transistors 200. Part of the side surface of the insulator 282, part of the side surface of the insulator 280, part of the side surface of the insulator 254, part of the side surface of the insulator 224, part of the side surface of the insulator 222, part of the side surface of the insulator 216, and part of the side surface of the insulator 214 are exposed in the opening.

The part of the insulator 282, the part of the insulator 280, the part of the insulator 254, the part of the insulator 224, the part of the insulator 222, the part of the insulator 216, and the part of the insulator 214 can be processed using a dry etching method or a wet etching method. The processing may be performed under different conditions. Note that in this step, the thickness of the insulator 212 in a region overlapped by the opening is reduced in some cases.

Figure 18A:
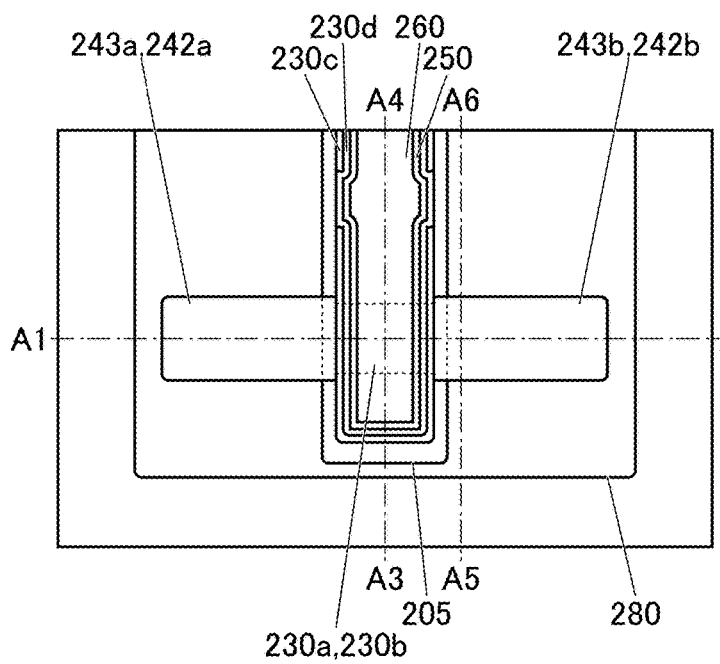
FIG. 18A is a top view illustrating the method for manufacturing the semiconductor device of one embodiment of the present invention.
Figure 18C:
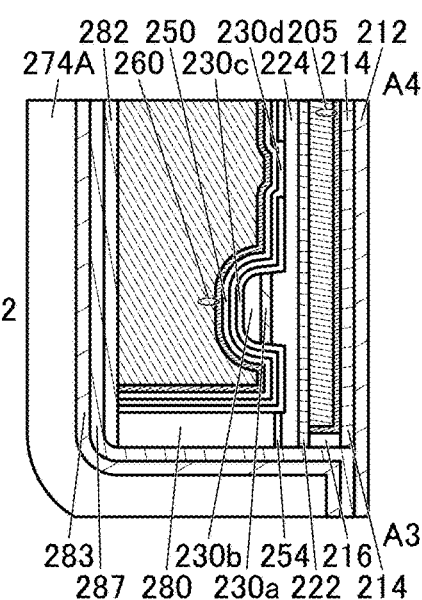
FIG. 18B to FIG. 18D are cross-sectional views illustrating the method for manufacturing the semiconductor device of one embodiment of the present invention.
Figure 18B:
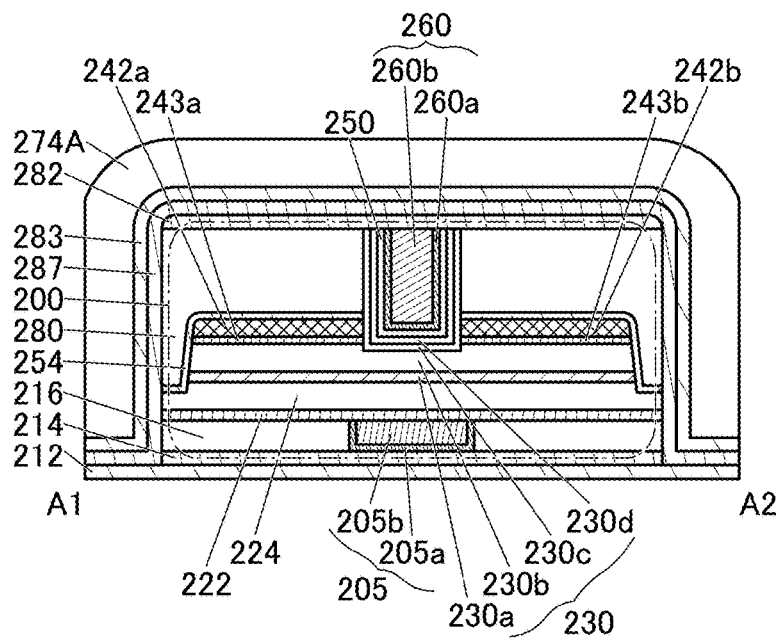
Figure 18D:
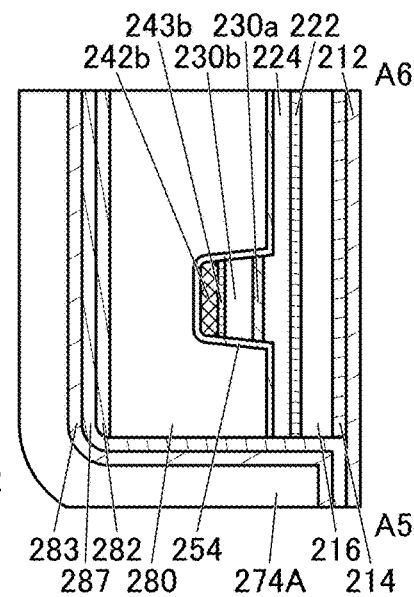

Then, the insulator 287, the insulator 283, and an insulating film 274A are formed in this order to cover the insulator 282, the insulator 280, the insulator 254, the insulator 224, the insulator 222, the insulator 216, and the insulator 214 (see FIG. 18B to FIG. 18D). The insulator 287, the insulator 283, and the insulating film 274A are preferably formed successively without being exposed to the atmospheric environment. The successive formation can prevent attachment of impurities or moisture from the atmospheric environment onto the insulator 287 and the insulator 283, and keep cleanliness of the interface between the insulator 287 and the insulator 283 and its vicinity and the interface between the insulator 283 and the insulating film 274A and its vicinity. Moreover, the process can be simplified.

The insulator 287, the insulator 283, and the insulating film 274A can each be formed by a sputtering method, a CVD method, an MBE method, a PLD method, an ALD method, or the like.

In this embodiment, for the insulator 287, aluminum oxide is deposited by a sputtering method. When the insulator 287 is formed by a sputtering method in an atmosphere containing oxygen, oxygen can be added to the insulator 280 during the deposition.

In this embodiment, silicon nitride is deposited as the insulator 283 by a sputtering method.

As illustrated in FIG. 18B to FIG. 18D, the insulator 287 is in contact with the insulator 212 on the bottom surface of the opening, and the insulator 283 is in contact with the insulator 287. That is, the top surface and side surfaces of the transistor 200 are surrounded by the insulator 287 and the insulator 283, and the bottom surface of the transistor 200 is surrounded by the insulator 212. Surrounding the transistor 200 by the insulator 287, the insulator 283, and the insulator 212 that have high barrier properties can prevent entry of moisture and hydrogen from the outside.

In this embodiment, a silicon oxide film is formed as the insulating film 274A by a sputtering method.

Note that in the case where the insulator 287 is not provided, the insulator 283 and the insulating film 274A are preferably formed successively without being exposed to the atmospheric environment.

Figure 19A:
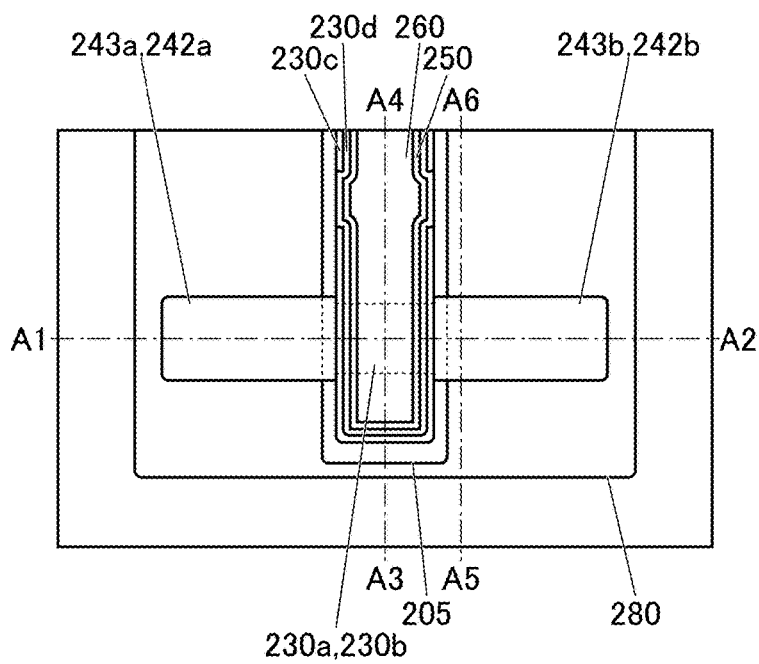
FIG. 19A is a top view illustrating the method for manufacturing the semiconductor device of one embodiment of the present invention.
Figure 19C:
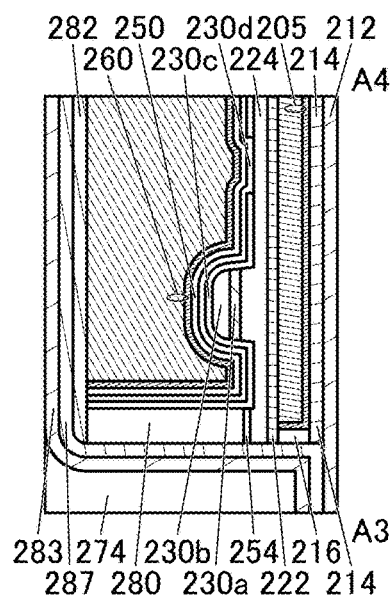
FIG. 19B to FIG. 19D are cross-sectional views illustrating the method for manufacturing the semiconductor device of one embodiment of the present invention.
Figure 19B:
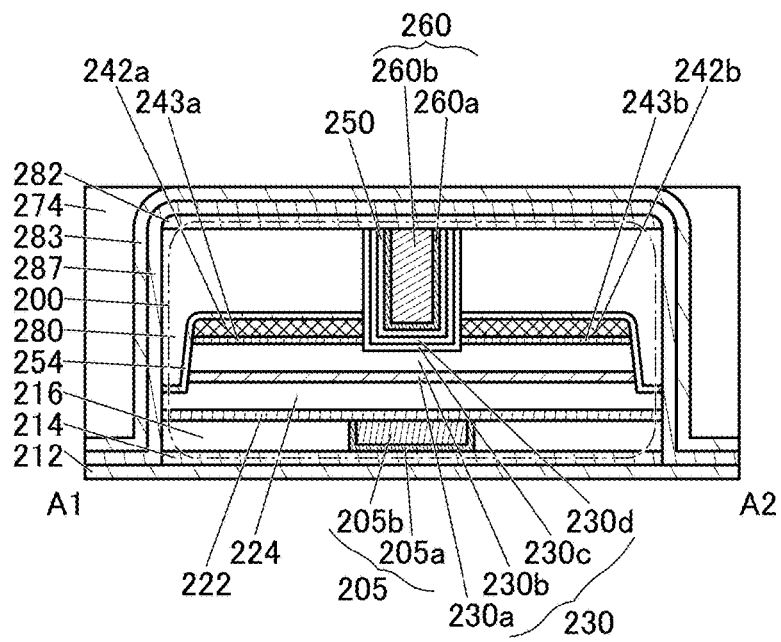
Figure 19D:
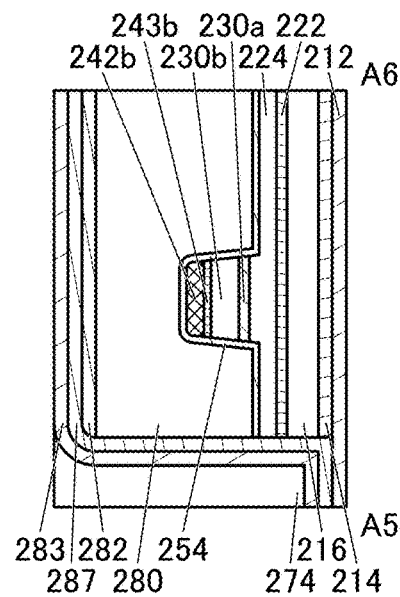

Next, the insulating film 274A is subjected to CMP treatment, whereby the insulator 274 having a flat top surface is formed (see FIG. 19B to FIG. 19D).

Next, heat treatment may be performed. In this embodiment, treatment is performed at 400° C. in a nitrogen atmosphere for one hour. By the heat treatment, oxygen added to the insulator 280 can be supplied to the oxide 230a and the oxide 230b through the oxide 230c. Note that the heat treatment is not necessarily performed after the formation of the insulator 274 and may be performed after the deposition of the insulator 282, for example.

Figure 20A:
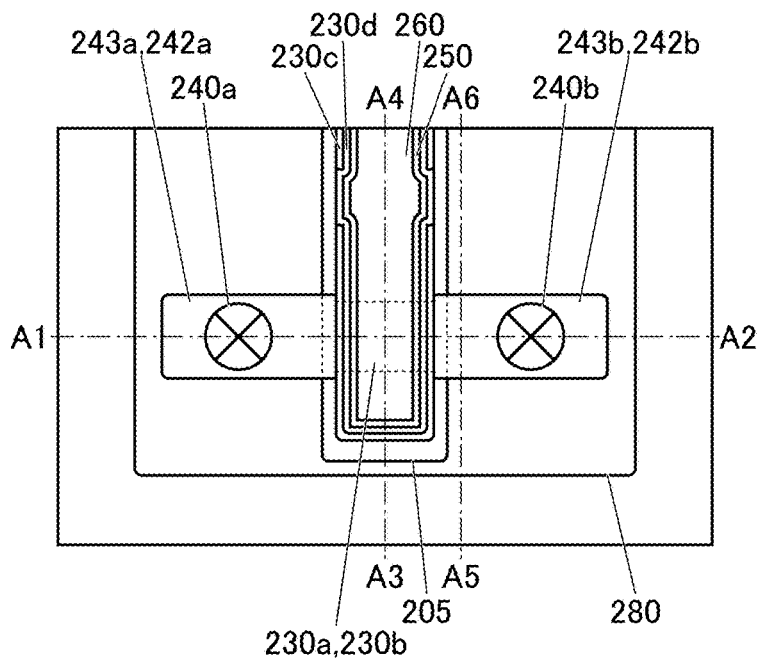
FIG. 20A is a top view illustrating the method for manufacturing the semiconductor device of one embodiment of the present invention.
Figure 20C:
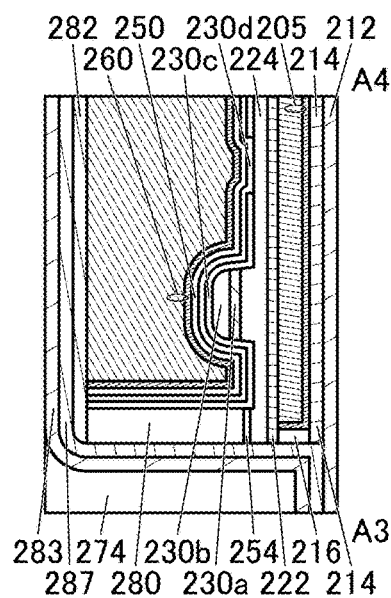
FIG. 20B to FIG. 20D are cross-sectional views illustrating the method for manufacturing the semiconductor device of one embodiment of the present invention.
Figure 20B:
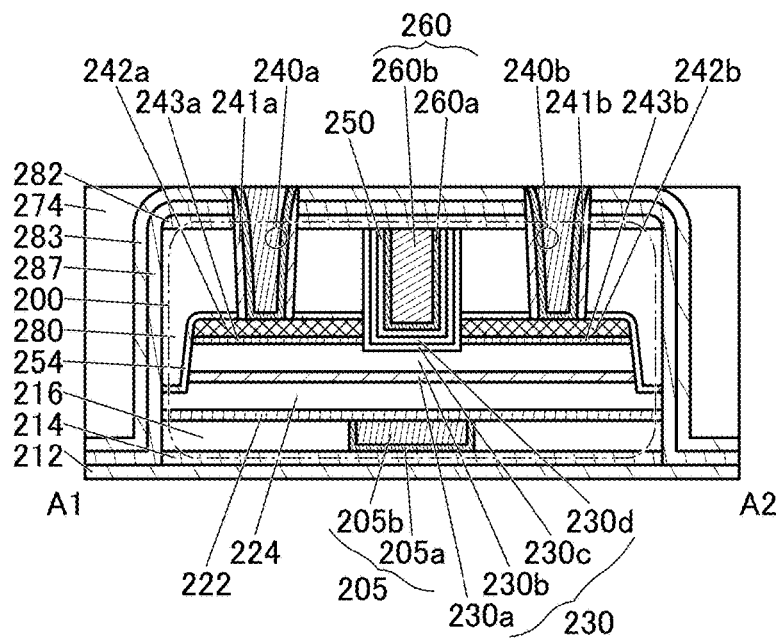
Figure 20D:
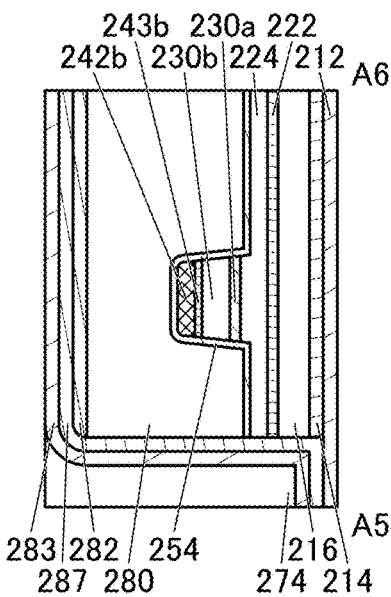
Figure 21A:
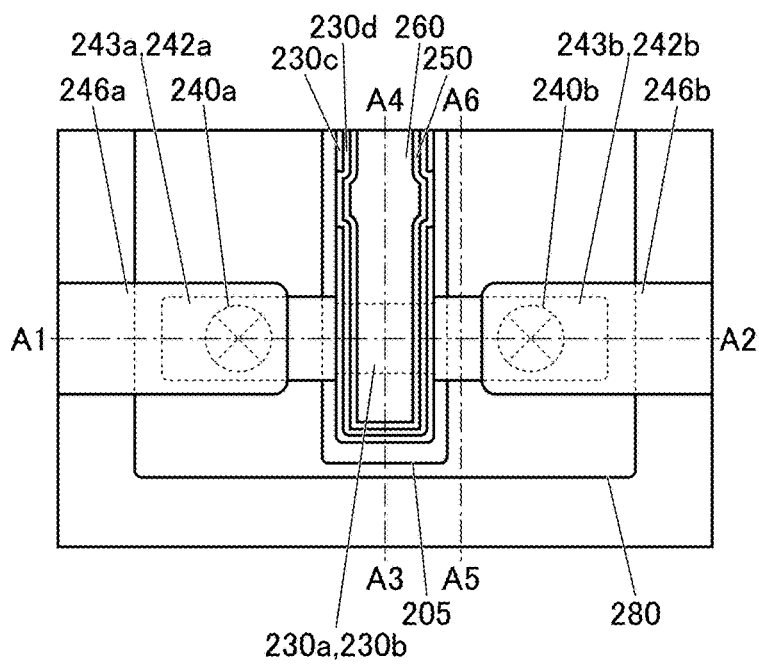
FIG. 21A is a top view illustrating the method for manufacturing the semiconductor device of one embodiment of the present invention.
Figure 21C:
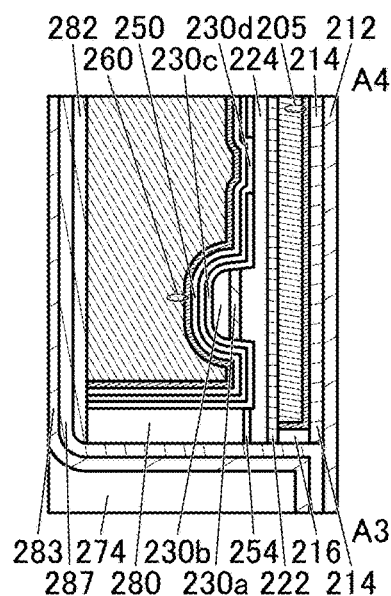
FIG. 21B to FIG. 21D are cross-sectional views illustrating the method for manufacturing the semiconductor device of one embodiment of the present invention.
Figure 21B:
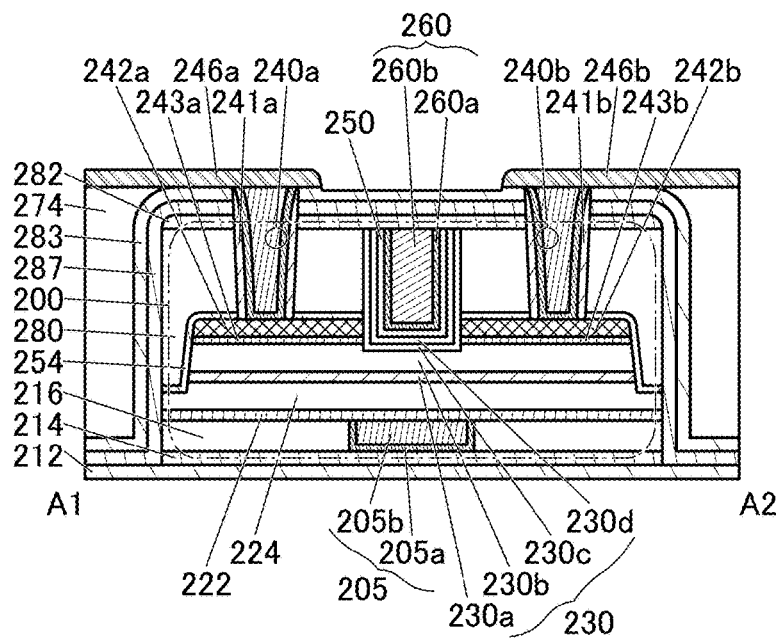
Figure 21D:
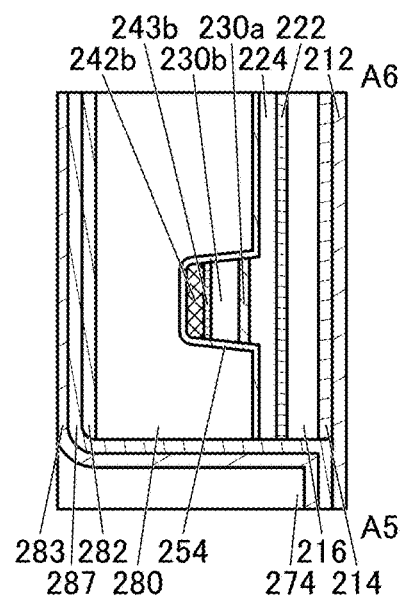

Subsequently, an opening reaching the conductor 242a and an opening reaching the conductor 242b are formed in the insulator 254, the insulator 280, the insulator 282, the insulator 287, and the insulator 283 (see FIG. 20A and FIG. 20B). The openings are formed using a lithography method. Note that the openings in the top view in FIG. 20A have a circular shape; however, the shapes of the openings are not limited thereto. For example, the openings in the top view may have an almost circular shape such as an elliptical shape, a polygonal shape such as a quadrangular shape, or a polygonal shape such as a quadrangular shape with rounded corners.

Subsequently, an insulating film to be the insulator 241a and the insulator 241b is formed and the insulating film is subjected to anisotropic etching, so that the insulator 241a and the insulator 241b are formed (see FIG. 20A and FIG. 20B). The insulating film can be formed by a sputtering method, a CVD method, an MBE method, a PLD method, an ALD method, or the like. As the insulating film, an insulating film having a function of inhibiting passage of oxygen is preferably used. For example, an aluminum oxide film is preferably formed by an ALD method. Alternatively, a silicon nitride film is preferably formed by a PEALD method. Silicon nitride is preferable because it has a high blocking property against hydrogen.

For the anisotropic etching of the insulating film, a dry etching method or the like is employed, for example. Providing the insulator 241a and the insulator 241b on the sidewall portions of the openings can inhibit passage of oxygen from the outside and can prevent oxidation of the conductor 240a and the conductor 240b to be formed next. Furthermore, impurities such as water and hydrogen can be prevented from diffusing from the conductor 240a and the conductor 240b to the outside.

Next, a conductive film to be the conductor 240a and the conductor 240b is formed. The conductive film preferably has a stacked-layer structure including a conductor having a function of inhibiting passage of impurities such as water and hydrogen. For example, a stack of tantalum nitride, titanium nitride, or the like and tungsten, molybdenum, copper, or the like can be employed. The conductive film can be formed by a sputtering method, a CVD method, an MBE method, a PLD method, an ALD method, or the like.

Then, part of the conductive film is removed by CMP treatment, whereby the top surfaces of the insulator 283 and the insulator 274 are exposed. As a result, the conductive film remains only in the openings, so that the conductor 240a and the conductor 240b having flat top surfaces can be formed (see FIG. 20A and FIG. 20B). Note that part of the top surface of the insulator 283 and part of the top surface of the insulator 274 are sometimes removed by the CMP treatment.

Next, a conductive film to be the conductor 246a and the conductor 246b is formed. The conductive film can be formed by a sputtering method, a CVD method, an MBE method, a PLD method, an ALD method, or the like.

Subsequently, the conductive film to be the conductor 246a and the conductor 246b is processed by a lithography method to form the conductor 246a in contact with the top surface of the conductor 240a and the conductor 246b in contact with the top surface of the conductor 240b. At this time, part of the insulator 283 in a region where the conductor 246a and the conductor 246b do not overlap the insulator 283, and part of the insulator 274 in a region where the conductor 246a and the conductor 246b do not overlap the insulator 274 are removed in some cases (see FIG. 21B to FIG. 21D).

Next, the insulator 286 is deposited over the conductor 246a, the conductor 246b, the insulator 274, and the insulator 283 (see FIG. 4A to FIG. 4D). The insulator 286 can be deposited by a sputtering method, a CVD method, an MBE method, a PLD method, an ALD method, or the like. In addition, the insulator 286 may have a multilayer structure. For example, silicon nitride may be deposited with a sputtering method and silicon nitride may be deposited with a CVD method over the silicon nitride.

Through the above process, the semiconductor device including the transistor 200 illustrated in FIG. 4A to FIG. 4D can be manufactured. As illustrated in FIG. 5 to FIG. 21, with the use of the method for manufacturing the semiconductor device described in this embodiment, the transistor 200 can be manufactured.

Note that in the case where a semiconductor device including the transistor 200 illustrated in FIG. 1A to FIG. 1D is manufactured, the semiconductor device is manufactured without performing the step illustrated in FIG. 17A to FIG. 17D, the step of forming the insulator 287 and the insulating film 274A, and the step illustrated in FIG. 19A to FIG. 19D. In this case, it is preferable that the insulator 282 and the insulator 283 be successively deposited without being exposed to the atmospheric environment.

Variation Example 2 of Semiconductor Device

An example of the semiconductor device in this embodiment will be described below with reference to FIG. 22A to FIG. 22D.

Figure 22A:
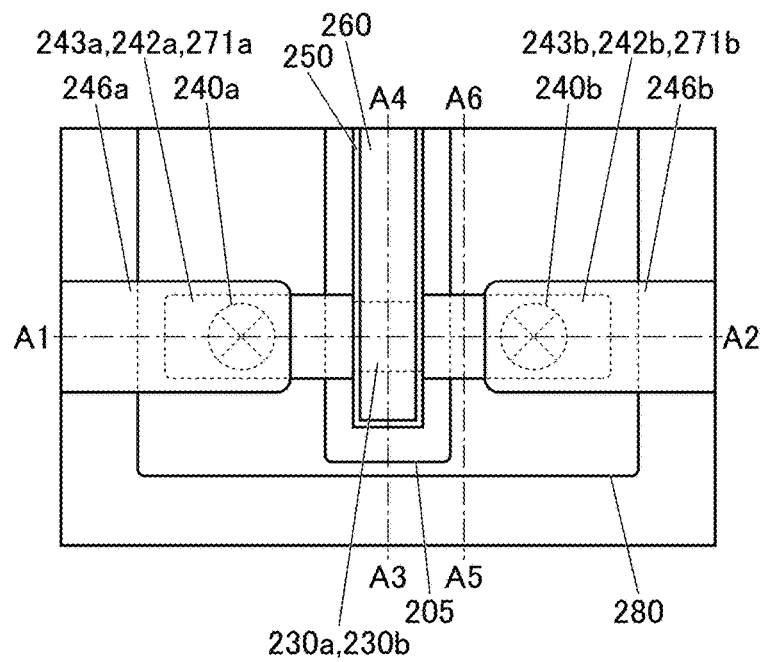
FIG. 22A is a top view of a semiconductor device.
Figure 22C:
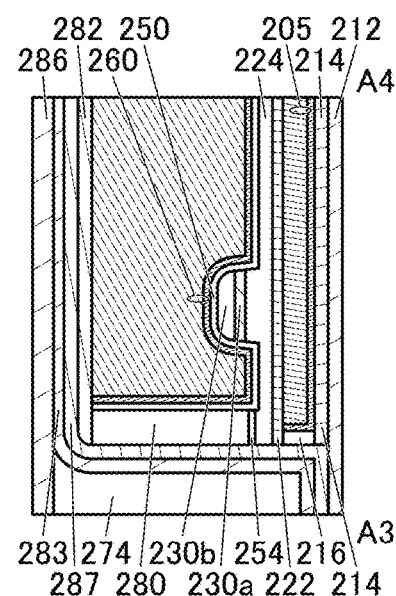
FIG. 22B to FIG. 22D are cross-sectional views of the semiconductor device.
Figure 22B:
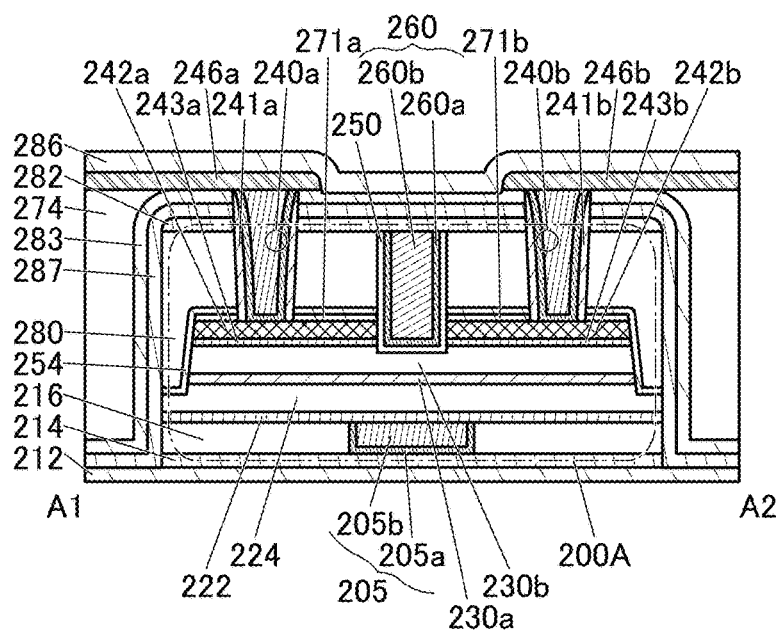
Figure 22D:
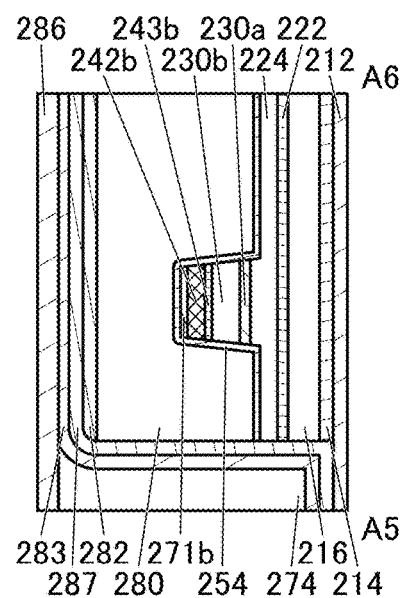

FIG. 22A is a top view of a semiconductor device including a transistor 200A. FIG. 22B is a cross-sectional view corresponding to a portion indicated by the dashed-dotted line A1-A2 in FIG. 22A. FIG. 22C is a cross-sectional view corresponding to a portion indicated by the dashed-dotted line A3-A4 in FIG. 22A. FIG. 22D is a cross-sectional view corresponding to a portion indicated with the dashed-dotted line A5-A6 in FIG. 22A. Note that for clarity of the drawing, some components are not shown in the top view of FIG. 22A.

Note that in the semiconductor device illustrated in FIG. 22A to FIG. 22D, components having the same functions as the components included in the semiconductor devices described in <Structure example of semiconductor device> and <Variation example 1 of semiconductor device> are denoted with the same reference numerals. The materials described in detail in <Structure example of semiconductor device> and <Variation example 1 of semiconductor device> can be used as constituent materials of the semiconductor device in this section.

The semiconductor device illustrated in FIG. 22A to FIG. 22D is a variation example of the semiconductor device illustrated in FIG. 4A to FIG. 4D. The semiconductor device illustrated in FIG. 22A to FIG. 22D is different from the semiconductor device illustrated in FIG. 4A to FIG. 4D in that an insulator 271a and an insulator 271b are included, and that the oxide 230c and the oxide 230d are not included.

In the semiconductor device illustrated in FIG. 22A to FIG. 22D, the insulator 271a is provided between the conductor 242a and the insulator 254, and the insulator 271b is provided between the conductor 242b and the insulator 254.

Here, the insulator 271a and the insulator 271b preferably have a function of inhibiting diffusion of oxygen. In that case, absorption of excess oxygen contained in the insulator 280 by the conductor 242a and the conductor 242b functioning as the source electrode and the drain electrode can be inhibited. Furthermore, inhibiting oxidation of the conductor 242a and the conductor 242b can inhibit an increase in the contact resistance between the transistor and a wiring. Consequently, the transistor 200A can have favorable electrical characteristics and reliability. The insulator 271a and the insulator 271b can be formed using a material similar to that for the insulator 254, for example.

In the method for manufacturing the semiconductor device illustrated in FIG. 22A to FIG. 22D, an insulating layer to be the insulator 271a and the insulator 271b and a conductive layer provided over the insulating layer function as a mask for the conductive film 242A; hence, an end portion at the intersection of the side surface and the top surface of the conductor 242a and the conductor 242b is angular. The cross-sectional area of the conductor 242a and the conductor 242b is larger in the case where the end portion at the intersection of the side surface and the top surface of the conductor 242a and the conductor 242b is angular than in the case where the end portion has a curved surface. Thus, the resistance of the conductor 242a and the conductor 242b is reduced, so that the on-state current of the transistor 200A can be increased.

When the oxide 230c and the oxide 230d are not provided, generation of a parasitic transistor between the transistor 200A and the adjacent transistor 200A can be inhibited, which inhibits generation of a leakage path along the conductor 260. Thus, a semiconductor device that has favorable electrical characteristics and can be miniaturized or highly integrated can be provided.

Application Examples of Semiconductor Device

Examples of a semiconductor device including the transistor 200 in this embodiment that is different from the semiconductor devices described previously in <Structure example of semiconductor device> and <Variation example 1 of semiconductor device> will be described below with reference to FIG. 23A and FIG. 23B. Note that in the semiconductor devices illustrated in FIG. 23A and FIG. 23B, components having the same functions as the components in the semiconductor device described in <Variation example 1 of semiconductor device> (see FIG. 4A to FIG. 4D) are denoted by the same reference numerals. Note that also in this section, the materials described in detail in <Structure example of semiconductor device> and <Variation example 1 of semiconductor device> can be used as the constituent materials for the transistor 200.

Figure 23A:
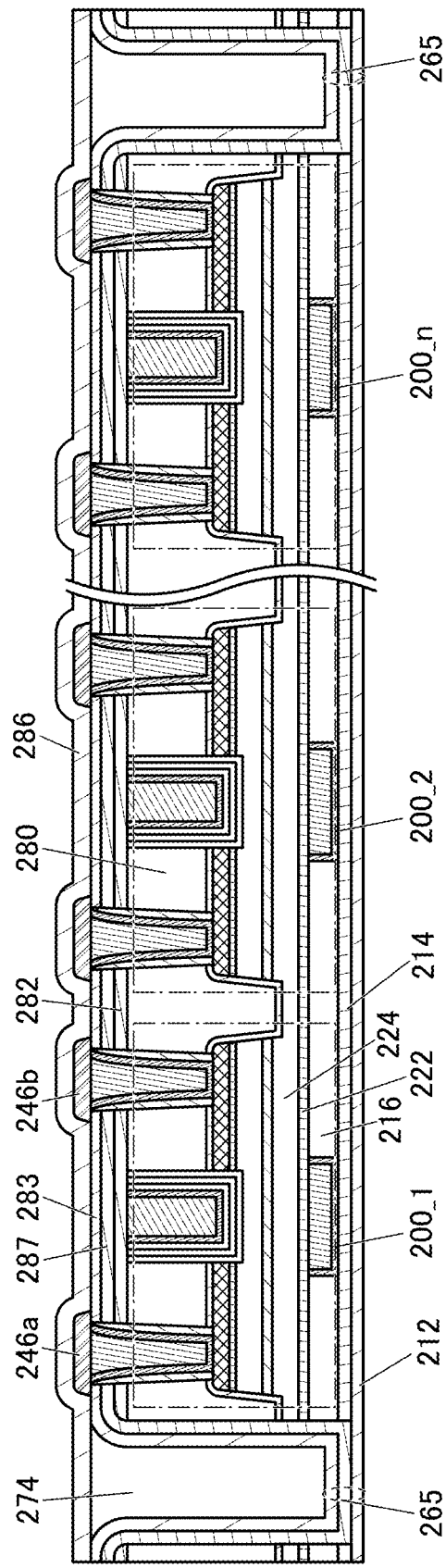
FIG. 23A and FIG. 23B are cross-sectional views of semiconductor devices.
Figure 23B:
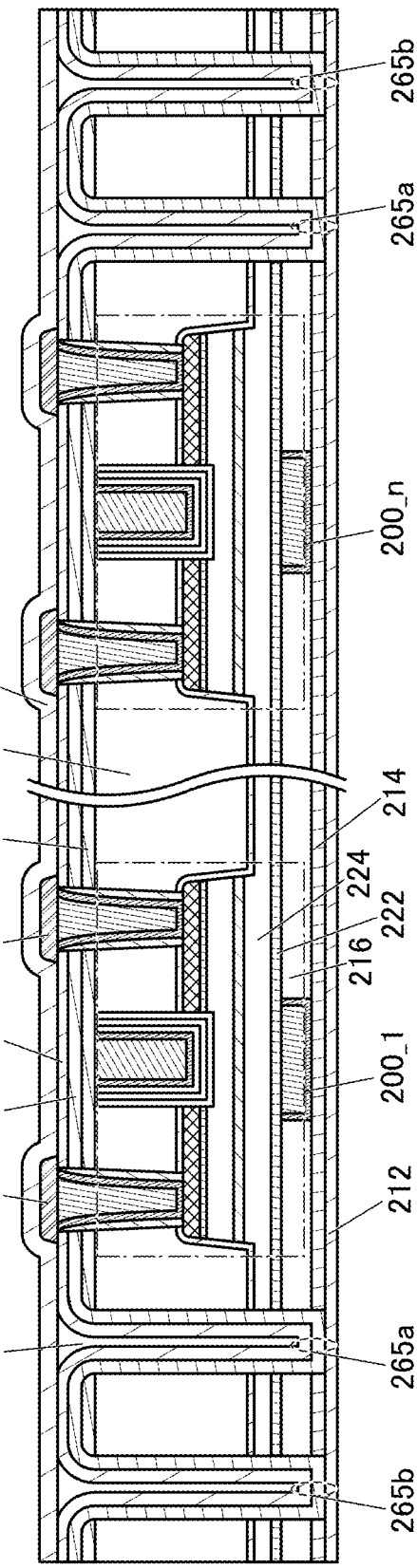

FIG. 23A and FIG. 23B each illustrate a structure in which a plurality of transistors (a transistor 200_1 to a transistor 200_n) are collectively sealed with the insulator 287, the insulator 283, and the insulator 212. Note that although the plurality of transistors appear to be arranged in the channel length direction in FIG. 23A and FIG. 23B, the present invention is not limited thereto. The plurality of transistors may be arranged in the channel width direction or in a matrix. Depending on the design, the transistors may be arranged without regularity.

As illustrated in FIG. 23A, a portion where the insulator 287 and the insulator 283 are in contact with the insulator 212 (hereinafter, sometimes referred to as a sealing portion 265) is formed outside the plurality of transistors (the transistor 200_1 to the transistor 200_n). The sealing portion 265 is formed to surround the plurality of transistors (also referred to as a transistor group). With such a structure, the plurality of transistors can be surrounded by the insulator 287, the insulator 283, and the insulator 212. Thus, a plurality of transistor groups surrounded by the sealing portions 265 are provided over a substrate.

A dicing line (sometimes referred to as a scribe line, a dividing line, or a cutting line) may be provided to overlap the sealing portion 265. The above substrate is divided at the dicing line, so that the transistor group surrounded by the sealing portion 265 is taken out as one chip.

Although FIG. 23A illustrates an example in which the plurality of transistors (the transistor 200_1 to the transistor 200_n) are surrounded by one sealing portion 265, the present invention is not limited thereto. As illustrated in FIG. 23B, the plurality of transistors may be surrounded by a plurality of sealing portions. In FIG. 23B, the plurality of transistors are surrounded by a sealing portion 265a and are further surrounded by an outer sealing portion 265b.

When the plurality of transistors (the transistor 200_1 to the transistor 200_n) are surrounded by the plurality of sealing portions in this manner, a portion where the insulator 287 and the insulator 283 are in contact with the insulator 212 increases, which can further improve adhesion between the insulators 287 and 283 and the insulator 212. Accordingly, the plurality of transistors can be more reliably sealed.

In that case, a dicing line may be provided to overlap the sealing portion 265a or the sealing portion 265b, or may be provided between the sealing portion 265a and the sealing portion 265b.

Note that the insulator 287 is not necessarily provided.

According to one embodiment of the present invention, a method for manufacturing a semiconductor device with high productivity can be provided. According to one embodiment of the present invention, a semiconductor device with a small variation in transistor characteristics and a manufacturing method thereof can be provided. According to one embodiment of the present invention, a highly reliable semiconductor device and a manufacturing method thereof can be provided. According to one embodiment of the present invention, a semiconductor device with favorable electrical characteristics and a manufacturing method thereof can be provided. According to one embodiment of the present invention, a semiconductor device with a high on-state current and a manufacturing method thereof can be provided. According to one embodiment of the present invention, a semiconductor device that can be miniaturized or highly integrated and a manufacturing method thereof can be provided. According to one embodiment of the present invention, a semiconductor device with low power consumption and a manufacturing method thereof can be provided.

The structure, method, and the like described above in this embodiment can be used in an appropriate combination with structures, methods, and the like described in the other embodiments.

Embodiment 2

In this embodiment, an apparatus that can be used to manufacture the semiconductor device described in another embodiment will be described with reference to FIG. 24.

In manufacture of the semiconductor device described in another embodiment, it is preferable to use what is called a multi-chamber apparatus which includes a plurality of treatment chambers that allow successive deposition of different kinds of films. In each treatment chamber, deposition treatment by sputtering, CVD, ALD, or the like can be performed.

In each treatment chamber, substrate cleaning treatment, plasma treatment, reverse sputtering treatment, etching treatment, ashing treatment, heat treatment, or the like may be performed. Different treatments are performed in the treatment chambers as appropriate, whereby an insulating film, a conductive film, and a semiconductor film can be formed without exposure to the air.

A typical example of the semiconductor film used in one embodiment of the present invention includes an oxide semiconductor film. In particular, an oxide semiconductor film having a low impurity concentration and a low density of defect states (a small amount of oxygen vacancies) enables a transistor with excellent electrical characteristics to be manufactured. Here, the state in which the impurity concentration is low and the density of defect states is low is referred to as highly purified intrinsic or substantially highly purified intrinsic.

A highly purified intrinsic or substantially highly purified intrinsic oxide semiconductor film has few carrier generation sources, and thus the carrier concentration can be reduced. Consequently, a transistor where a channel formation region is formed in the oxide semiconductor film rarely has electrical characteristics in which the threshold voltage is negative (also referred to as normally on). Moreover, a highly purified intrinsic or substantially highly purified intrinsic oxide semiconductor film has a low density of defect states and accordingly may have a low density of trap states. Furthermore, a highly purified intrinsic or substantially highly purified intrinsic oxide semiconductor film has an extremely low off-state current; even when an element has a channel width of $1\times10^6$ μm and a channel length L of 10 μm, the off-state current can be less than or equal to the measurement limit of a semiconductor parameter analyzer, i.e., less than or equal to $1\times10^{-13}$ A, at a voltage between a source electrode and a drain electrode (drain voltage) ranging from 1 V to 10 V.

Note that impurities in an oxide semiconductor film are typically water, hydrogen, and the like. In this specification and the like, reducing or removing water and hydrogen from an oxide semiconductor film may be referred to as dehydration or dehydrogenation. Moreover, adding oxygen to an oxide semiconductor film may be referred to as oxygen addition, and a state in which oxygen in excess of the stoichiometric composition is contained due to the oxygen addition may be referred to as an oxygen-excess state.

Here, when an oxide semiconductor, an insulator or a conductor positioned below the oxide semiconductor, and/or an insulator or a conductor positioned over the oxide semiconductor are formed successively without being exposed to the air, a substantially highly purified intrinsic oxide semiconductor film in which the concentration of impurities (particularly hydrogen and water) is reduced can be formed.

Moreover, a stacked-layer structure formed before the deposition of the oxide semiconductor film or a stacked-layer structure formed after processing of the oxide semiconductor film is preferably formed by successive deposition without exposure to the air. This can reduce the concentration of impurities (particularly hydrogen and water) in the stacked-layer structure, and inhibit diffusion of the impurities into the oxide semiconductor film.

First, a structure example of the apparatus that can be used to manufacture the semiconductor device described in another embodiment will be described in detail with reference to FIG. 24. With the use of the apparatus illustrated in FIG. 24, it is possible to successively form a semiconductor film, an insulator or a conductor positioned below the semiconductor film, and/or an insulating film or a conductive film positioned over the semiconductor film. Thus, entry of impurities (particularly hydrogen and water) into the semiconductor film can be inhibited. The apparatus illustrated in FIG. 24 enables successive formation of insulating films of different materials, successive formation of conductive films of different materials, and successive formation for a stacked-layer structure of an insulating film and a conductive film, for example, as well as successive formation for a stacked-layer structure including a semiconductor film.

Figure 24:
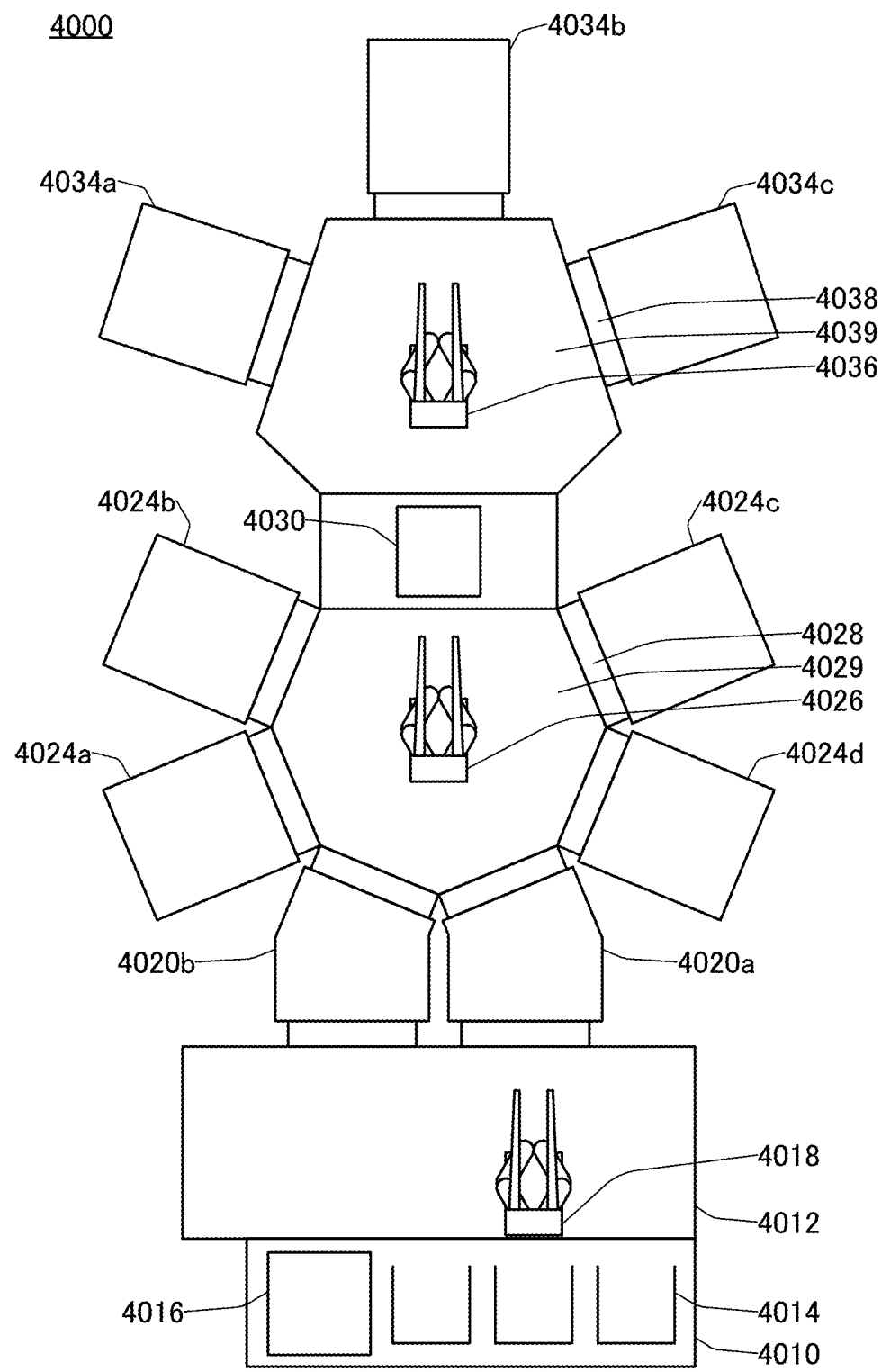
FIG. 24 is a top view illustrating an apparatus for manufacturing a semiconductor device.

FIG. 24 schematically shows a top view of a single wafer multi-chamber apparatus 4000.

The apparatus 4000 includes an atmosphere-side substrate supply chamber 4010; an atmosphere-side substrate transfer chamber 4012 that transfers a substrate from the atmosphere-side substrate supply chamber 4010; a load lock chamber 4020a that loads a substrate and switches the pressure in the chamber from an atmospheric pressure to a reduced pressure or from a reduced pressure to an atmospheric pressure; an unload lock chamber 4020b that unloads a substrate and switches the pressure in the chamber from a reduced pressure to an atmospheric pressure or from an atmospheric pressure to a reduced pressure; a transfer chamber 4029 and a transfer chamber 4039 that transfer a substrate in a vacuum; a transport chamber 4030 that connects the transfer chamber 4029 and the transfer chamber 4039; and a treatment chamber 4024a, a treatment chamber 4024b, a treatment chamber 4024c, a treatment chamber 4024d, a treatment chamber 4034a, a treatment chamber 4034b, and a treatment chamber 4034c that perform deposition or heating.

Note that different treatments can be performed in a plurality of treatment chambers in parallel. Thus, a stacked-layer structure of different kinds of films can be easily fabricated. The number of parallel treatments that can be conducted at maximum is equated to the number of treatment chambers. For example, the apparatus 4000 illustrated in FIG. 24 is an apparatus that includes seven treatment chambers. Therefore, seven deposition treatments can be successively performed without being exposed to the air using one apparatus (which is referred to as "in-situ" in this specification).

On the other hand, the number of stacked layers that can be fabricated in a stacked-layer structure without exposure to the air is not always the same as the number of treatment chambers. For example, in the case where a stacked-layer structure to be required includes a plurality of layers formed using the same material, the layers can be provided in one treatment chamber; thus, a stacked-layer structure can have stacked layers the number of which is larger than the number of provided treatment chambers.

The atmosphere-side substrate supply chamber 4010 includes a cassette port 4014 that holds a substrate and an alignment port 4016 that aligns a substrate. Note that a plurality of cassette ports 4014 (e.g., three cassette ports in FIG. 24) may be provided.

The atmosphere-side substrate transfer chamber 4012 is connected to the load lock chamber 4020a and the unload lock chamber 4020b. The transfer chamber 4029 is connected to the load lock chamber 4020a, the unload lock chamber 4020b, the transport chamber 4030, the treatment chamber 4024a, the treatment chamber 4024b, the treatment chamber 4024c, and the treatment chamber 4024d. The transport chamber 4030 is connected to the transfer chamber 4029 and the transfer chamber 4039. The transfer chamber 4039 is connected to the transport chamber 4030, the treatment chamber 4034a, the treatment chamber 4034b, and the treatment chamber 4034c.

Note that a gate valve 4028 or a gate valve 4038 is provided for a connecting portion of each chamber so that each of the chambers except for the atmosphere-side substrate supply chamber 4010 and the atmosphere-side substrate transfer chamber 4012 can be independently kept under vacuum.

The atmosphere-side substrate transfer chamber 4012 includes a transfer robot 4018. The transfer chamber 4029 includes a transfer robot 4026, and the transfer chamber 4039 includes a transfer robot 4036. Each of the transfer robot 4018, the transfer robot 4026, and the transfer robot 4036 includes a plurality of movable portions and an arm for holding a substrate and can transfer a substrate to each chamber.

Note that the number of transfer chambers, treatment chambers, load lock chambers, unload lock chambers, and transport chambers is not limited to the above, and the numbers thereof can be set as appropriate depending on the space for placement or the process conditions.

Although FIG. 24 illustrates a structure including one transport chamber (the transport chamber 4030) between the transfer chamber 4029 and the transfer chamber 4039, one embodiment of the present invention is not limited thereto. In the case where a plurality of transfer chambers are provided, two or more transport chambers are preferably provided between one transfer chamber and another transfer chamber. For example, in the case where the transfer chamber 4029 and the transfer chamber 4039 are provided, two transport chambers (not illustrated in FIG. 24) are preferably arranged in parallel between the transfer chamber 4029 and the transfer chamber 4039.

When the two transport chambers are arranged in parallel to each other, for example, a step of carrying a substrate to one of the transport chambers by the transfer robot 4026 and a step of carrying a substrate to the other transport chamber by the transfer robot 4036 can be concurrently performed. Furthermore, a step of carrying out a substrate from the other transport chamber by the transfer robot 4026 and a step of carrying out a substrate from the one transport chamber by the transfer robot 4036 can be concurrently performed. That is, when a plurality of transfer robots are driven concurrently, the production efficiency is improved.

Although FIG. 24 illustrates an example in which one transfer chamber includes one transfer robot and is connected to a plurality of treatment chambers, one embodiment of the present invention is not limited to this structure. One transfer chamber may be provided with a plurality of transfer robots.

One or both of the transfer chamber 4029 and the transfer chamber 4039 are connected to a vacuum pump and a cryopump through valves. Accordingly, the transfer chamber 4029 and the transfer chamber 4039 can be evacuated with the vacuum pump from the atmospheric pressure to low or medium vacuum (approximately several hundred pascals to 0.1 Pa) and then, by switching the valve, be evacuated with the cryopump from the medium vacuum to high or ultra-high vacuum (approximately 0.1 Pa to $1 \times 10^{-7}$ Pa).

Alternatively, two or more cryopumps may be connected in parallel to one transfer chamber, for example. With a plurality of cryopumps, even when one of the cryopumps is in regeneration, the transfer chamber can be evacuated using the other cryopump(s). Note that regeneration refers to treatment for discharging molecules (or atoms) trapped in a cryopump. When too many molecules (or atoms) are trapped in a cryopump, the exhaust capability is lowered; therefore, it is preferable to perform regeneration regularly.

The treatment chamber 4024a, the treatment chamber 4024b, the treatment chamber 4024c, the treatment chamber 4024d, the treatment chamber 4034a, the treatment chamber 4034b, and the treatment chamber 4034c can perform different treatments in parallel. In other words, the treatment chambers can independently perform, on the respective substrates provided therein, deposition treatment by sputtering, CVD, MBE, PLD, ALD, or the like, heat treatment, or plasma treatment. In the treatment chamber, deposition treatment may be performed after heat treatment or plasma treatment.

In the apparatus 4000, which includes a plurality of treatment chambers, a substrate can be transferred without being exposed to the air between treatments; hence, adsorption of impurities on the substrate can be inhibited. The treatment chambers can independently perform deposition treatment for different kinds of films, heat treatment, or plasma treatment, which makes it possible to freely determine the order of deposition, heat treatment, and the like.

Note that each treatment chamber may be connected to a vacuum pump through a valve. As the vacuum pump, a dry pump, a mechanical booster pump, and the like can be used, for example.

Each treatment chamber may be connected to a power source capable of generating plasma. As the power source, a DC power source, an AC power source, or a high-frequency (RF, microwave, or the like) power source can be provided. A pulse generator may be connected to the DC power source.

The treatment chamber may be connected to a gas supply device and a gas refiner that is connected to the gas supply device. Note that the number of gas supply devices and the number of gas refiners are preferably the same as the number of kinds of gases.

For example, in the case where deposition treatment by sputtering is performed in the treatment chamber, the treatment chamber may include a target, a backing plate connected to the target, a cathode positioned to face the target with the backing plate therebetween, a deposition shield, a substrate stage, or the like. Moreover, for example, the substrate stage may be provided with a substrate holding mechanism that holds a substrate, a rear heater that heats a substrate from the back surface, a power source for applying a bias to a substrate, or the like.

Note that the substrate stage is held substantially perpendicularly to the floor during deposition and is held substantially parallel to the floor when the substrate is delivered. Here, when the substrate stage is held substantially perpendicularly to the floor, the probability that dust or a particle that would be mixed into the film during deposition is attached to the substrate can be lowered as compared to the case where the substrate stage is held parallel to the floor. However, there is a possibility that the substrate falls when the substrate stage is held perpendicularly (90°) to the floor; therefore, the angle of the substrate stage to the floor is preferably greater than or equal to 80° and less than 90°.

Note that the structure of the substrate stage is not limited to the above structure. A structure in which the substrate stage is substantially parallel to the floor may be employed, for example. With that structure, a target is positioned below the substrate stage, and a substrate is positioned between the target and the substrate stage. The substrate stage may be provided with a jig for fixing a substrate so as not to fall or a mechanism for fixing a substrate.

When a deposition shield is provided for the treatment chamber, particles sputtered from the target can be inhibited from being deposited on a region where deposition is not needed. The deposition shield is preferably processed to prevent accumulated sputtered particles from being separated. For example, blasting treatment that increases surface roughness may be performed, or projections and depressions may be provided on the surface of the deposition shield.

The backing plate has a function of holding the target, and the cathode has a function of applying voltage (for example, negative voltage) to the target.

Note that the target can be formed using a conductor, an insulator, or a semiconductor. For example, when the target is an oxide semiconductor such as a metal oxide, an oxide semiconductor film can be formed in the treatment chamber. When the target is a metal oxide, an oxynitride semiconductor film can be formed by using a nitrogen gas as the deposition gas.

Each treatment chamber may be connected to a gas supply device through a gas heating mechanism. The gas heating mechanism is connected to a gas refiner through the gas supply apparatus. As the gas introduced to the treatment chamber, a gas whose dew point is −80° C. or lower, preferably −100° C. or lower, further preferably −120° C. or lower can be used; for example, an oxygen gas, a nitrogen gas, and a rare gas (e.g., an argon gas) can be used. Moreover, with the gas heating mechanism, the gas introduced to the treatment chamber can be heated to higher than or equal to 40° C. and lower than or equal to 400° C., preferably higher than or equal to 50° C. and lower than or equal to 200° C. Note that the number of gas heating mechanisms, the number of gas supply devices, and the number of gas refiners are preferably the same as the number of kinds of gases.

Each treatment chamber may be connected to a turbo molecular pump and a vacuum pump through a valve. Each treatment chamber may be provided with a cryotrap.

The cryotrap is a mechanism that can adsorb a molecule (or an atom) having a relatively high melting point, such as water. The turbo molecular pump has excellent productivity because it stably exhausts a large-sized molecule (or atom) and needs low frequency of maintenance, whereas it has a low capability in removing hydrogen and water. Thus, a cryotrap can be used to improve the capability of removing water or the like. The temperature of a refrigerator of the cryotrap is set lower than or equal to 100 K, preferably lower than or equal to 80 K. In the case where the cryotrap has a plurality of refrigerators, it is preferable to set the refrigerators at different temperatures because efficient exhaust is possible. For example, the temperature of a first-stage refrigerator is set lower than or equal to 100 K and the temperature of a second-stage refrigerator is set lower than or equal to 20 K.

Note that the exhaust method for the treatment chamber is not limited thereto, and a system similar to that of the exhaust method for the transfer chamber connected thereto (the exhaust method using a cryopump and a vacuum pump) may be employed. Note that the exhaust method for the transfer chamber may have a system similar to that of the treatment chamber (the exhaust method using a turbo molecular pump and a vacuum pump).

In particular, a vacuum pump and a cryotrap may be combined as the exhaust method for the treatment chamber where an oxide semiconductor film is formed. The exhaust method for the treatment chamber where an oxide semiconductor film is formed preferably has at least a function of adsorbing water molecules.

In the treatment chamber where the oxide semiconductor film is formed, the partial pressure of hydrogen molecules is preferably lower than or equal to $1\times10^{-2}$ Pa, and the partial pressure of water molecules is preferably lower than or equal to $1\times10^{-4}$ Pa. In the treatment chamber where the oxide semiconductor film is formed, the pressure in a standby state is lower than or equal to $8.0\times10^{-5}$ Pa, preferably lower than or equal to $5.0\times10^{-5}$ Pa, further preferably lower than or equal to $1.0\times10^{-5}$ Pa. The above values of the partial pressure of hydrogen molecules and the partial pressure of water molecules are the values of both of the standby state and the deposition state (a plasma discharge state) of the sputtering chamber.

Note that the total pressure and the partial pressure in the treatment chamber can be measured using a mass analyzer. For example, Qulee CGM-051, a quadrupole mass analyzer (also referred to as Q-mass) produced by ULVAC, Inc., can be used.

The partial pressure of hydrogen molecules, the partial pressure of water molecules, and the pressure in a standby state in the treatment chamber are set to the values in above ranges, whereby the impurity concentration of an oxide semiconductor film to be formed can be reduced.

Alternatively, in the case where heat treatment is performed in a treatment chamber, for example, the treatment chamber may have a plurality of heating stages that can hold a substrate. Note that the heating stage may have several stages. By increasing the number of heating stages, a plurality of substrates can be subjected to heat treatment at the same time, which leads to an increase in productivity.

A heating mechanism that can be used for the treatment chamber may be a heating mechanism that performs heating with a resistance heater or the like, for example. Alternatively, a heating mechanism that uses heat conduction or heat radiation from a medium such as a heated gas for heating may be used. For example, RTA (Rapid Thermal Anneal) such as GRTA (Gas Rapid Thermal Anneal) or LRTA (Lamp Rapid Thermal Anneal) can be used. In LRTA, an object is heated through radiation of light (electromagnetic waves) emitted from a lamp such as a halogen lamp, a metal halide lamp, a xenon arc lamp, a carbon arc lamp, a high-pressure sodium lamp, or a high-pressure mercury lamp. In GRTA, heat treatment is performed using a high-temperature gas. An inert gas is used as the gas.

The apparatus 4000 particularly preferably has a structure in which deposition treatment by sputtering can be performed in six treatment chambers and heat treatment can be performed in one treatment chamber. Thus, some of the components of the semiconductor device described in another embodiment can be formed with a stacked-layer structure obtained by in-situ successive deposition. Note that in the case where heat treatment is performed with an apparatus different from the apparatus 4000, the apparatus 4000 may have a structure in which deposition treatment by sputtering can be performed in all the treatment chambers.

In a method for manufacturing the semiconductor device including the transistor 200, the insulator 212, the insulator 214, and the insulator 216 are successively formed using the apparatus 4000. The insulator 222, the insulator 224, the oxide film 230A, the oxide film 230B, and the oxide film 243A are successively formed using the apparatus 4000. The insulator 254 and the insulating film 280A are successively formed using the apparatus 4000. The insulator 282 and the insulator 283, or the insulator 287, the insulator 283, and the insulating film 274A are successively formed using the apparatus 4000.

That is, the insulator 212, the insulator 214, and the insulator 216 can be successively formed without being exposed to the air. The insulator 222, the insulator 224, the oxide film 230A, the oxide film 230B, and the oxide film 243A can be successively formed without being exposed to the air. The insulator 254 and the insulating film 280A can be successively formed without being exposed to the air. The insulator 282 and the insulator 283, or the insulator 287, the insulator 283, and the insulating film 274A can be successively formed without being exposed to the air.

With the above structure, stacked films from which impurities (typically, water, hydrogen, and the like) are thoroughly removed can be formed. Furthermore, each interface between the stacked films is not exposed to the air; thus, the impurity concentration is reduced.

The load lock chamber 4020a may include a substrate delivery stage, a rear heater for heating a substrate from the back surface, or the like. When the pressure of the load lock chamber 4020a is increased from a reduced pressure state to an atmospheric pressure and becomes an atmospheric pressure, the substrate delivery stage in the load lock chamber 4020a receives a substrate from the transfer robot 4018 provided in the atmosphere-side substrate transfer chamber 4012. After that, the load lock chamber 4020a is evacuated into a vacuum to make a reduced pressure state, and then, the transfer robot 4026 provided in the transfer chamber 4029 receives the substrate from the substrate delivery stage.

The load lock chamber 4020a is connected to a vacuum pump and a cryopump through valves. Note that the unload lock chamber 4020b can have a structure similar to that of the load lock chamber 4020a.

Since the atmosphere-side substrate transfer chamber 4012 includes the transfer robot 4018, delivery and receipt of a substrate between the cassette port 4014 and the load lock chamber 4020a can be performed using the transfer robot 4018. Furthermore, a mechanism for inhibiting entry of dust or a particle, such as an HEPA filter (High Efficiency Particulate Air Filter), may be provided above the atmosphere-side substrate transfer chamber 4012 and the atmosphere-side substrate supply chamber 4010. The cassette port 4014 can hold a plurality of substrates.

When an insulating film, a semiconductor film, and a conductive film are successively formed without exposure to the air with use of the apparatus 4000 described above, entry of impurities into the semiconductor film can be suitably inhibited.

As described above, a stacked-layer structure including a semiconductor film and a stacked-layer structure around the semiconductor film can be formed through successive deposition with the use of the apparatus of this embodiment. Therefore, impurities such as hydrogen and water that would enter the semiconductor film can be reduced, and a semiconductor film with a low density of defect states can be formed.

The structure, method, and the like described in this embodiment can be used in an appropriate combination with structures, methods, and the like described in the other embodiments.

Embodiment 3

In this embodiment, one embodiment of a semiconductor device will be described with reference to FIG. 25 and FIG. 26.

[Storage Device 1]

Figure 25:
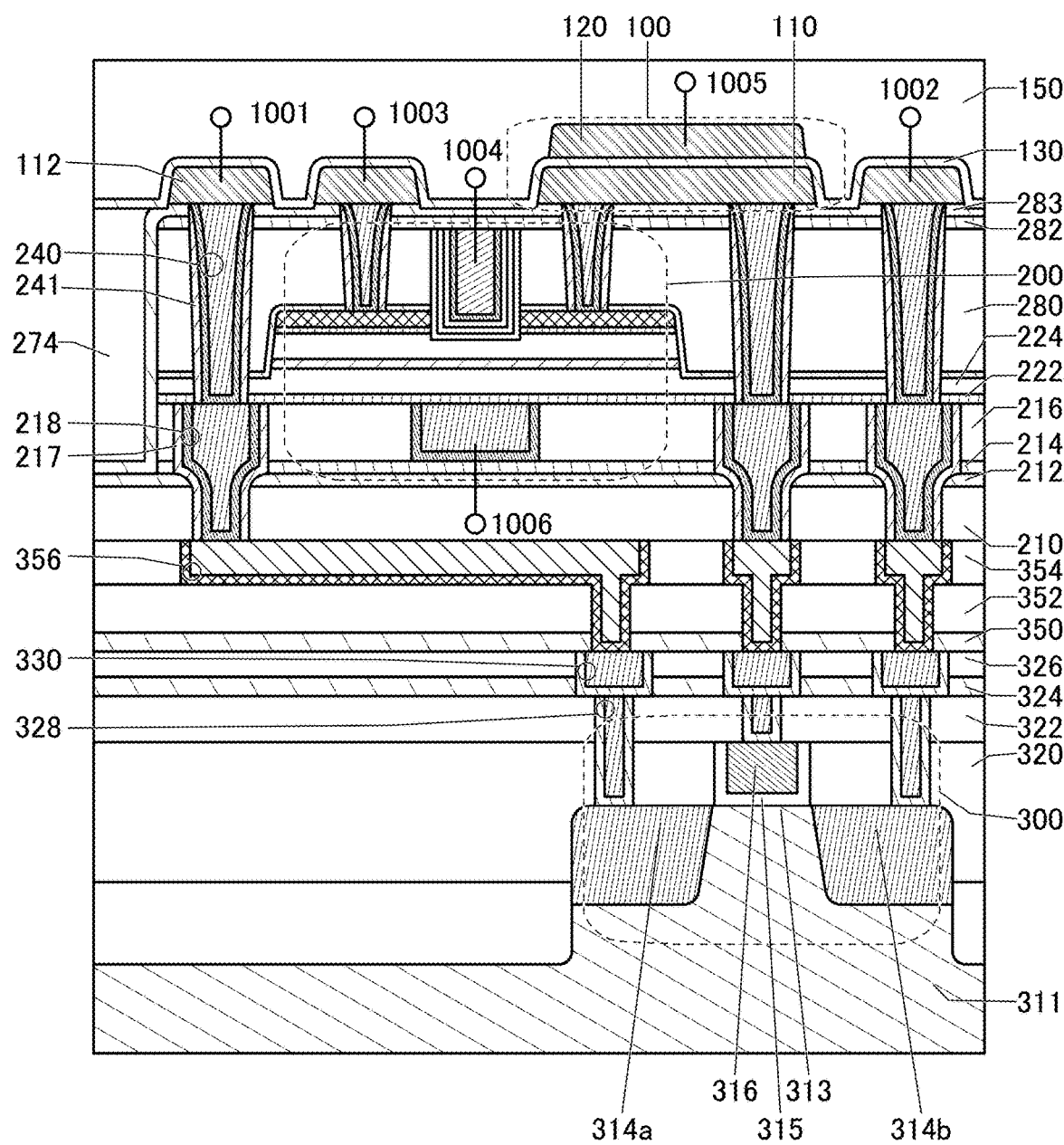
FIG. 25 is a cross-sectional view illustrating a structure of a storage device.

FIG. 25 illustrates an example of a semiconductor device (a storage device) of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor in which a channel is formed in a semiconductor layer including an oxide semiconductor. The off-state current of the transistor 200 is low; thus, by using the transistor 200 in a storage device, stored data can be retained for a long time. In other words, such a storage device does not require refresh operation or has extremely low frequency of the refresh operation, which leads to a sufficient reduction in power consumption of the storage device.

In the semiconductor device illustrated in FIG. 25, a wiring 1001 is electrically connected to a source of the transistor 300, and a wiring 1002 is electrically connected to a drain of the transistor 300. A wiring 1003 is electrically connected to one of the source and the drain of the transistor 200, a wiring 1004 is electrically connected to the first gate of the transistor 200, and a wiring 1006 is electrically connected to the second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

By arranging the storage devices illustrated in FIG. 25 in a matrix, a memory cell array can be formed.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as a source region and a drain region. The transistor 300 can be a p-channel transistor or an n-channel transistor.

Here, in the transistor 300 illustrated in FIG. 25, the semiconductor region 313 (part of the substrate 311) in which the channel is formed has a protruding shape. The conductor 316 is provided to cover a side surface and a top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Although the case where the protruding portion is formed by processing part of the semiconductor substrate is described here, a semiconductor film having a protruding shape may be formed by processing an SOI substrate.

Note that the transistor 300 illustrated in FIG. 25 is an example and the structure is not limited thereto; an appropriate transistor is used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric. Here, as the insulator 130, the insulator that can be used as the insulator 286 described in the above embodiment is preferably used.

For example, a conductor 112 and the conductor 110 over the conductor 240 can be formed at the same time. Note that the conductor 112 has a function of a plug or a wiring that is electrically connected to the capacitor 100, the transistor 200, or the transistor 300.

The conductor 112 and the conductor 110 each have a single-layer structure in FIG. 25; however, the structure is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and stacked layers or a single layer can be provided.

For example, for the insulator 130, a stacked-layer structure using a material with high dielectric strength, such as silicon oxynitride, and a high dielectric constant (high-k) material is preferably used. In the capacitor 100 having such a structure, a sufficient capacitance can be ensured owing to the high dielectric constant (high-k) insulator, and the dielectric strength can be increased owing to the insulator with high dielectric strength; thus, the electrostatic breakdown of the capacitor 100 can be inhibited.

Examples of a high dielectric constant (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of a material with high dielectric strength (a material having a low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the components. In addition, a plurality of wiring layers can be provided in accordance with design. Here, a plurality of conductors functioning as plugs or wirings are collectively denoted by the same reference numeral in some cases. In this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are stacked in this order as interlayer films over the transistor 300. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulator functioning as an interlayer film may function as a planarization film that covers an uneven shape thereunder. For example, the top surface of the insulator 322 may be planarized by planarization treatment using a chemical mechanical polishing (CMP) method or the like to increase planarity.

A wiring layer may be provided over the insulator 326 and the conductor 330. For example, in FIG. 25, an insulator 350, an insulator 352, and an insulator 354 are stacked in this order. A conductor 356 is formed in the insulator 350, the insulator 352, and the insulator 354. The conductor 356 functions as a plug or a wiring.

Similarly, a conductor 218, a conductor included in the transistor 200 (the conductor 205), and the like are embedded in an insulator 210, the insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Here, like the insulator 241a and the insulator 241b described in the above embodiment, an insulator 217 is provided in contact with a side surface of the conductor 218 functioning as a plug. The insulator 217 is provided in contact with a side wall of an opening formed in the insulator 210, the insulator 212, the insulator 214, and the insulator 216. That is, the insulator 217 is provided between the conductor 218 and the insulator 210, the insulator 212, the insulator 214, and the insulator 216. Note that the conductor 205 and the conductor 218 can be formed in parallel; thus, the insulator 217 is sometimes formed in contact with a side surface of the conductor 205.

As the insulator 217, an insulator such as silicon nitride, aluminum oxide, or silicon nitride oxide is used. Since the insulator 217 is provided in contact with the insulator 212, the insulator 214, and the insulator 222, entry of impurities such as water or hydrogen into the oxide 230 through the conductor 218 from the insulator 210, the insulator 216, or the like can be inhibited. In particular, silicon nitride is suitable because of having a high blocking property against hydrogen. Moreover, oxygen contained in the insulator 210 or the insulator 216 can be prevented from being absorbed by the conductor 218.

The insulator 217 can be formed in a manner similar to that of the insulator 241a and the insulator 241b. For example, silicon nitride is deposited using a PEALD method and an opening reaching the conductor 356 is formed using anisotropic etching.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low relative permittivity is used for the insulator functioning as an interlayer film, the parasitic capacitance between wirings can be reduced. Thus, a material is preferably selected depending on the function of the insulator.

For example, for the insulator 150, the insulator 210, the insulator 352, the insulator 354, and the like, an insulator having a low relative permittivity is preferably used. For example, the insulators preferably contain silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 214, the insulator 212, the insulator 350, and the like.

As the insulator having a function of inhibiting passage of oxygen and impurities such as hydrogen, a single layer or stacked layers of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum, for example, are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductor that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single layer or stacked layers of a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is particularly preferable to use tungsten. Alternatively, it is preferable to use a low-resistance conductive material such as aluminum or copper. The use of a low-resistance conductive material can reduce wiring resistance.

<Wiring or Plug in Layer where Oxide Semiconductor is Provided>

In the case where an oxide semiconductor is used in the transistor 200, an insulator including an excess-oxygen region is sometimes provided in the vicinity of the oxide semiconductor. In that case, an insulator having a barrier property is preferably provided between the insulator including the excess-oxygen region and a conductor provided in the insulator including the excess-oxygen region.

For example, in FIG. 25, the insulator 241 is preferably provided between the conductor 240 and the insulator 224 and the insulator 280 that include excess oxygen. Since the insulator 241 is provided in contact with the insulator 222, the insulator 282, and the insulator 283, the insulator 224 and the transistor 200 can be sealed by the insulators having a barrier property.

That is, providing the insulator 241 can inhibit excess oxygen contained in the insulator 224 and the insulator 280 from being absorbed by the conductor 240. In addition, providing the insulator 241 can inhibit diffusion of hydrogen, which is an impurity, into the transistor 200 through the conductor 240.

The insulator 241 is preferably formed using an insulating material having a function of inhibiting diffusion of impurities such as water or hydrogen and oxygen. For example, silicon nitride, silicon nitride oxide, aluminum oxide, hafnium oxide, or the like is preferably used. In particular, silicon nitride is preferable because of its high blocking property against hydrogen. Alternatively, for example, a metal oxide such as magnesium oxide, gallium oxide, germanium oxide, yttrium oxide, zirconium oxide, lanthanum oxide, neodymium oxide, or tantalum oxide can be used.

As in the above embodiment, the transistor 200 is preferably sealed with the insulator 212, the insulator 214, the insulator 282, and the insulator 283. Such a structure can inhibit entry of impurities (particularly hydrogen and water) contained in the insulator 274, the insulator 150, or the like into the insulator 280 or the like. Note that the insulator 287 may be provided between the transistor 200 and the insulator 283.

Here, the conductor 240 penetrates the insulator 283 and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, and the insulator 283 through the conductor 240 and the conductor 218. In this manner, the transistor 200 is sealed more surely with the insulator 212, the insulator 214, the insulator 282, the insulator 283, the insulator 241, and the insulator 217, so that impurities such as hydrogen contained in the insulator 274 or the like can be inhibited from entering the transistor 200.

As described in the above embodiment, the insulator 216, the insulator 224, the insulator 280, the insulator 250, and the insulator 274 are preferably formed with the deposition method using the gas in which hydrogen atoms are reduced or removed. Thus, the hydrogen concentrations of the insulator 216, the insulator 224, the insulator 280, the insulator 250, and the insulator 274 can be lowered.

In this manner, the hydrogen concentration of silicon-based insulating films in the vicinity of the transistor 200 can be reduced; hence, the hydrogen concentration of the oxide 230 can be reduced.

<Dicing Line>

A dicing line (referred to as a scribe line, a dividing line, or a cutting line in some cases) which is provided when a large-sized substrate is divided into semiconductor elements so that a plurality of semiconductor devices are each formed in a chip form will be described below. Examples of a dividing method include the case where a groove (a dicing line) for dividing semiconductor elements is formed on a substrate, and then the substrate is cut along the dicing line to divide (split) it into a plurality of semiconductor devices.

Here, for example, as illustrated in FIG. 25, it is preferable that a region in which the insulator 283 and the insulator 212 are in contact with each other overlap the dicing line. That is, an opening is provided in the insulator 282, the insulator 280, the insulator 254, the insulator 224, the insulator 222, the insulator 216, and the insulator 214 in the vicinity of a region to be the dicing line that is provided on an outer edge of a memory cell including a plurality of transistors 200.

In other words, in the opening provided in the insulator 282, the insulator 280, the insulator 254, the insulator 224, the insulator 222, the insulator 216, and the insulator 214, the insulator 212 and the insulator 283 are in contact with each other. Here, the insulator 212 and the insulator 283 may be formed using the same material and the same method, for example. When the insulator 212 and the insulator 283 are formed using the same material and the same method, the adhesion therebetween can be increased. For example, silicon nitride is preferably used.

With such a structure, the transistors 200 can be surrounded by the insulator 212, the insulator 214, the insulator 282, and the insulator 283. At least one of the insulator 212, the insulator 214, the insulator 282, and the insulator 283 has a function of inhibiting diffusion of oxygen, hydrogen, and water; hence, even when the substrate is divided into circuit regions each of which is provided with the semiconductor elements described in this embodiment to be processed into a plurality of chips, the entry and diffusion of impurities such as hydrogen or water from the direction of the side surface of the divided substrate into the transistor 200 can be inhibited.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and improved reliability.

Although the capacitor 100 of the storage device illustrated in FIG. 25 has a planar shape, the storage device described in this embodiment is not limited thereto. For example, the capacitor 100 may have a cylindrical shape as illustrated in FIG. 26. Note that the structure below and including the insulator 150 of a storage device illustrated in FIG. 26 is similar to that of the semiconductor device illustrated in FIG. 25.

The insulator 150 is provided over the insulator 130, and an insulator 142 is provided over the insulator 150. An opening is formed in the insulator 150 and the insulator 142.

Figure 26:
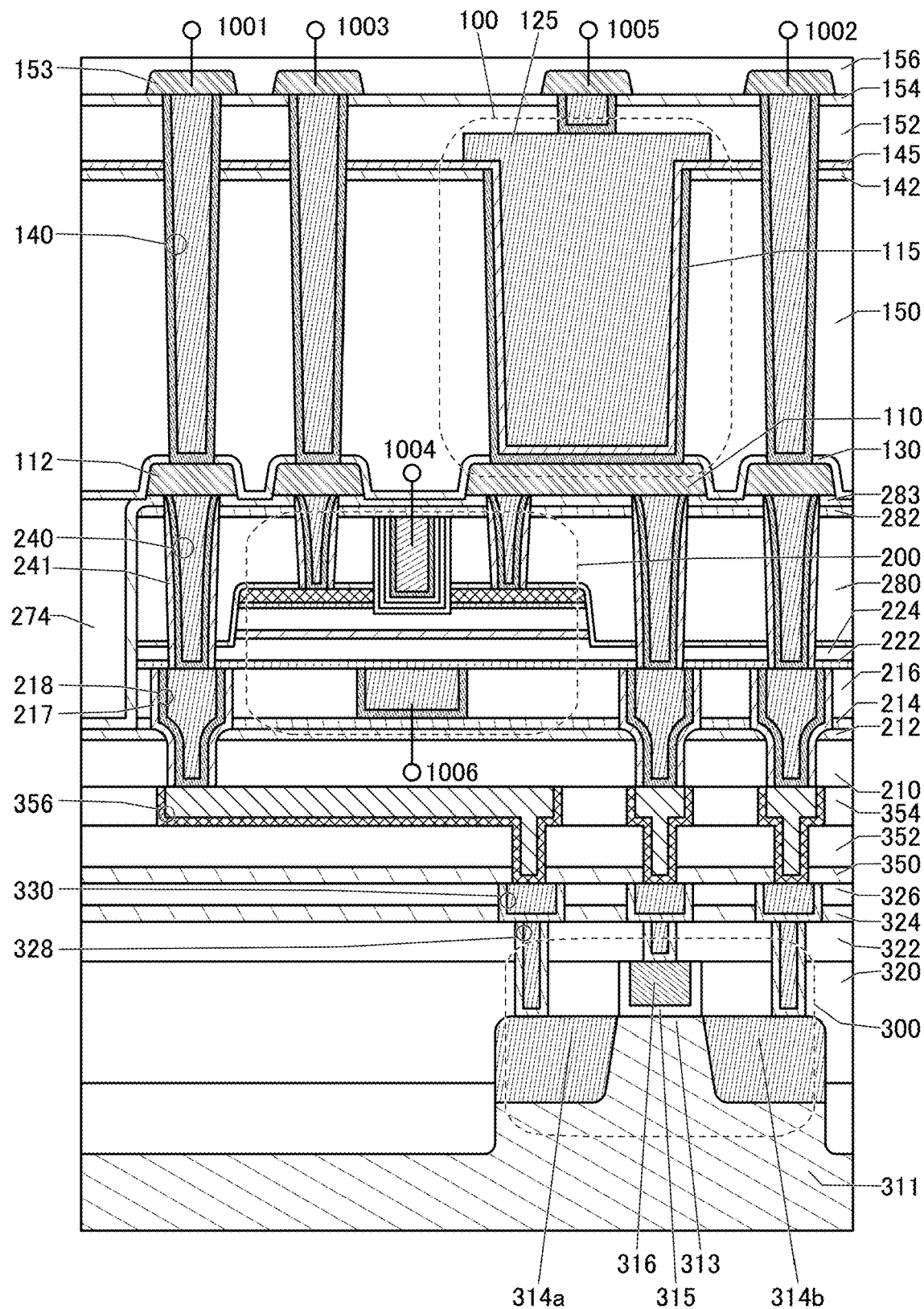
FIG. 26 is a cross-sectional view illustrating a structure of a storage device.

The capacitor 100 illustrated in FIG. 26 includes a conductor 115, an insulator 145 over the conductor 115 and the insulator 142, and a conductor 125 over the insulator 145. Here, at least parts of the conductor 115, the insulator 145, and the conductor 125 are positioned in the opening.

The conductor 115 functions as a lower electrode of the capacitor 100, the conductor 125 functions as an upper electrode of the capacitor 100, and the insulator 145 functions as a dielectric of the capacitor 100. The capacitor 100 has a structure in which the upper electrode and the lower electrode face each other with the dielectric positioned therebetween on a side surface as well as a bottom surface of the opening in the insulator 150 and the insulator 142; thus, the capacitance per unit area can be increased. Hence, the deeper the opening is, the larger the capacitance of the capacitor 100 can be. Increasing the capacitance per unit area of the capacitor 100 in this manner can promote miniaturization or higher integration of the semiconductor device.

An insulator 152 is provided over the conductor 125 and the insulator 145.

An insulator that can be used as the insulator 280 can be used as the insulator 152. The insulator 142 preferably functions as an etching stopper at the time of forming the opening in the insulator 150 and is formed using an insulator that can be used as the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap each other is preferably large in the top view. Such a structure can reduce the area occupied by the semiconductor device including the capacitor 100 and the transistor 200.

The conductor 115 is positioned in contact with the opening formed in the insulator 142 and the insulator 150. The top surface of the conductor 115 is preferably substantially level with the top surface of the insulator 142. The bottom surface of the conductor 115 is in contact with the conductor 110 through an opening in the insulator 130. The conductor 115 is preferably deposited using an ALD method, a CVD method, or the like; for example, a conductor that can be used as the conductor 205 is used.

The insulator 145 is positioned to cover the conductor 115 and the insulator 142. The insulator 145 is preferably deposited using an ALD method or a CVD method, for example. The insulator 145 can be provided as stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 145, an insulating film in which zirconium oxide, aluminum oxide, and zirconium oxide are stacked in this order can be used, for example.

For the insulator 145, a material with high dielectric strength, such as silicon oxynitride, or a high dielectric constant (high-k) material is preferably used. Alternatively, a stacked-layer structure using a material with high dielectric strength and a high dielectric constant (high-k) material may be employed.

Examples of a high dielectric constant (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material can ensure sufficient capacitance of the capacitor 100 even when the insulator 145 has a large thickness. When the insulator 145 has a large thickness, leakage current generated between the conductor 115 and the conductor 125 can be suppressed.

Examples of a material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride deposited by an ALD method, silicon oxide deposited by a PEALD method, and silicon nitride deposited by an ALD method are stacked in this order. The use of such an insulator with high dielectric strength can increase the dielectric strength and inhibit electrostatic breakdown of the capacitor 100.

The conductor 125 is positioned to fill the opening formed in the insulator 142 and the insulator 150. The conductor 125 is electrically connected to the wiring 1005 through a conductor 140 and a conductor 153. The conductor 125 is preferably deposited using an ALD method, a CVD method, or the like and is formed using a conductor that can be used as the conductor 205, for example.

The conductor 153 is provided over an insulator 154 and is covered with an insulator 156. The conductor 153 is formed using a conductor that can be used as the conductor 112, and the insulator 156 is formed using an insulator that can be used as the insulator 152. Here, the conductor 153 is in contact with the top surface of the conductor 140 and functions as a terminal of the capacitor 100, the transistor 200, or the transistor 300.

The structure, method, and the like described above in this embodiment can be used in an appropriate combination with structures, methods, and the like described in the other embodiments.

Embodiment 4

Figure 27:
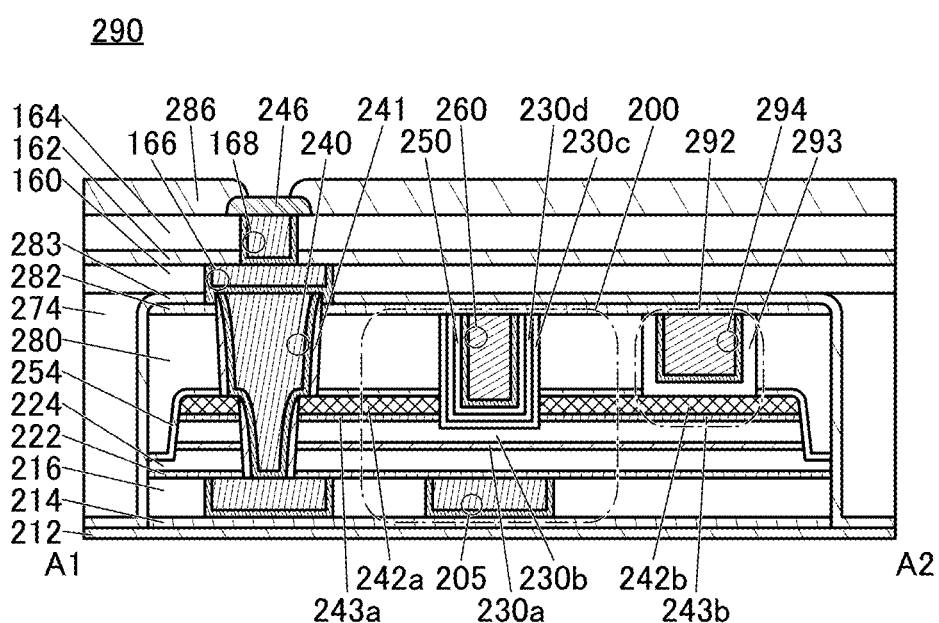
FIG. 27 is a cross-sectional view of a semiconductor device.

In this embodiment, one embodiment of a semiconductor device will be described with reference to FIG. 27 to FIG. 30.
[Storage Device 2]
FIG. 27 illustrates an example of a semiconductor device (a storage device) in this embodiment.

Structure Example of Memory Device

FIG. 27 is a cross-sectional view of a semiconductor device including a memory device 290. The memory device 290 illustrated in FIG. 27 includes a capacitor device 292 in addition to the transistor 200 illustrated in FIG. 4A to FIG. 4D. FIG. 27 corresponds to a cross-sectional view of the transistor 200 in the channel length direction.

Note that in the semiconductor device illustrated in FIG. 27, components having the same functions as the components in the semiconductor device described in the above embodiment are denoted by the same reference numerals. Note that also in this section, the materials described in detail in the above embodiment can be used as constituent materials of the components of the semiconductor device.

As illustrated in FIG. 27, the memory device 290 is preferably sealed with the insulator 283 and the insulator 212. Such a structure can inhibit entry of impurities (particularly hydrogen and water) into the memory device 290. As described in the above embodiment, the insulator 287 may be provided between the memory device 290 and the insulator 283.

The capacitor device 292 includes the conductor 242b, an insulator 293 provided over the conductor 242b, and a conductor 294 provided over the insulator 293. In other words, the capacitor device 292 forms a MIM (Metal-Insulator-Metal) capacitor. Note that one of a pair of electrodes of the capacitor device 292, i.e., the conductor 242b can double as the source electrode or the drain electrode of the transistor. Thus, the manufacturing process of the capacitor device 292 can also serve as part of the manufacturing process of the transistor; therefore, the productivity of the semiconductor device can be improved. Furthermore, the area where the transistor and the capacitor device are positioned can be reduced.

The conductor 294 can be formed using, for example, a material that can be used for the conductor 240.

The insulator 293 preferably has a stacked-layer structure of zirconium oxide, aluminum oxide, and zirconium oxide, for example. As another example, the insulator 293 is formed using a material usable for the insulator 130 and is preferably provided as stacked layers or a single layer.

A wiring layer may be provided over the memory device 290. For example, as illustrated in FIG. 27, an insulator 160 functioning as an interlayer film is provided over the transistor 200 and the capacitor device 292. A conductor 166 that is electrically connected to the transistor 200 is embedded in the insulator 283 and the insulator 160. The conductor 166 functions as a plug or a wiring.

A wiring layer may be provided over the insulator 160 and the conductor 166. For example, as illustrated in FIG. 27, an insulator 162 and an insulator 164 are stacked in this order.

A conductor 168 is embedded in the insulator 162 and the insulator 164. The conductor 168 functions as a plug or a wiring.

The insulator 160 and the insulator 164 preferably include an insulator with a low relative permittivity. For example, as the insulator 160 and the insulator 164, an insulator that can be used as the insulator 352 and the like can be used.

As the insulator 162, the insulator having a function of inhibiting the passage of oxygen and impurities such as hydrogen is used. For example, as the insulator 162, an insulator that can be used as the insulator 350 and the like is used.

Figure 28:
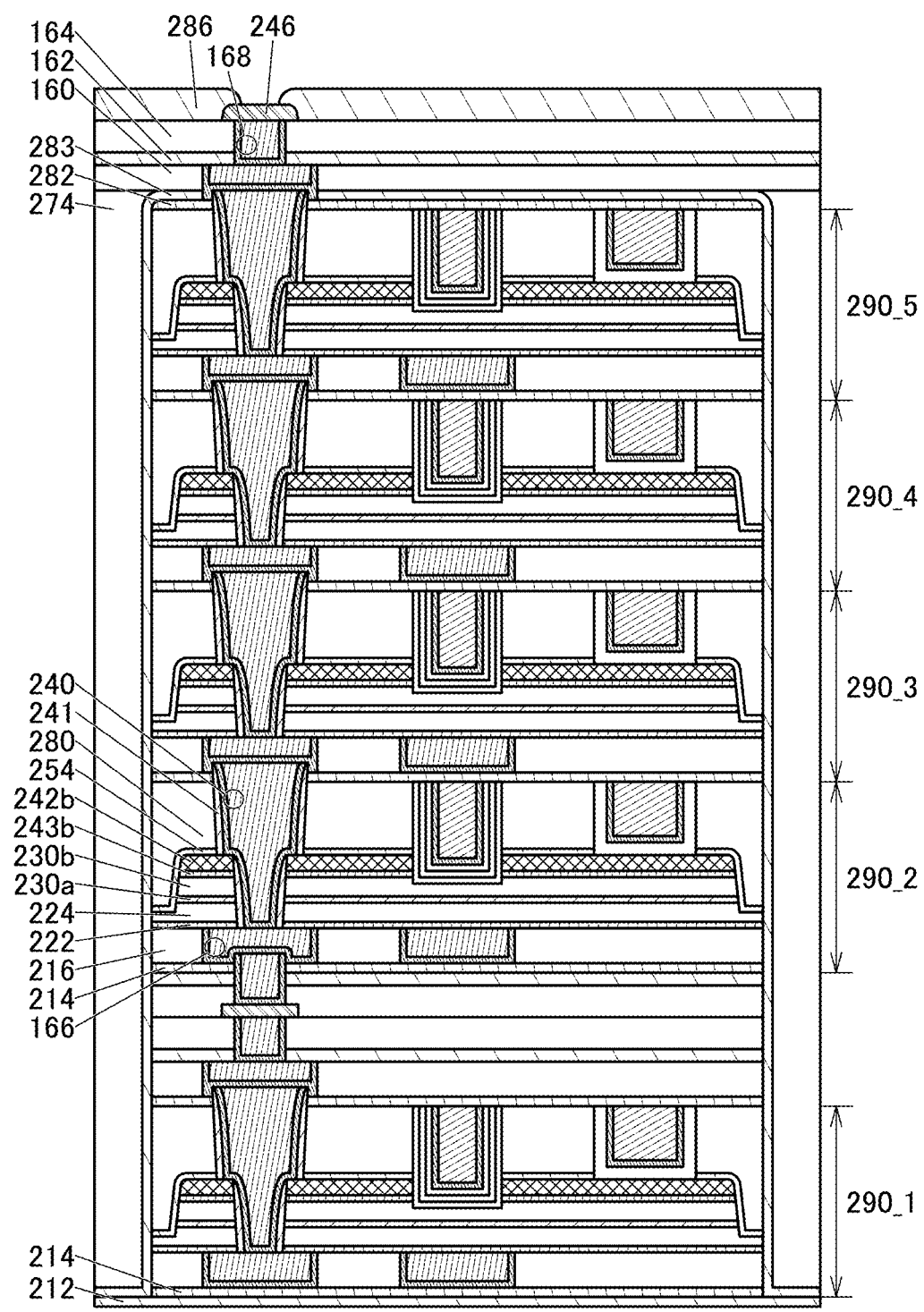
FIG. 28 is a cross-sectional view of a semiconductor device.

Note that the memory devices 290 may be stacked. FIG. 28 is a cross-sectional view of a storage device in which five layers each including the memory device 290 are stacked. As illustrated in FIG. 28, the memory device 290 is electrically connected to another memory device 290 through the conductor 240 and the conductor 166.

As illustrated in FIG. 28, a plurality of memory devices (a memory device 290_1 to a memory device 290_5) may be collectively sealed with the insulator 283 and the insulator 212. By collectively sealing the plurality of memory devices, the manufacturing process of the storage device can be simplified. Note that when some of the components of the transistor 200 and some of the components provided around the transistor 200 are formed by a sputtering method, the hydrogen concentration in the transistor 200 can be reduced. Thus, even when the transistor 200 is formed above another transistor 200, the hydrogen concentration in the transistor 200 at the lower position can be kept low. Consequently, in the case where the memory devices 290 are stacked, the hydrogen concentration in the transistors 200 can be reduced by collectively sealing a plurality of memory devices, instead of by individually sealing the memory devices 290.

Note that the insulator 283 and the insulator 212 may seal all the plurality of memory devices collectively or may seal groups of the memory devices independently.

In the case where the insulator 214 and the insulator 282 are formed using the same material, one of the insulator 214 and the insulator 282 is not necessarily provided. This can reduce the number of steps of manufacturing the storage device.

By stacking the plurality of memory devices (the memory device 290_1 to the memory device 290_5) as illustrated in FIG. 28, the memory devices can be arranged at a high density without an increase in the area occupied by the memory devices. That is, a 3D memory device can be formed.

Although FIG. 28 illustrates the structure where each layer includes one memory device, one embodiment of the present invention is not limited thereto. Each layer may include a plurality of memory devices as described previously in <Application examples of semiconductor device>; the plurality of memory devices may be arranged in the channel length direction, in the channel width direction, or in a matrix. Depending on the design, the memory devices may be arranged without regularity.

Variation Examples of Memory Device

Examples of semiconductor devices including the transistor 200 and the capacitor device 292 in this embodiment, which are different from the semiconductor device described previously in <Structure example of memory device>, will be described below with reference to FIG. 29A, FIG. 29B, and FIG. 30. Note that in the semiconductor devices illustrated in FIG. 29A, FIG. 29B, and FIG. 30, components having the same functions as the components in the semiconductor devices shown in the above embodiment and FIG. 27 are denoted by the same reference numerals. Note that the materials described in detail in the above embodiment and <Structure example of memory device> can be used as constituent materials of the transistor 200 and the capacitor device 292 in this section.

Variation Example 1 of Memory Device

An example of a semiconductor device including a memory device 600 will be described below with reference to FIG. 29A and FIG. 29B. The memory device 600 includes a transistor 200a, a transistor 200b, a capacitor device 292a, and a capacitor device 292b.

Figure 29A:
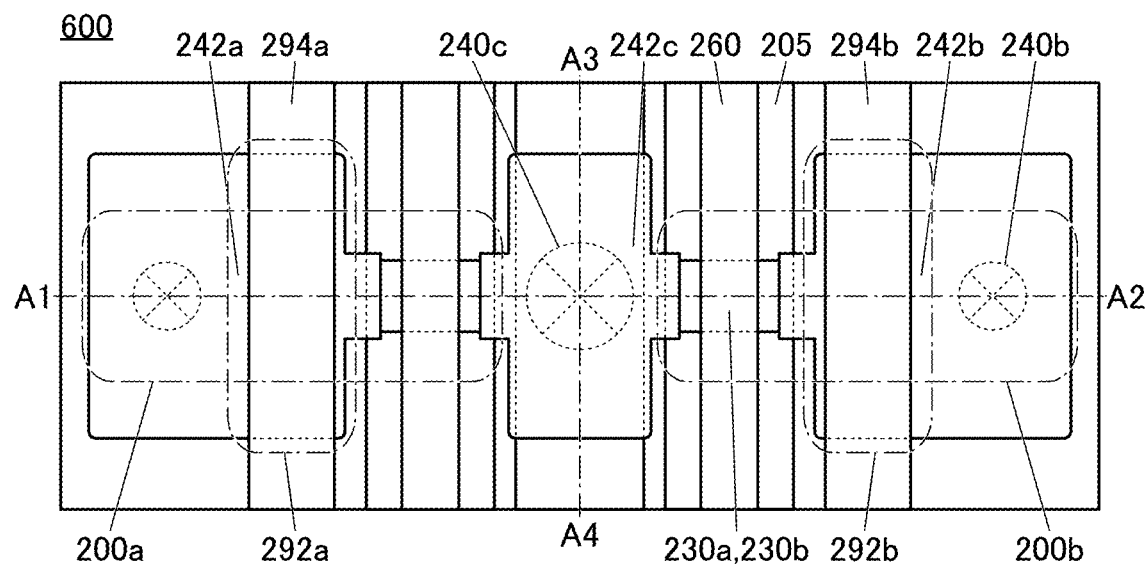
FIG. 29A is a top view of a semiconductor device.

FIG. 29A is a top view of the semiconductor device including the memory device 600. FIG. 29B is a cross-sectional view of a portion indicated by the dashed-dotted line A1-A2 in FIG. 29A and is also a cross-sectional view of the transistor 200a and the transistor 200b in the channel length direction. Note that for clarity of the drawing, some components are not shown in the top view of FIG. 29A.

Figure 29B:
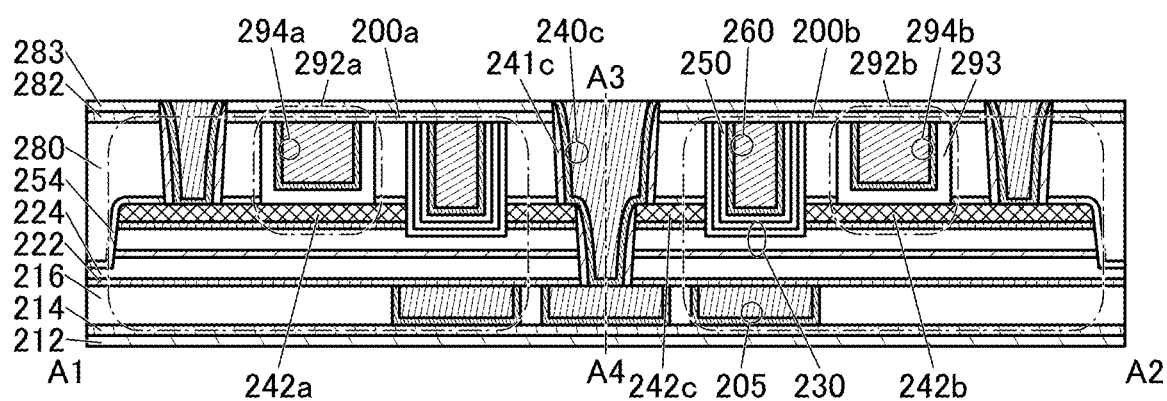
FIG. 29B is a cross-sectional view of the semiconductor device.

The memory device 600 has a line-symmetric structure with respect to the dashed-dotted line A3-A4 as shown in FIG. 29B. A conductor 242c serves as one of a source electrode and a drain electrode of the transistor 200a and one of a source electrode and a drain electrode of the transistor 200b. A conductor 240c serves as a conductor that is electrically connected to the transistor 200a and functions as a plug, and a conductor that is electrically connected to the transistor 200b and functions as a plug. An insulator 241c is provided in contact with a side surface of the conductor 240c.

When the connection of the two transistors, the two capacitor devices, the wirings, and the plugs has the above-described structure, a semiconductor device that can be miniaturized or highly integrated can be provided.

The structure examples of the semiconductor devices shown in FIG. 4A to FIG. 4D and FIG. 27 can be referred to for the structures and the effects of the transistor 200a, the transistor 200b, the capacitor device 292a, and the capacitor device 292b.

Variation Example 2 of Memory Device

Figure 30:
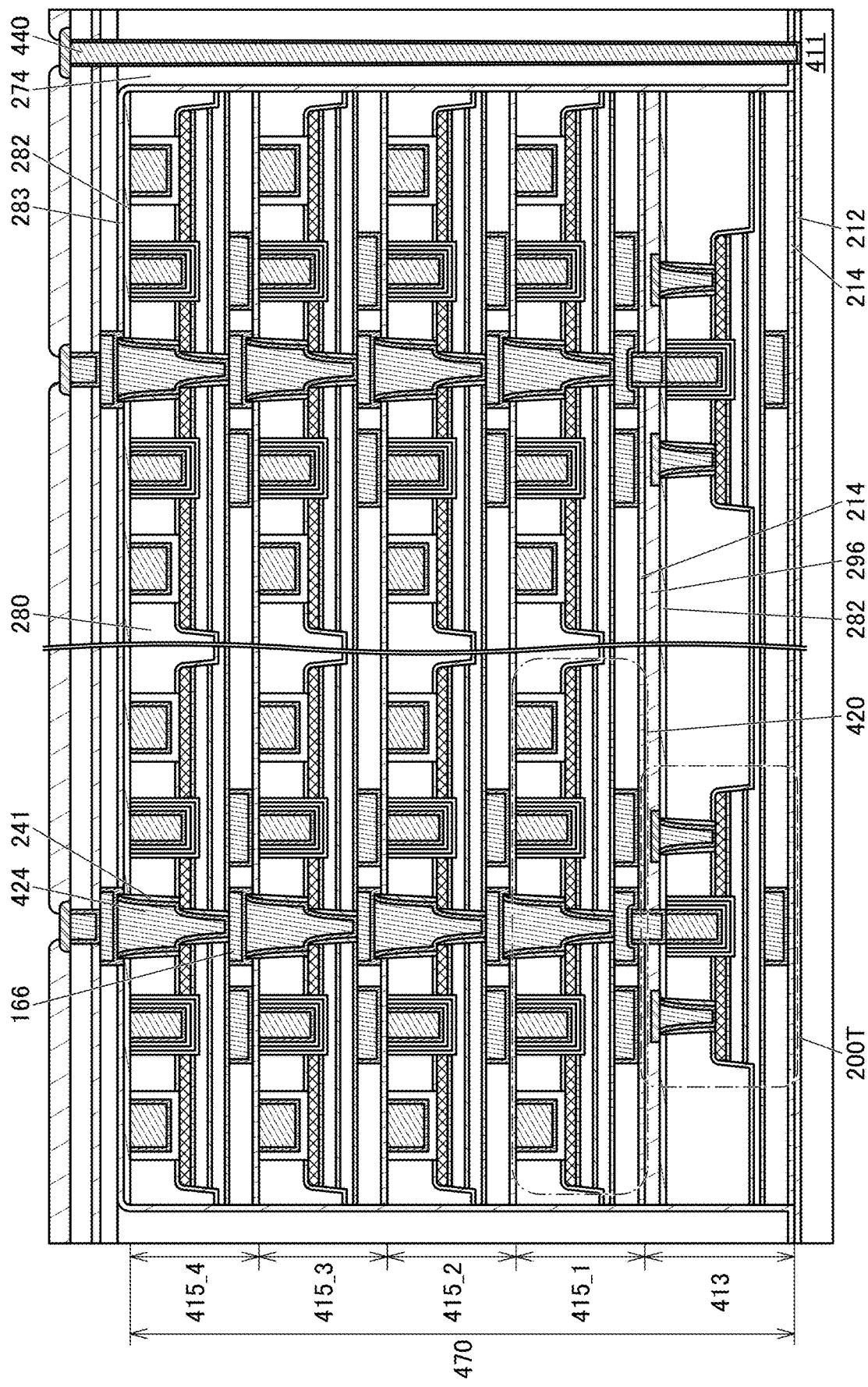
FIG. 30 is a cross-sectional view of a semiconductor device.

FIG. 30 illustrates an example in which a memory unit 470 includes a transistor layer 413 including a transistor 200T and four memory device layers 415 (a memory device layer 415_1 to a memory device layer 415_4).

The memory device layer 415_1 to the memory device layer 415_4 each include a plurality of memory devices 420. As the memory device 420, the memory device 290 illustrated in FIG. 27 or the memory device 600 illustrated in FIG. 29A and FIG. 29B can be used, for example.

The memory device 420 is electrically connected to the memory device 420 included in a different memory device layer 415 and the transistor 200T included in the transistor layer 413 through a conductor 424 and the conductor 166.

The memory unit 470 is sealed with the insulator 212, the insulator 214, the insulator 282, and the insulator 283 (such a structure is hereinafter referred to as a sealing structure for convenience). The insulator 274 is provided in the periphery of the insulator 283. A conductor 440 is provided in the insulator 274, the insulator 283, and the insulator 212, and is electrically connected to an element layer 411. Note that the insulator 287 may be provided between the memory unit 470 and the insulator 283.

The insulator 212 and the insulator 283 are preferably a material having a high blocking property against hydrogen. The insulator 214 and the insulator 282 are preferably a material having a function of trapping or fixing hydrogen.

Examples of the material having a high blocking property against hydrogen include silicon nitride and silicon nitride oxide. Examples of the material having a function of trapping or fixing hydrogen include aluminum oxide, hafnium oxide, and an oxide containing aluminum and hafnium (hafnium aluminate).

There is no particular limitation on the crystal structure of materials used for the insulator 212, the insulator 214, the insulator 282, and the insulator 283; the materials can have an amorphous or crystalline structure. For example, it is preferable to use an amorphous aluminum oxide film for the material having a function of trapping or fixing hydrogen. Amorphous aluminum oxide may trap or fix hydrogen more than aluminum oxide with high crystallinity.

The insulator 282 and the insulator 214 are preferably provided between the transistor layer 413 and the memory device layer 415_1 or between the memory device layers 415. An insulator 296 is preferably provided between the insulator 282 and the insulator 214. A material similar to that for the insulator 283 can be used for the insulator 296. Alternatively, silicon oxide or silicon oxynitride can be used. Alternatively, a known insulating material may be used.

The insulator 280 is provided inside the sealing structure. The insulator 280 has a function of releasing oxygen by heating. Alternatively, the insulator 280 includes an excess-oxygen region.

Here, the following model can be given for the reaction of excess oxygen in the insulator 280 with respect to diffusion of hydrogen from an oxide semiconductor in contact with the insulator 280.

Hydrogen in the oxide semiconductor diffuses to other components through the insulator 280 in contact with the oxide semiconductor. The hydrogen forms an OH bond with excess oxygen in the insulator 280 and diffuses in the insulator 280 as OH. When reaching a material having a function of trapping or fixing hydrogen (typically, the insulator 282), the hydrogen atom having the OH bond reacts with an oxygen atom bonded to an atom (e.g., a metal atom) in the insulator 282 and is trapped or fixed in the insulator 282. Meanwhile, the excess oxygen having the OH bond probably remains as excess oxygen in the insulator 280. That is, it is highly probable that the excess oxygen in the insulator 280 serves as a bridge in the diffusion of the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. Specifically, the heat treatment is performed at 350° C. or higher, preferably 400° C. or higher in an atmosphere containing oxygen, an atmosphere containing nitrogen, or a mixed atmosphere of oxygen and nitrogen. The heat treatment is performed for one hour or longer, preferably four hours or longer, further preferably eight hours or longer.

The heat treatment enables diffusion of hydrogen from the oxide semiconductor to the outside through the insulator 280 and the insulator 282. That is, the absolute amount of hydrogen in and near the oxide semiconductor can be reduced.

The insulator 283 is formed after the heat treatment. The insulator 283 is a material having a high blocking property against hydrogen, and thus can inhibit entry of hydrogen that has been diffused outward or external hydrogen into the inside, specifically, to the oxide semiconductor side or the insulator 280 side.

An example where the heat treatment is performed after the insulator 282 is formed is shown; however, one embodiment of the present invention is not limited thereto. For example, the heat treatment may be performed after the formation of the transistor layer 413 or after the formation of the memory device layer 415_1 to the memory device layer 415_3. When hydrogen is diffused outward by the heat treatment, hydrogen is diffused in the upward direction or the lateral direction of the transistor layer 413. Similarly, in the case where heat treatment is performed after the formation of the memory device layer 415_1 to the memory device layer 415_3, hydrogen is diffused in the upward direction or the lateral direction.

With the above manufacturing process, the sealing structure mentioned above can be formed by bonding the insulator 212 and the insulator 283.

According to the above, a highly reliable semiconductor device and a manufacturing method thereof can be provided. Moreover, according to one embodiment of the present invention, a semiconductor device having favorable electrical characteristics and a manufacturing method thereof can be provided.

The compositions, structures, methods, and the like described in this embodiment can be used in an appropriate combination with the compositions, structures, methods, and the like described in the other embodiments.

Embodiment 5

In this embodiment, a storage device of one embodiment of the present invention including a transistor in which an oxide is used for a semiconductor (hereinafter sometimes referred to as an OS transistor) and a capacitor (hereinafter sometimes referred to as an OS memory device) will be described with reference to FIG. 31A and FIG. 31B and FIG. 32A to FIG. 32H. The OS memory device is a storage device including at least a capacitor and an OS transistor that controls the charging and discharging of the capacitor. Since the OS transistor has an extremely low off-state current, the OS memory device has excellent retention characteristics and can function as a nonvolatile memory.

Configuration Example of Storage Device

Figure 31A:
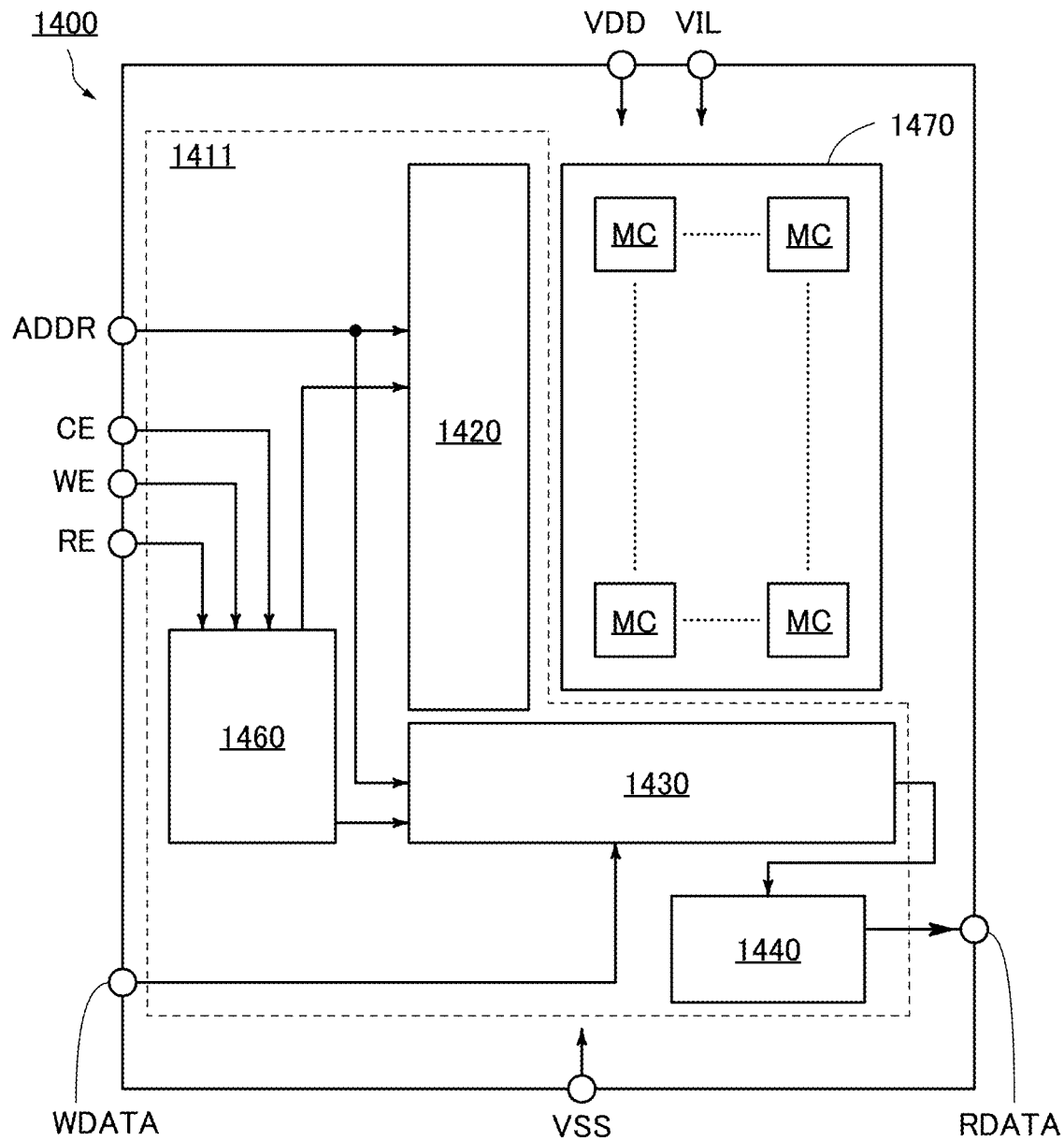
FIG. 31A is a block diagram illustrating a configuration example of a storage device.

FIG. 31A illustrates an example of the configuration of an OS memory device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes a column decoder, a precharge circuit, a sense amplifier, and a write circuit, for example. The precharge circuit has a function of precharging wirings. The sense amplifier has a function of amplifying a data signal read from a memory cell. Note that the wirings are connected to memory cells included in the memory cell array 1470 and will be described later in detail. The amplified data signal is output as a data signal RDATA to the outside of the storage device 1400 through the output circuit 1440. The row circuit 1420 includes a row decoder and a word line driver circuit, for example, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 to the row circuit 1420 depends on the configuration of the memory cell MC, the number of memory cells MC in one column, and the like. The number of wirings that connect the memory cell array 1470 to the column circuit 1430 depends on the configuration of the memory cell MC, the number of memory cells MC in one row, and the like.

Figure 31B:
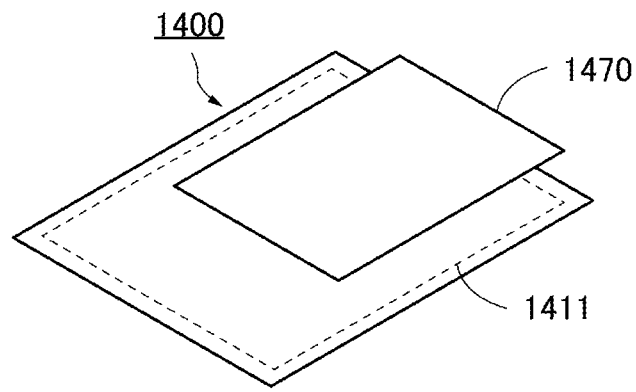
FIG. 31B is a schematic diagram illustrating a configuration example of a storage device.

Note that FIG. 31A illustrates an example in which the peripheral circuit 1411 and the memory cell array 1470 are formed on the same plane; however, this embodiment is not limited thereto. For example, as illustrated in FIG. 31B, the memory cell array 1470 may be provided to overlap part of the peripheral circuit 1411. For example, the sense amplifier may be provided below the memory cell array 1470 so that they overlap each other.

FIG. 32A to FIG. 32H show configuration examples of a memory cell that can be applied to the memory cell MC.

[DOSRAM]

Figure 32A:
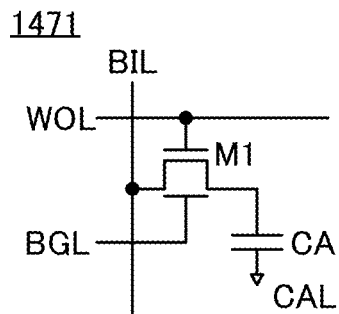
FIG. 32A to FIG. 32H are circuit diagrams each illustrating a configuration example of a storage device.
Figure 32B:
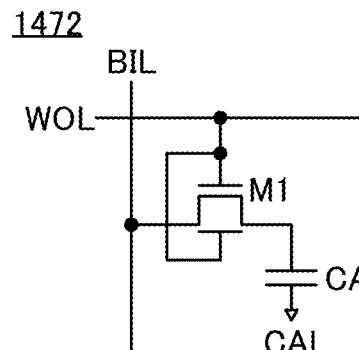
Figure 32C:
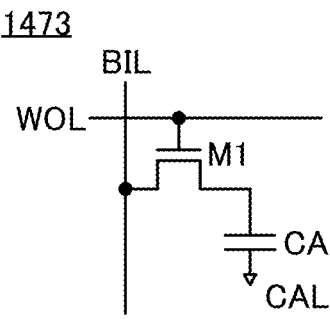

FIG. 32A to FIG. 32C show circuit configuration examples of DRAM memory cells. In this specification and the like, a DRAM using a memory cell including one OS transistor and one capacitor is referred to as a DOSRAM (Dynamic Oxide Semiconductor Random Access Memory) in some cases. A memory cell 1471 illustrated in FIG. 32A includes a transistor M1 and a capacitor CA. Note that the transistor M1 includes a gate (also sometimes referred to as a top gate) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 illustrated in FIG. 32A corresponds to the storage device illustrated in FIG. 27. That is, the transistor M1 and the capacitor CA correspond to the transistor 200 and the capacitor device 292, respectively.

The memory cell MC is not limited to the memory cell 1471, and the circuit configuration can be changed. For example, as in a memory cell 1472 illustrated in FIG. 32B, the back gate of the transistor M1 may be connected not to the wiring BGL but to the wiring WOL in the memory cell MC. As another example of the memory cell MC, the transistor M1 may be a single-gate transistor, that is, a transistor without a back gate, as in a memory cell 1473 illustrated in FIG. 32C.

In the case where the semiconductor device described in the above embodiment is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long period of time, and thus the frequency of the refresh operation for the memory cell can be decreased. Alternatively, refresh operation for the memory cell can be omitted. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap each other as described above, the bit line can be shortened. This reduces bit line capacitance, which can reduce the storage capacitance of the memory cell.

[NOSRAM]

FIG. 32D to FIG. 32G show circuit configuration examples of gain-cell memory cells each including two transistors and one capacitor. A memory cell 1474 illustrated in FIG. 32D includes a transistor M2, a transistor M3, and a capacitor CB. Note that the transistor M2 includes a top gate (simply referred to as a gate in some cases) and a back gate. In this specification and the like, a storage device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 32D:
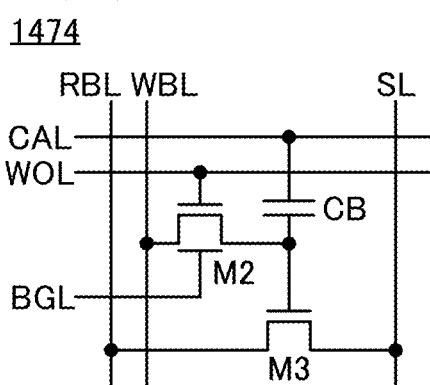
Figure 32E:
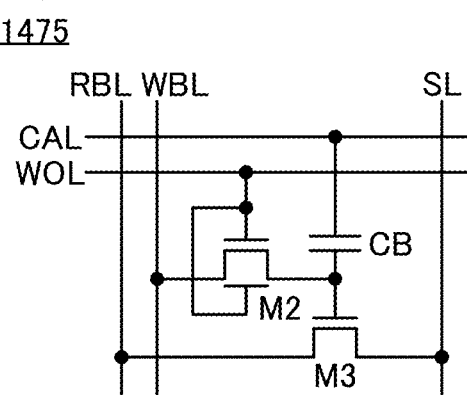
Figure 32F:
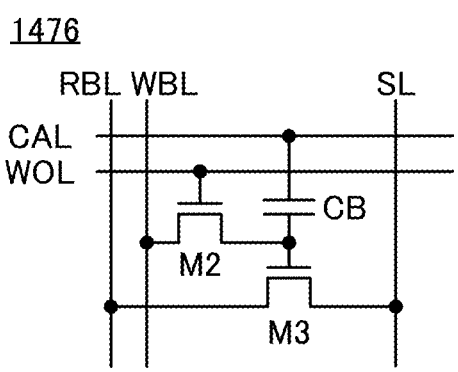
Figure 32G:
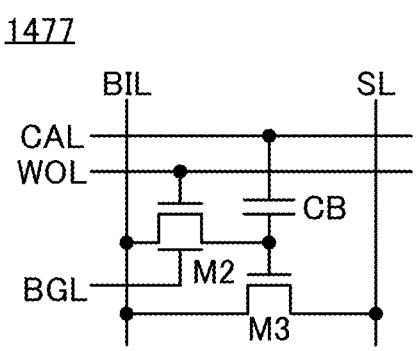

Here, the memory cell 1474 illustrated in FIG. 32D corresponds to the storage device illustrated in FIG. 25. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

The memory cell MC is not limited to the memory cell 1474, and the circuit configuration can be changed as appropriate. For example, as in a memory cell 1475 illustrated in FIG. 32E, the back gate of the transistor M2 may be connected not to the wiring BGL but to the wiring WOL in the memory cell MC. As another example of the memory cell MC, the transistor M2 may be a single-gate transistor, that is, a transistor without a back gate, as in a memory cell 1476 illustrated in FIG. 32F. As another example, the memory cell MC may have a configuration in which the wiring WBL and the wiring RBL are combined into one wiring BIL as in a memory cell 1477 illustrated in FIG. 32G.

In the case where the semiconductor device described in the above embodiment is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the transistor M2; thus, the frequency of refresh of the memory cell can be reduced. Alternatively, refresh operation for the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the storage device can be achieved.

Alternatively, the transistor M3 may be an OS transistor. When OS transistors are used as the transistor M2 and the transistor M3, the circuit of the memory cell array 1470 can be formed using only n-channel transistors.

Figure 32H:
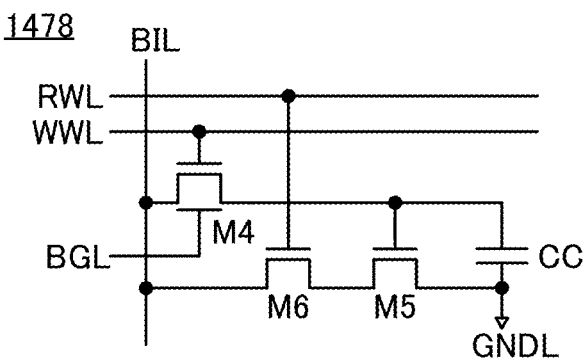

FIG. 32H illustrates an example of a gain-cell memory cell including three transistors and one capacitor. A memory cell 1478 illustrated in FIG. 32H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In that case, the circuit of the memory cell array 1470 can be formed using only n-channel transistors.

In the case where the semiconductor device described in the above embodiment is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the configurations of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

Figure 33:
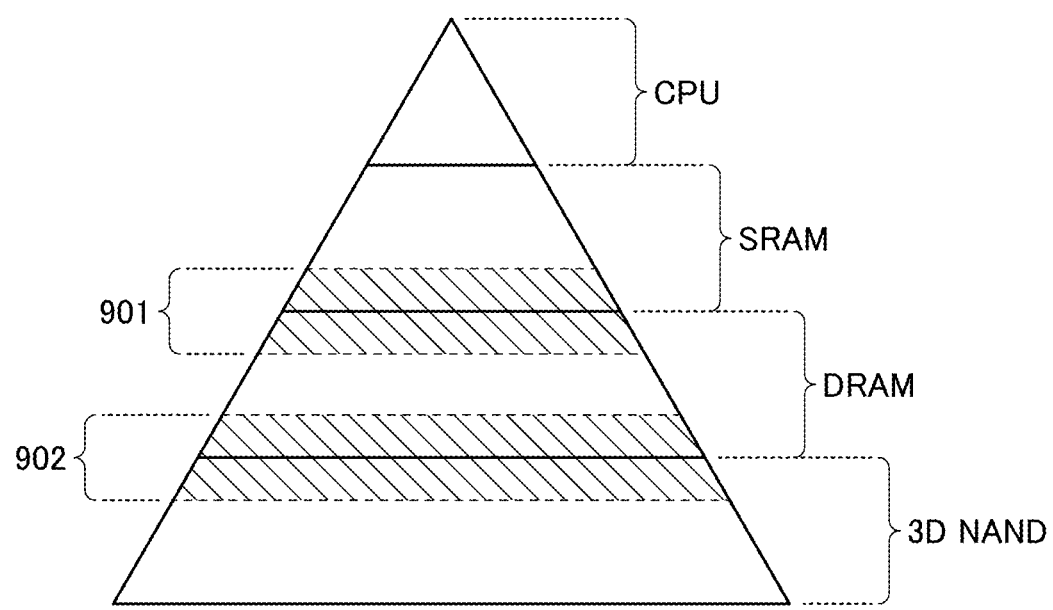
FIG. 33 is a diagram illustrating a hierarchy of a variety of storage devices.

In general, a variety of storage devices (memories) are used in semiconductor devices such as computers in accordance with the intended use. FIG. 33 shows a hierarchy of various storage devices. The storage devices at the upper levels require high access speeds, and the storage devices at the lower levels require large memory capacity and high memory density. In FIG. 33, sequentially from the top level, a memory combined as a register in an arithmetic processing device such as a CPU, an SRAM (Static Random Access Memory), a DRAM (Dynamic Random Access Memory), and a 3D NAND memory are shown.

A memory combined as a register in an arithmetic processing device such as a CPU is used for temporary storage of arithmetic operation results, for example, and thus is very frequently accessed by the arithmetic processing device. Accordingly, high operating speed is required rather than memory capacity. The register also has a function of retaining setting information of the arithmetic processing device, for example.

An SRAM is used for a cache, for example. The cache has a function of retaining a copy of part of data retained in a main memory. By copying data that is frequently used and holding the copy of the data in the cache, the access speed to the data can be increased.

A DRAM is used for the main memory, for example. The main memory has a function of retaining a program or data that is read from a storage. The memory density of a DRAM is approximately 0.1 to 0.3 $Gbit/mm^2$.

A 3D NAND memory is used for a storage, for example. The storage has a function of retaining data that needs to be retained for a long time and various programs used in an arithmetic processing device, for example. Therefore, the storage needs to have a high memory capacity and a high memory density rather than operating speed. The memory density of a storage device used for a storage is approximately 0.6 to 6.0 $Gbit/mm^2$.

The storage device of one embodiment of the present invention operates fast and can retain data for a long time. The storage device of one embodiment of the present invention can be favorably used as a storage device in a boundary region 901 including both the level in which the cache is placed and the level in which the main memory is placed. Moreover, the storage device of one embodiment of the present invention can be favorably used as a storage device in a boundary region 902 including both the level in which the main memory is placed and the level in which the storage is placed.

The structure described in this embodiment can be used in an appropriate combination with the structures described in the other embodiments.

Embodiment 6

In this embodiment, an example of a chip 1200 on which the semiconductor device of the present invention is mounted will be described with reference to FIG. 34A and FIG. 34B. A plurality of circuits (systems) are mounted on the chip 1200. A technique for integrating a plurality of circuits (systems) into one chip is referred to as system on chip (SoC) in some cases.

Figure 34A:
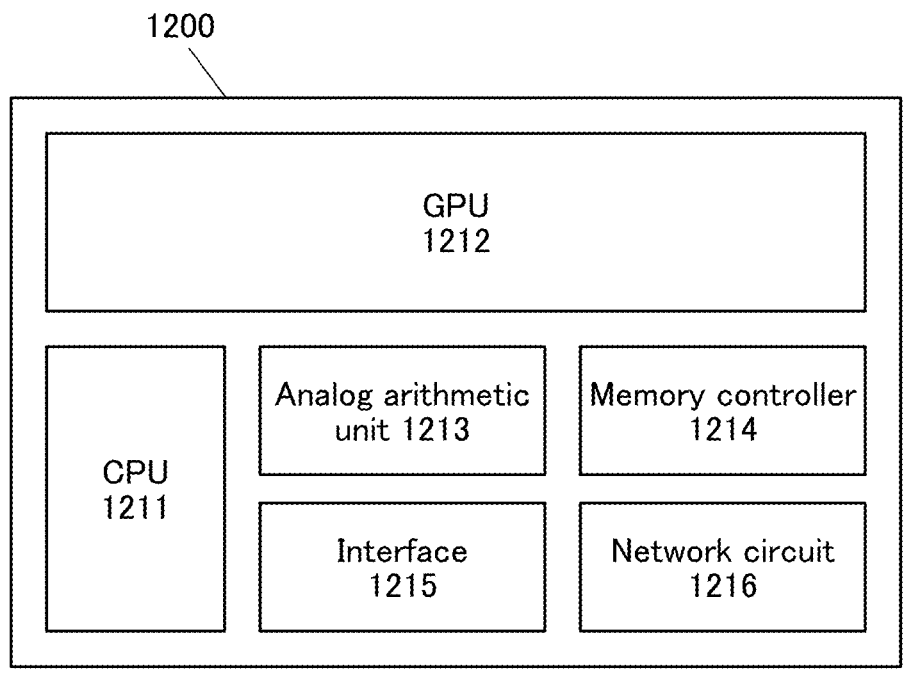
FIG. 34A is a block diagram of a semiconductor device.

As illustrated in FIG. 34A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 34B:
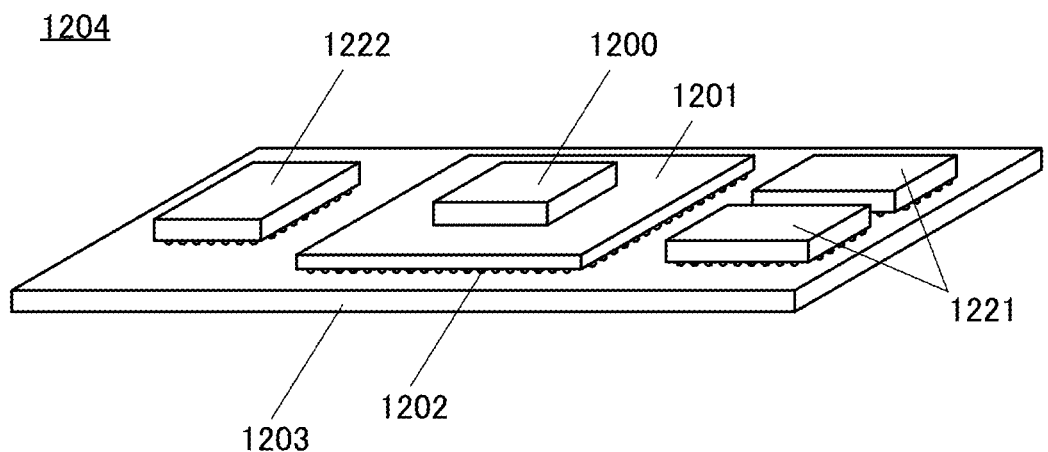
FIG. 34B is a schematic diagram of a semiconductor device.

A bump (not illustrated) is provided on the chip 1200 and is connected to a first surface of a printed circuit board (PCB) 1201 as illustrated in FIG. 34B. A plurality of bumps 1202 are provided on the rear side of the first surface of the PCB 1201, and the PCB 1201 is connected to a motherboard 1203.

Storage devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing and product-sum operation. When an image processing circuit and a product-sum operation circuit that use an oxide semiconductor of the present invention are provided in the GPU 1212, image processing and product-sum operation can be performed with low power consumption.

Since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a gaming controller. As such an interface, a USB (Universal Serial Bus), an HDMI (registered trademark) (High-Definition Multimedia Interface), or the like can be used.

The network circuit 1216 includes a circuit for a network such as a LAN (Local Area Network). The network circuit 1216 may also include a circuit for network security.

The circuits (systems) can be formed in the chip 1200 through the same manufacturing process. Therefore, even when the number of circuits needed for the chip 1200 increases, there is no need to increase the number of manufacturing processes; thus, the chip 1200 can be fabricated at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments.

Embodiment 7

This embodiment will show examples of electronic components and an electronic device that include the storage device of the above embodiment and the like.

<Electronic Components>

First, examples of electronic components in which a storage device 720 is incorporated are described with reference to FIG. 35A and FIG. 35B.

Figure 35A:
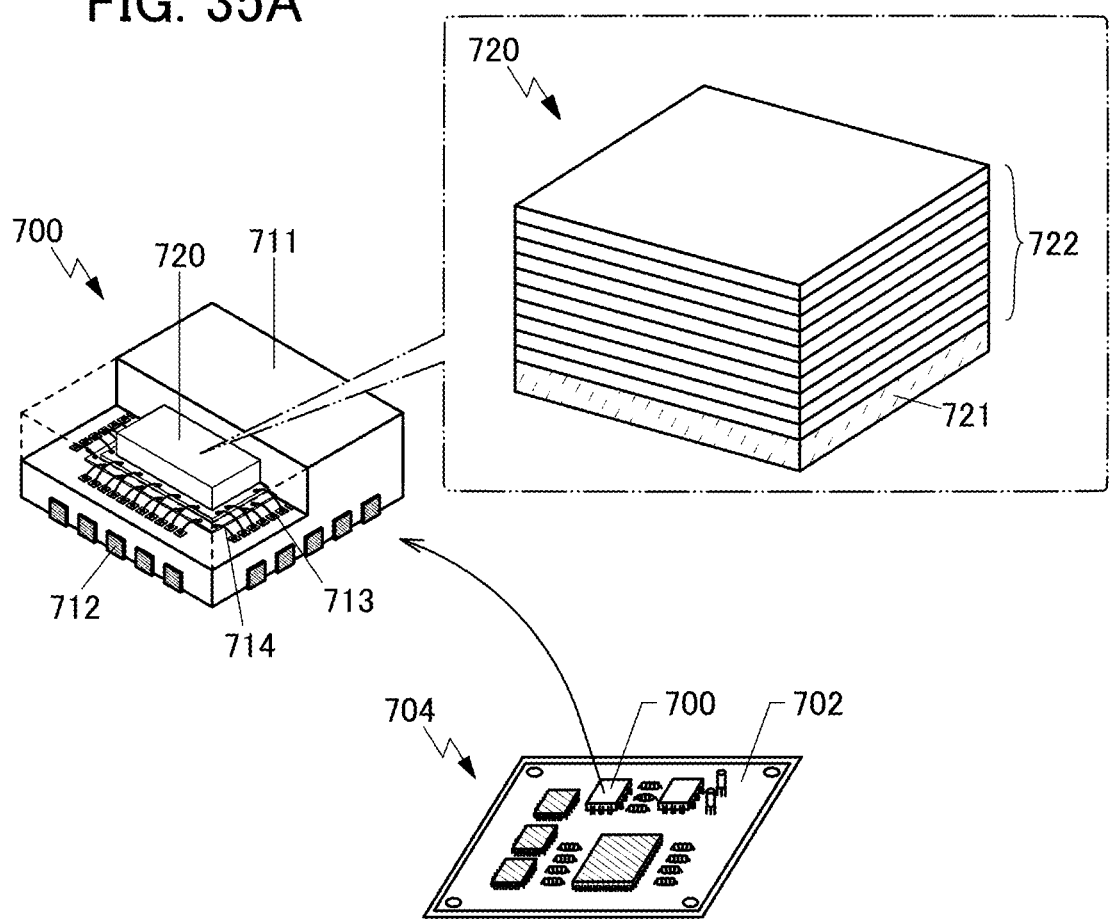
FIG. 35A and FIG. 35B are diagrams illustrating examples of electronic components.

FIG. 35A is a perspective view of an electronic component 700 and a substrate (a circuit board 704) on which the electronic component 700 is mounted. The electronic component 700 illustrated in FIG. 35A includes the storage device 720 in a mold 711. FIG. 35A omits part of the electronic component to show the inside of the electronic component 700. The electronic component 700 includes a land 712 outside the mold 711. The land 712 is electrically connected to an electrode pad 713, and the electrode pad 713 is electrically connected to the storage device 720 with a wire 714. The electronic component 700 is mounted on a printed circuit board 702, for example. A plurality of such electronic components are combined and electrically connected to each other on the printed circuit board 702, which forms the circuit substrate 704.

The storage device 720 includes a driver circuit layer 721 and a storage circuit layer 722.

Figure 35B:
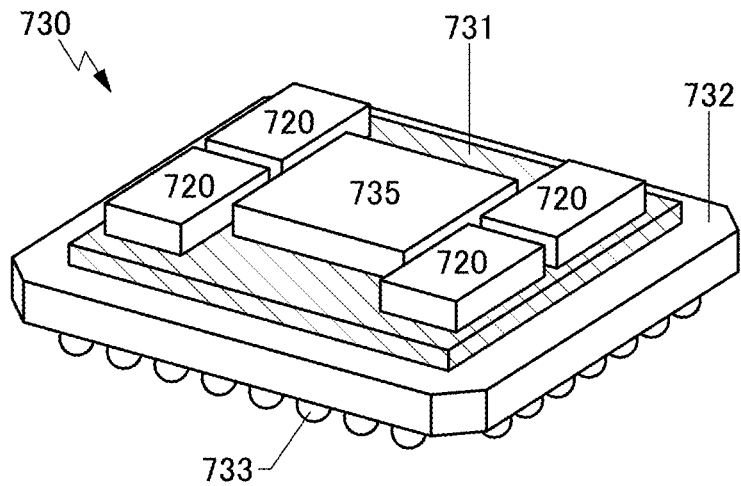

FIG. 35B is a perspective view of an electronic component 730. The electronic component 730 is an example of a SiP (System in package) or an MCM (Multi Chip Module). In the electronic component 730, an interposer 731 is provided over a package substrate 732 (a printed circuit board), and a semiconductor device 735 and a plurality of storage devices 720 are provided over the interposer 731.

The electronic component 730 using the storage device 720 as a high bandwidth memory (HBM) is shown as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. The interposer 731 has a function of electrically connecting an integrated circuit provided over the interposer 731 to an electrode provided over the package substrate 732. Accordingly, the interposer is sometimes referred to as a redistribution substrate or an intermediate substrate. A through electrode may be provided in the interposer 731 to be used for electrically connecting the integrated circuit and the package substrate 732. In the case of using a silicon interposer, a TSV (Through Silicon Via) can also be used as the through electrode.

A silicon interposer is preferably used as the interposer 731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in the coefficient of expansion between an integrated circuit and the interposer is less likely to occur. Furthermore, a surface of a silicon interposer has high planarity; hence, a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

A heat sink (a radiator plate) may be provided to overlap the electronic component 730. In the case of providing a heat sink, the heights of integrated circuits provided on the interposer 731 are preferably equal to each other. In the electronic component 730 of this embodiment, the heights of the storage device 720 and the semiconductor device 735 are preferably equal to each other, for example.

An electrode 733 may be provided on the bottom portion of the package substrate 732 to mount the electronic component 730 on another substrate. FIG. 35B illustrates an example in which the electrode 733 is formed of a solder ball. Solder balls are provided in a matrix on the bottom portion of the package substrate 732, whereby BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate in various mounting methods, not limited to the BGA and the PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be implemented in an appropriate combination with any of the structures described in the other embodiments.

Embodiment 8

In this embodiment, application examples of storage devices using the semiconductor device described in the above embodiment will be described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 36A to FIG. 36E schematically show some structure examples of removable storage devices. The semiconductor device described in the above embodiment is processed into a packaged memory chip and used in a variety of storage devices and removable memories, for example.

Figure 36A:
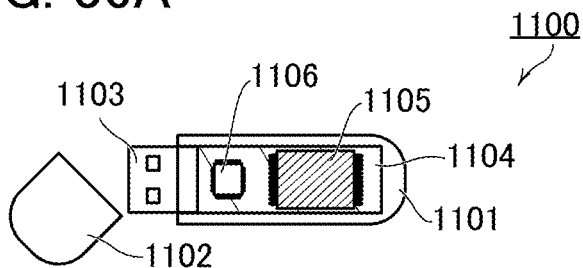
FIG. 36A to FIG. 36E are schematic views of storage devices.

FIG. 36A is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

Figure 36B:
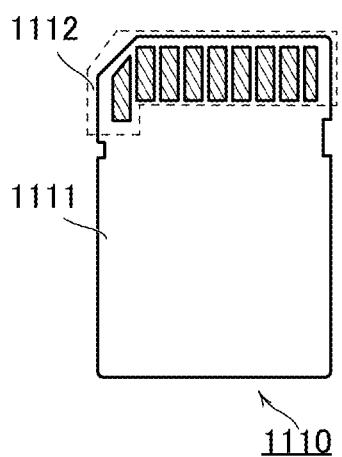
Figure 36C:
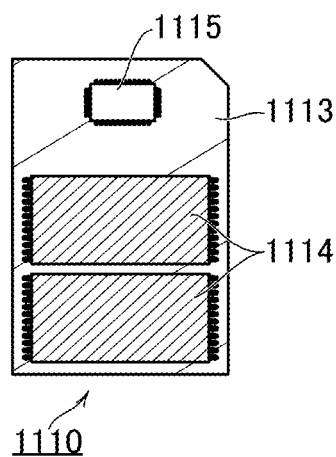

FIG. 36B is a schematic external view of an SD card, and FIG. 36C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. In that case, data can be read from and written to the memory chip 1114 through radio communication between a host device and the SD card 1110. The semiconductor device described in the above embodiment can be incorporated in the memory chip 1114 or the like.

Figure 36D:
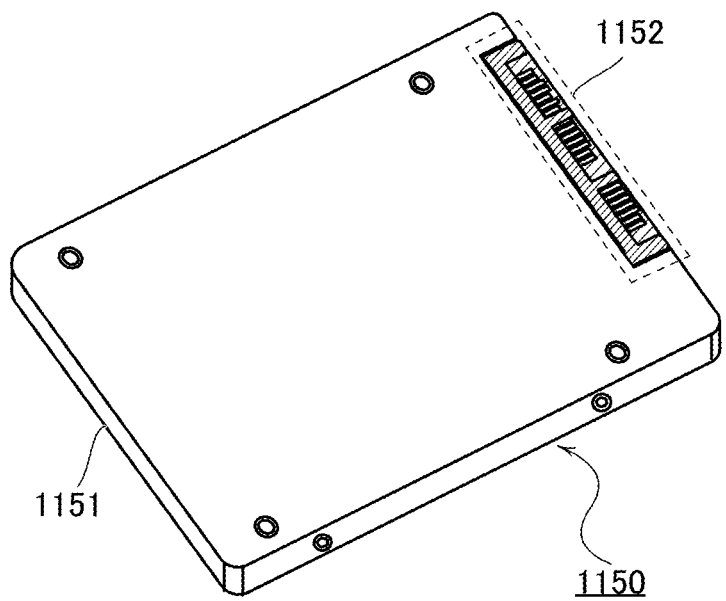
Figure 36E:
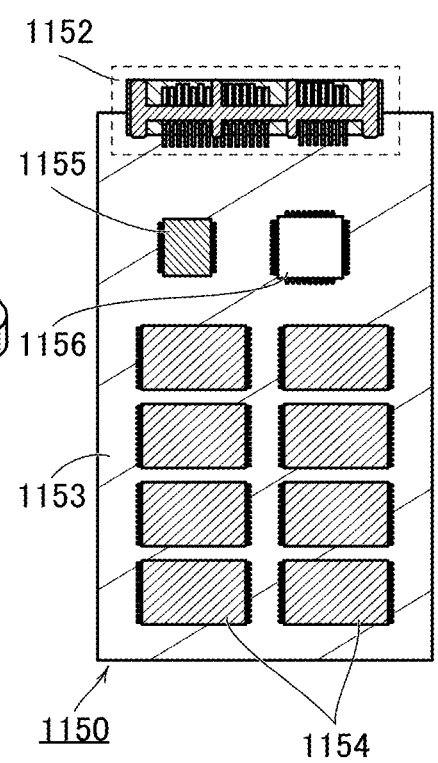

FIG. 36D is a schematic external view of an SSD, and FIG. 36E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

This embodiment can be implemented in an appropriate combination with any of the structures described in the other embodiments.

Embodiment 9

The semiconductor device of one embodiment of the present invention can be used in a processor such as a CPU and a GPU or a chip. FIG. 37A to FIG. 37H show specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium. FIG. 37A to FIG. 37H show examples of electronic devices.

[Information Terminal]

Figure 37A:
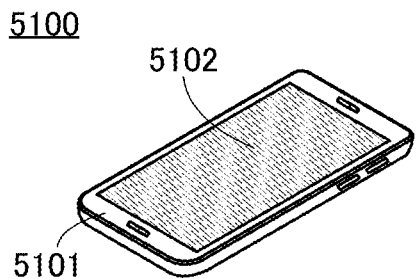
FIG. 37A to FIG. 37H are diagrams illustrating electronic devices.

FIG. 37A illustrates a mobile phone (a smartphone), which is a type of information terminal. An information terminal 5100 includes a housing 5101 and a display portion 5102. As input interfaces, a touch panel is provided in the display portion 5102, and a button is provided in the housing 5101.

When the chip of one embodiment of the present invention is used in the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 37B:
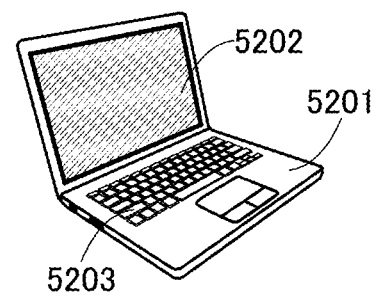

FIG. 37B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is used in the notebook information terminal 5200, the notebook information terminal 5200 can execute an application utilizing artificial intelligence. Examples of the application utilizing artificial intelligence include design-support software, text correction software, and software for automatic menu generation. Furthermore, with the use of the notebook information terminal 5200, novel artificial intelligence can be developed.

Note that although FIG. 37A and FIG. 37B show a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 37C:
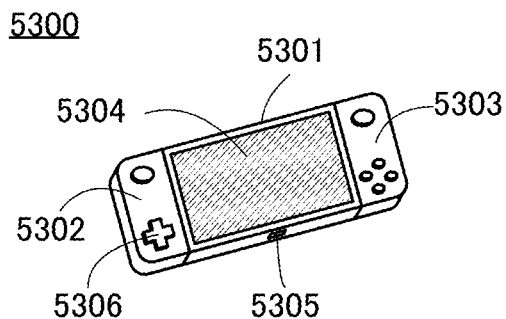

FIG. 37C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302 and the housing 5303, for example.

Figure 37D:
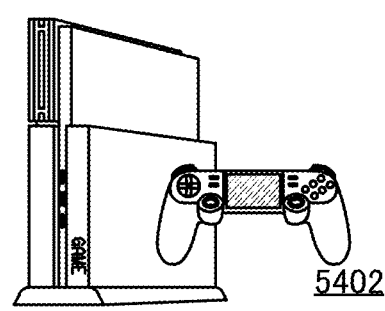

FIG. 37D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is used in the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, questions posed by the player, the progress of the game, timing when an event occurs in the game, the actions and words of the game characters, and the like can be changed for various expressions without being limited by the game program.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 37C and FIG. 37D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 37E:
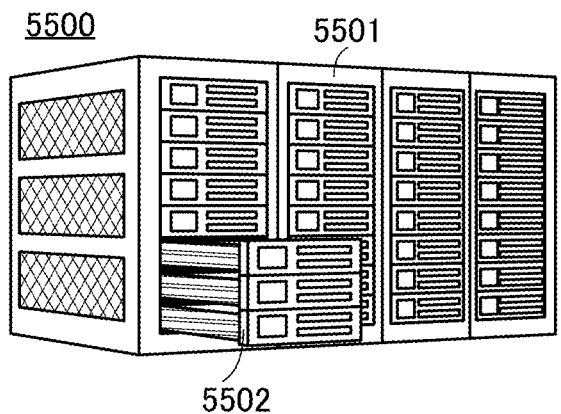
Figure 37F:
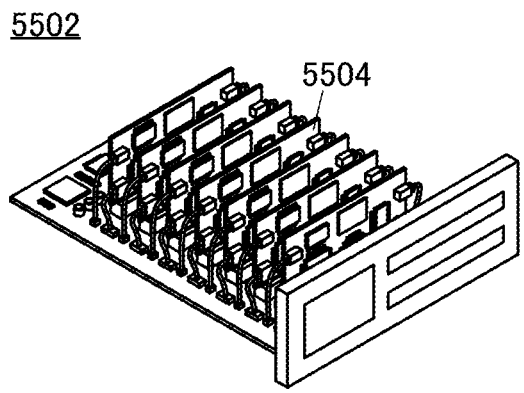

FIG. 37E illustrates a supercomputer 5500 as an example of a large computer. FIG. 37F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific computation. In scientific computation, an enormous amount of arithmetic operation needs to be processed at high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is shown as an example of a large computer in FIG. 37E and FIG. 37F, a large computer using the GPU or the chip of one embodiment of the present invention is not limited thereto. Examples of a large computer using the GPU or the chip of one embodiment of the present invention include a computer that provides service (a server) and a large general-purpose computer (a mainframe).

[Moving Vehicle]

The GPU or the chip of one embodiment of the present invention can be used in an automobile, which is a moving vehicle, and around a driver's seat in the automobile.

Figure 37G:
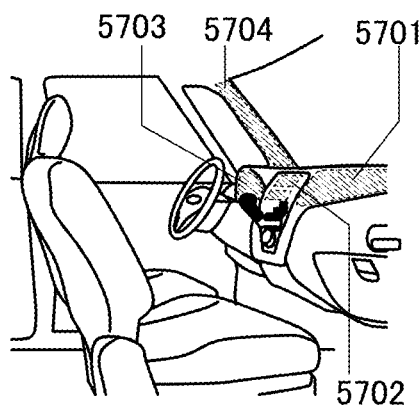

FIG. 37G illustrates an area around a windshield inside an automobile, which is an example of a moving vehicle. FIG. 37G illustrates a display panel 5701, a display panel 5702, and a display panel 5703 that are attached to a dashboard and a display panel 5704 that is attached to a pillar.

The display panel 5701 to the display panel 5703 can provide a variety of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for the view obstructed by the pillar (a blind spot) by showing a video taken by an imaging device (not illustrated) provided on the outside of the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be used as a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is used in these moving vehicles.

[Household Appliance]

Figure 37H:
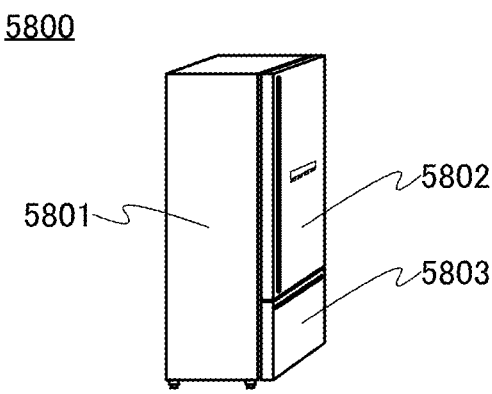

FIG. 37H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as an example of a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in an appropriate combination with any of the structures described in the other embodiments.

REFERENCE NUMERALS

100: capacitor, 110: conductor, 112: conductor, 115: conductor, 120: conductor, 125: conductor, 130: insulator, 140: conductor, 142: insulator, 145: insulator, 150: insulator, 152: insulator, 153: conductor, 154: insulator, 156: insulator, 160: insulator, 162: insulator, 164: insulator, 166: conductor, 168: conductor, 200: transistor, 200_n: transistor, 200_1: transistor, 200a: transistor, 200A: transistor, 200b: transistor, 200T: transistor, 205: conductor, 205a: conductor, 205b: conductor, 210: insulator, 212: insulator, 214: insulator, 216: insulator, 217: insulator, 218: conductor, 222: insulator, 224: insulator, 230: oxide, 230a: oxide, 230A: oxide film, 230b: oxide, 230B: oxide film, 230c: oxide, 230C: oxide film, 230d: oxide, 230D: oxide film, 234: region, 236a: region, 236b: region, 240: conductor, 240a: conductor, 240b: conductor, 240c: conductor, 241: insulator, 241a: insulator, 241b: insulator, 241c: insulator, 242a: conductor, 242A: conductive film, 242b: conductor, 242B: conductive layer, 242c: conductor, 243a: oxide, 243A: oxide film, 243b: oxide, 243B: oxide layer, 246: conductor, 246a: conductor, 246b: conductor, 250: insulator, 250A: insulating film, 254: insulator, 260: conductor, 260a: conductor, 260A: conductive film, 260b: conductor, 260B: conductive film, 265: sealing portion, 265a: sealing portion, 265b: sealing portion, 271a: insulator, 271b: insulator, 274: insulator, 274A: insulating film, 280: insulator, 280A: insulating film, 282: insulator, 283: insulator, 286: insulator, 287: insulator, 290: memory device, 290_1: memory device, 290_5: memory device, 292: capacitor device, 292a: capacitor device, 292b: capacitor device, 293: insulator, 294: conductor, 296: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 411: element layer, 413: transistor layer, 415: memory device layer, 415_1: memory device layer, 415_3: memory device layer, 415_4: memory device layer, 420: memory device, 424: conductor, 440: conductor, 470: memory unit, 600: memory device, 700: electronic component, 702: printed circuit board, 704: circuit board, 711: mold, 712: land, 713: electrode pad, 714: wire, 720: storage device, 721: driver circuit layer, 722: storage circuit layer, 730: electronic component, 731: interposer, 732: package substrate, 733: electrode, 735: semiconductor device, 901: boundary region, 902: boundary region, 1001: wiring, 1002: wiring, 1003: wiring, 1004: wiring, 1005: wiring, 1006: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: storage device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 4000: apparatus, 4010: atmosphere-side substrate supply chamber, 4012: atmosphere-side substrate transfer chamber, 4014: cassette port, 4016: alignment port, 4018: transfer robot, 4020a: load lock chamber, 4020b: unload lock chamber, 4024a: treatment chamber, 4024b: treatment chamber, 4024c: treatment chamber, 4024d: treatment chamber, 4026: transfer robot, 4028: gate valve, 4029: transfer chamber, 4030: transport chamber, 4034a: treatment chamber, 4034b: treatment chamber, 4034c: treatment chamber, 4036: transfer robot, 4038: gate valve, 4039: transfer chamber, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: type game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door

The invention claimed is:

1. A method for manufacturing a semiconductor device, comprising:

a first step of forming a first insulator, a second insulator, and a third insulator in this order;

a second step of forming a fourth insulator, a fifth insulator, a first oxide film, a second oxide film, and a third oxide film in this order;

a third step of forming a conductive film over and in contact with the third oxide film;

a fourth step of processing the first oxide film, the second oxide film, the third oxide film, and the conductive film, thereby forming a first oxide, a second oxide, an oxide layer, and a conductive layer each having an island shape;

a fifth step of forming a sixth insulator and an insulating film in this order;

a sixth step of planarizing the insulating film;

a seventh step of processing the insulating film, the sixth insulator, the conductive layer, and the oxide layer, thereby forming a first conductor, a second conductor, a third oxide, a fourth oxide, and an opening reaching the second oxide;

an eighth step of forming a seventh insulator in contact with the insulating film, the sixth insulator, the first conductor, the second conductor, the third oxide, and the fourth oxide in the opening;

a ninth step of forming a third conductor over the seventh insulator in the opening; and a tenth step of forming an eighth insulator and a ninth insulator in this order, wherein the first step is performed using a first multi-chamber apparatus, wherein the second step is performed using a second multi-chamber apparatus, wherein the fifth step is performed using a third multi-chamber apparatus, and wherein the tenth step is performed using a fourth multi-chamber apparatus.

2. The method for manufacturing a semiconductor device, according to claim 1, wherein the fourth insulator, the fifth insulator, the first oxide film, the second oxide film, and the third oxide film are formed by a sputtering method.

3. The method for manufacturing a semiconductor device, according to claim 1, wherein the first insulator, the second insulator, and the third insulator are formed by a sputtering method.

4. The method for manufacturing a semiconductor device, according to claim 1, wherein the sixth insulator and the insulating film are formed by a sputtering method.

5. The method for manufacturing a semiconductor device, according to claim 1, wherein the second oxide film is formed using an In-M-Zn oxide target, where Mis gallium, aluminum, yttrium, or tin.

6. The method for manufacturing a semiconductor device, according to claim 1, wherein the first multi-chamber apparatus, the third multi-chamber apparatus, and the fourth multi-chamber apparatus are the same apparatus.

7. A method for manufacturing a semiconductor device, comprising:

a first step of forming a first insulator, a second insulator, and a third insulator in this order;

a second step of forming a fourth insulator, a fifth insulator, a first oxide film, a second oxide film, and a third oxide film in this order;

a third step of forming a conductive film over and in contact with the third oxide film;

a fourth step of processing the first oxide film, the second oxide film, the third oxide film, and the conductive film, thereby forming a first oxide, a second oxide, an oxide layer, and a conductive layer each having an island shape;

a fifth step of forming a sixth insulator and an insulating film in this order;

a sixth step of planarizing the insulating film;

a seventh step of processing the insulating film, the sixth insulator, the conductive layer, and the oxide layer, thereby forming a first conductor, a second conductor, a third oxide, a fourth oxide, and an opening where a top surface of the second oxide is exposed;

an eighth step of forming a seventh insulator and a third conductor in this order;

a ninth step of forming an eighth insulator;

a tenth step of processing the eighth insulator, the insulating film, the sixth insulator, the fifth insulator, the fourth insulator, the third insulator, and the second insulator, thereby exposing a top surface of the first insulator; and an eleventh step of forming a ninth insulator and a tenth insulator in this order, wherein the first step is performed using a first multi-chamber apparatus, wherein the second step is performed using a second multi-chamber apparatus, wherein the fifth step is performed using a third multi-chamber apparatus, and wherein the eleventh step is performed using a fourth multi-chamber apparatus.

8. The method for manufacturing a semiconductor device, according to claim 7, wherein the fourth insulator, the fifth insulator, the first oxide film, the second oxide film, and the third oxide film are formed by a sputtering method.

9. The method for manufacturing a semiconductor device, according to claim 7, wherein the first insulator, the second insulator, and the third insulator are formed by a sputtering method.

10. The method for manufacturing a semiconductor device, according to claim 7, wherein the sixth insulator and the insulating film are formed by a sputtering method.

11. The method for manufacturing a semiconductor device, according to claim 7, wherein the second oxide film is formed using an In-M-Zn oxide target, where Mis gallium, aluminum, yttrium, or tin.

12. The method for manufacturing a semiconductor device, according to claim 7, wherein the first multi-chamber apparatus, the third multi-chamber apparatus, and the fourth multi-chamber apparatus are the same apparatus.

* * * * *